(12) United States Patent
Karino et al.

(10) Patent No.: US 9,411,346 B2
(45) Date of Patent: Aug. 9, 2016

(54) INTEGRATED CIRCUIT AND SEMICONDUCTOR DEVICE

(71) Applicant: FUJI ELECTRIC CO., LTD., Kawasaki-shi (JP)

(72) Inventors: Taichi Karino, Matsumoto (JP); Akio Kitamura, Matsumoto (JP); Takato Sugawara, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/964,348

(22) Filed: Aug. 12, 2013

(65) Prior Publication Data

US 2013/0328619 A1 Dec. 12, 2013

Related U.S. Application Data

(62) Division of application No. 12/746,712, filed as application No. PCT/JP2008/071893 on Dec. 2, 2008, now Pat. No. 8,638,160.

(30) Foreign Application Priority Data

Dec. 14, 2007 (JP) ................................. 2007-323949

(51) Int. Cl.
*G05F 1/10* (2006.01)
*G05F 1/46* (2006.01)
(Continued)

(52) U.S. Cl.
CPC ............ *G05F 1/462* (2013.01); *H01L 27/0629* (2013.01); *H01L 27/0802* (2013.01); *H01L 28/20* (2013.01); *H01L 29/0692* (2013.01); *H01L 29/7835* (2013.01)

(58) Field of Classification Search
CPC ............................................... H02M 3/07–3/08
See application file for complete search history.

(56) References Cited

U.S. PATENT DOCUMENTS

| 5,329,168 A | 7/1994 | Sugibayashi et al. |
| 5,386,136 A | 1/1995 | Williams et al. |
(Continued)

FOREIGN PATENT DOCUMENTS

| JP | 62-133747 A | 6/1987 |
| JP | 06-120510 A | 4/1994 |
(Continued)

OTHER PUBLICATIONS

International Search Report issued in related PCT/JP2008/071893 mailed Mar. 17, 2009.
(Continued)

*Primary Examiner* — Sibin Chen
(74) *Attorney, Agent, or Firm* — Rossi, Kimms & McDowell LLP

(57) ABSTRACT

An integrated circuit in which a voltage divider circuit is integrated comprises a first resistor, second resistor, control portion, switch, and switching portion. The first resistor and second resistor form a resistive voltage divider element for dividing a voltage obtained by rectifying an alternating-current voltage, or a direct-current voltage, supplied to a control portion. The switch is provided in series with the resistive voltage divider element, and passes or cuts off current passing through the resistive voltage divider element. The switching portion switches the switch so as to pass current during driving of the control portion, and cut off current during standby of the control portion.

19 Claims, 37 Drawing Sheets

(51) Int. Cl.
  *H01L 27/06* (2006.01)
  *H01L 27/08* (2006.01)
  *H01L 49/02* (2006.01)
  *H01L 29/06* (2006.01)
  *H01L 29/78* (2006.01)

(56) References Cited

U.S. PATENT DOCUMENTS

| | | |
|---|---|---|
| 5,432,370 A | 7/1995 | Kitamura et al. |
| 6,023,178 A | 2/2000 | Shioya et al. |
| 6,259,612 B1 * | 7/2001 | Itoh .................. 363/60 |
| 6,621,254 B1 | 9/2003 | Williams |
| 7,049,881 B2 * | 5/2006 | Moon et al. .................. 327/541 |
| 7,876,225 B2 * | 1/2011 | Mickle et al. .............. 340/572.4 |
| 2001/0035554 A1 | 11/2001 | Yamauchi et al. |
| 2006/0049856 A1 | 3/2006 | Nakai et al. |
| 2007/0041261 A1 | 2/2007 | Oku |
| 2007/0221963 A1 | 9/2007 | Saito et al. |
| 2009/0323376 A1 | 12/2009 | Saito |

FOREIGN PATENT DOCUMENTS

| | | |
|---|---|---|
| JP | 6-151716 A | 5/1994 |
| JP | 08-250663 A | 9/1996 |
| JP | 10-321806 A | 12/1998 |
| JP | 11-018425 A | 1/1999 |
| JP | 11-150234 A | 6/1999 |
| JP | 2001-007327 A | 1/2001 |
| JP | 2001-313367 A | 11/2001 |
| JP | 2002-261297 A | 9/2002 |
| JP | 2003-008009 A | 1/2003 |
| JP | 2004-014640 A | 1/2004 |
| JP | 2004-146548 A | 5/2004 |
| JP | 2005-094835 A | 4/2005 |
| JP | 2006-210953 A | 8/2006 |
| JP | 2007-042838 A | 2/2007 |
| JP | 2007-123926 A | 5/2007 |
| JP | 2007-258554 A | 10/2007 |
| JP | 2008-153636 A | 7/2008 |

OTHER PUBLICATIONS

Written Opinion issued in related PCT/JP2008/071893 mailed Nov. 17, 2009. Brief English translation provided.
Written Opinion issued in related PCT/JP2008/071893 mailed Mar. 17, 2009. Brief English translation provided.
International Search Report issued in related PCT/JP2008/071893.

* cited by examiner

INTEGRATED CIRCUIT AND SEMICONDUCTOR DEVICE

This application is a divisional of Ser. No. 12/746,712, filed Mar. 9, 2012, for which benefit is claimed, and status is pending, which in turn claims priority from PCT International Application PCT/JP2008/071893, filed Dec. 2, 2008 which is based on and claims priority from JP2007-323949, filed Dec. 14, 2007, the contents of which are incorporated herein by reference in their entirety.

TECHNICAL FIELD

This invention relates to an integrated circuit with an integrated resistance and to a semiconductor device.

BACKGROUND ART

In the prior art, in order to supply to an IC (Integrated Circuit) a voltage obtained by rectifying an alternating-current voltage or a direct-current voltage, a resistive voltage divider element has been used to voltage-divide the voltage obtained by rectifying the alternating-current voltage supplied from a high-voltage line or the direct-current voltage (see for example Patent References 1 to 3 below). Here, a high-voltage line is a line which supplies high voltages of 100 V or higher.

FIG. 34 is a circuit diagram showing principal portions of a voltage divider circuit of the prior art. The voltage divider circuit 2200 of the prior art comprises a resistor 2221 and resistor 2222. The output of the voltage divider circuit 2200 is input to the IC 2230. The resistor 2221 is connected between a high-voltage line 2210 and an input terminal of the IC 2230. One end of the resistor 2222 is connected to the resistor 2221, and the other end of the resistor 2222 is grounded.

The resistor 2221 and resistor 2222 form a resistive voltage divider element which performs resistive dividing of a voltage obtained by rectifying an alternating-current voltage or of a direct-current voltage. The resistor 2221 and resistor 2222 lower the voltage obtained by rectifying an alternating-current voltage or direct-current voltage to a low voltage which can be input to the IC 2230, and input the voltage to the IC 2230. The input terminal of the IC 2230 is connected to the intermediate node between the resistor 2221 and the resistor 2222.

FIG. 35 is a circuit diagram showing a switching power supply of the prior art. The switching power supply of the prior art shown in FIG. 35 is a power factor improvement circuit 1800. The power factor improvement circuit 1800 performs full-wave rectification of the AC input of a commercial power supply at, for example, 100 to 240 V using a first rectifier 1801 comprising a diode bridge, and uses this voltage to charge a power supply capacitor 1802. Then, a switching transistor 1804 is controlled by a power factor improvement control IC 1803, a step-up inductor 1805 passes current intermittently, and the intermittent current is converted into a sine wave by a second rectifier 1806 and a first capacitor 1807 and is output.

An IN terminal 1816 is provided in the power factor improvement control IC 1803. The IN terminal 1816 is connected to the intermediate node of a first resistive voltage divider circuit 1809, comprising two resistors 1809a and 1809b and connected in parallel with the power supply capacitor 1802. This is in order to use the first resistive voltage divider circuit 1809 to resistively voltage-divide the voltage obtained by using the first rectifier 1801 and power supply capacitor 1802 to rectify the alternating-current voltage, and to input the result to the IN terminal 1816.

And, based on the signal input from the IN terminal 1816, the power factor improvement control IC 1803 outputs a pulse width control signal to the gate terminal of the switching transistor 1804.

A resistor 1810 is connected between the power factor improvement control IC 1803 and the switching transistor 1804; by means of this resistor 1810, the gate voltage of the switching transistor 1804 is adjusted. Further, a resistor 1811 lowers the voltage output from the first rectifier 1801 to a desired power supply voltage, and supplies the result to the power factor improvement control IC 1803. In this way, the resistors 1809a, 1809b, 1810, 1811 are mounted externally to the power factor improvement control IC 1803.

Here, specific operation of the control portion 130 is explained. When the voltage of a ZCD terminal 1813 falls, a set signals is input from COMP 1814 to RSFF 1815, and the switching transistor 1804 is turned on. The voltage-divided voltage of the IN terminal 1816 and VREF 1817 are compared by the AMP 1818, and this signal and the triangle wave signal generated by RAMP 1819 are compared by COMP 1820; if the output signal from AMP 1818 is lower than the RAMP 1819 signal, a reset signal is input to RSFF 1815 from COMP 1820, a low signal is output from OUT 1821, and the switching transistor 1804 is turned off. Further, if the voltage at the IS terminal 1822 exceeds VOCP 1823, a reset signal is input to RSFF 1815 from COMP 1824, a low signal is output from OUT 1821, and the switching transistor 1804 is turned off.

FIG. 36 is a circuit diagram showing a modified example of a switching power supply of the prior art. In the power factor improvement circuit 1800 shown in FIG. 36, the same symbols are assigned as in the similar configuration of the power factor improvement circuit 1800 shown in FIG. 35, and explanations are omitted. Here, in addition to the first resistive voltage divider circuit 1809, a second resistive voltage divider circuit 1808 is provided on the outside of the power factor improvement control IC 1803.

Specifically, a MUL terminal 1827 of the power factor improvement control IC 1803 is connected to the intermediate node of the second resistive voltage divider circuit 1808, comprising a resistor 1808a and a resistor 1808b. This is in order that the voltage resulting from rectification of an alternating-current voltage by the first rectifier 1801 and power supply capacitor 1802 can be resistively voltage-divided by the second resistive voltage divider circuit 1808, the high voltage lowered to a low voltage that can be input to the power factor improvement control IC 1803, and this voltage input to the MUL terminal 1827.

FIG. 37 is a circuit diagram showing a modified example of principle portions of the voltage divider circuit of the prior art shown in FIG. 34. In the voltage divider circuit 2200 shown in FIG. 34, a startup element 2240 is comprised. The startup element 2240 is connected between the high-voltage line 2210 and the input terminal of the startup circuit 2250 (see for example Patent Reference 4 below).

Patent Reference 1: Japanese Patent Application Laid-open No. H11-150234
Patent Reference 2: Japanese Patent Application Laid-open No. 2005-94835
Patent Reference 3: Japanese Patent Application Laid-open No. 2007-123926
Patent Reference 4: Japanese Patent Application Laid-open No. 2008-153636

However, in the technology of the prior art of FIG. 34, the resistor 2221 and resistor 2222 are connected in series between the high-voltage line 2210 and ground, so that even during standby of the IC 2230, direct current continues to flow from the high-voltage input portion of the high-voltage line 2210 to ground via the resistor 2221 and the resistor 2222. Hence power is consumed by the voltage divider circuit 2200.

Similarly, in the technology of the prior art of FIG. 35, the resistor 1809a and the resistor 1809b are connected in series, so that even during standby of the power factor improvement control IC 1803, direct current continues to flow via the resistor 1809a and the resistor 1809b. Hence power is consumed by the first resistive voltage divider circuit 1809. Further, because the first resistive voltage divider circuit 1809 is mounted externally to the power factor improvement control IC 1803, the number of externally mounted components increases, and the cost of the semiconductor device rises.

DISCLOSURE OF THE INVENTION

This invention resolves the above-described problems, and has as an object the reduction of power consumption in a voltage divider circuit connected to a high-voltage line which supplies a voltage obtained by rectifying an alternating-current voltage with a diode bridge and capacitor or a direct-current voltage. A further object is to provide an integrated circuit in which a voltage divider circuit is integrated into a semiconductor device into which the output of a voltage divider circuit is input.

In order to resolve the above problems and attain the above objects, in the integrated circuit of the invention of Claim 1, a resistive voltage divider element divides a voltage between ground and a high-voltage line which supplies a voltage obtained by rectifying an alternating-current voltage with a diode bridge and capacitor, a direct-current voltage, or similar. Here, a line voltage is a voltage of 100 V or higher. Further, a switch cuts off a current path formed between a power supply and ground via a resistive voltage divider element. Switching means opens and closes a switch according to the state of the integrated circuit which is a supply destination of the voltage obtained by division by the resistive voltage divider element. Further, a voltage divider circuit comprising a resistive voltage divider element, switch, and switching means is characterized in being formed on the same semiconductor substrate as the integrated circuit which is the voltage supply destination.

Further, the integrated circuit of the invention of Claim 2 is the integrated circuit according to Claim 1, characterized in that the resistive voltage divider element has a resistance adjustment portion which adjusts a voltage division ratio of the resistive voltage divider element, and the switch is a MOSFET.

Further, the integrated circuit of the invention of Claim 3 is the integrated circuit according to Claim 1, characterized in that the switch is a MOSFET.

Further, the integrated circuit of the invention of Claim 4 is the integrated circuit according to Claim 3, characterized in that at least one resistor constituting the resistive voltage divider element is formed so as to be surrounded by the MOSFET, and one end of the resistor is connected to a drain terminal of the MOSFET.

Further, the integrated circuit of the invention of Claim 5 is the integrated circuit according to Claim 3, characterized in that the resistive voltage divider element of the portion in which the resistance adjustment portion is formed is connected to a source terminal of the MOSFET.

Further, the integrated circuit of the invention of Claim 6 is the integrated circuit according to Claim 3, characterized in that a portion or the entirety of the resistive voltage divider element, the MOSFET, and a JFET are integrated on the same semiconductor substrate.

Further, the integrated circuit of the invention of Claim 7 is the integrated circuit according to Claim 6, characterized in that a drain terminal of the JFET and a high-potential side of the resistive voltage divider element connected to a drain terminal of the MOSFET are connected to an external connection terminal connected to the high-voltage line.

Further, the integrated circuit of the invention of Claim 8 is the integrated circuit according to Claim 7, characterized in that the drain terminal of the JFET and the high-potential side of the resistive voltage divider element connected to the drain terminal of the MOSFET are connected to the same external connection terminal.

Further, the integrated circuit of the invention of Claim 9 is the integrated circuit according to Claim 6, characterized in that a high-potential side of the resistive voltage divider element connected to a drain terminal of the JFET and a drain terminal of the MOSFET is connected to an external connection terminal connected to the high-voltage line.

Further, the integrated circuit of the invention of Claim 10 is the integrated circuit according to any one of Claims 1 to 9, characterized in that it is a control IC of a switching power supply.

Further, in the semiconductor device of the invention of Claim 11, a first semiconductor layer of a second conduction type is formed on a surface layer of a semiconductor substrate of a first conduction type. A first insulating film covers the first semiconductor layer. Further, a high-voltage high-resistance element is buried in the first insulating film. Further, a first electrode is electrically connected to the first semiconductor layer and one end of the high-voltage high-resistance element. Further, a second semiconductor layer is formed on the surface layer of the semiconductor substrate, removed from the first semiconductor layer. Further, a second electrode is electrically connected to the second semiconductor layer and the other end of the high-voltage high-resistance element. Further, a third diffusion layer is formed on the surface layer of the semiconductor substrate in contact with the second semiconductor layer. Further, a fourth diffusion layer is formed on the surface layer of the third diffusion layer, removed from the second semiconductor layer. Further, an oxide film is formed on a region of the third diffusion layer between the second semiconductor layer and the fourth diffusion layer. Further, a third electrode is formed on the oxide film. Further, a fourth electrode is electrically connected to the fourth diffusion layer.

Further, the semiconductor device of the invention of Claim 12 is the semiconductor device according to Claim 11, in which a first oxide film is formed on the first semiconductor layer. Further, a first insulating film covers the first semiconductor layer and the first oxide film. Further, the high-voltage high-resistance element is characterized in being buried in the first insulating film in the region of the first oxide film of the first insulating film.

Further, the semiconductor device of the invention of Claim 13 is the semiconductor device according to Claim 11, in which a second oxide film is formed on the second semiconductor layer. Further, a second insulating film covers the second semiconductor layer and the second oxide film. Further, the third electrode is characterized in being formed from above the oxide film to above the second oxide film.

Further, the semiconductor device of the invention of Claim 14 is the semiconductor device according to Claim 11, in which a first high-voltage application layer is formed on the surface layer of the semiconductor substrate in contact with the first semiconductor layer. Further, a fifth diffusion layer is formed on a surface layer of the first high-voltage application layer, removed from the first semiconductor layer, and is characterized in being connected to the first electrode.

Further, the semiconductor device of the invention of Claim 15 is the semiconductor device according to Claim 11, in which a second high-voltage application layer is formed on the surface layer of the semiconductor substrate in contact with the second semiconductor layer. Further, a sixth diffusion layer is formed on the surface layer of the second high-voltage application layer, removed from the second semiconductor layer, and is characterized in being connected to the second electrode.

Further, the semiconductor device of the invention of Claim 16 is the semiconductor device according to Claim 11, further comprising a JFET, having a portion of the second semiconductor layer, a portion of the oxide film, a portion of the second high-voltage application layer, a fifth electrode electrically connected to the second semiconductor layer, and the second electrode electrically connected to the second high-voltage application layer.

Further, the semiconductor device of the invention of Claim 17 is the semiconductor device according to Claim 11, in which a third high-voltage application layer is formed on a surface layer of the third diffusion layer, removed from the second semiconductor layer. Further, the fourth diffusion layer is characterized in being formed on a surface layer of the third high-voltage application layer, removed from the second semiconductor layer.

Further, the semiconductor device of the invention of Claim 18 is the semiconductor device according to Claim 11, characterized in that the high-voltage high-resistance element is formed such that the planar shape thereof is a spiral shape.

Further, the semiconductor device of the invention of Claim 19 is the semiconductor device according to Claim 11, characterized in that the high-voltage high-resistance element is provided in plurality and in parallel.

Further, the semiconductor device of the invention of Claim 20 is the semiconductor device according to Claim 11, characterized in that the first semiconductor layer is a first diffusion layer formed with impurities added, and the second semiconductor layer is a second diffusion layer formed with impurities added.

Further, the semiconductor device of the invention of Claim 21 is the semiconductor device according to Claim 11, characterized in that the first semiconductor layer is a first epitaxial layer formed by epitaxial growth, and that the second semiconductor layer is a second epitaxial layer formed by epitaxial growth.

Further, the semiconductor device of the invention of Claim 22 is the semiconductor device according to Claim 21, characterized in that the first epitaxial layer and the second epitaxial layer are separated by a seventh diffusion layer of the first conduction type, formed on the surface layer of the semiconductor substrate.

Further, the semiconductor device of the invention of Claim 23 is the semiconductor device according to any one of Claims 16 to 22, characterized in that the second electrode forming the portion of the JFET and the first electrode are connected to the same terminal by a wire.

According to this invention, by providing a switch in series with a resistive voltage divider element, the current passing through the resistive voltage divider element can be cut off during standby of the integrated circuit. Hence the continuing flow of current through the resistive voltage divider element during standby of the integrated circuit can be prevented, and power consumption of the current can be reduced. Further, a voltage divider circuit can be integrated into a semiconductor device into which the output of the voltage divider circuit is input. By this means, the number of components mounted externally to a semiconductor device can be reduced, so that the costs of the semiconductor device and of a power supply system using the semiconductor device can be reduced. Further, by providing a resistance adjustment portion in the resistive voltage divider element, the overall resistance value of the resistive voltage divider element can be adjusted. By this means, the divided voltage of a voltage obtained by rectifying an alternating-current voltage, or of a direct-current voltage, can be detected with good precision. Further, by providing a startup element which supplies current to the resistive voltage divider element, power consumption of the circuit can be further reduced.

As explained above, by means of a semiconductor device of this invention, there is the advantageous result that a voltage divider circuit is connected to a voltage obtained by rectifying an alternating-current voltage or to a direct-current voltage, and that the power consumption of this voltage divider circuit can be reduced. Further, there is the advantageous result that a semiconductor device in which a voltage divider circuit is integrated with the semiconductor device to which the output of the voltage divider circuit is input can be provided. Further, there is the advantageous result that the costs such a semiconductor device and of a system using such a device can be reduced.

EXPLANATION OF REFERENCE NUMERALS

Figure 1:
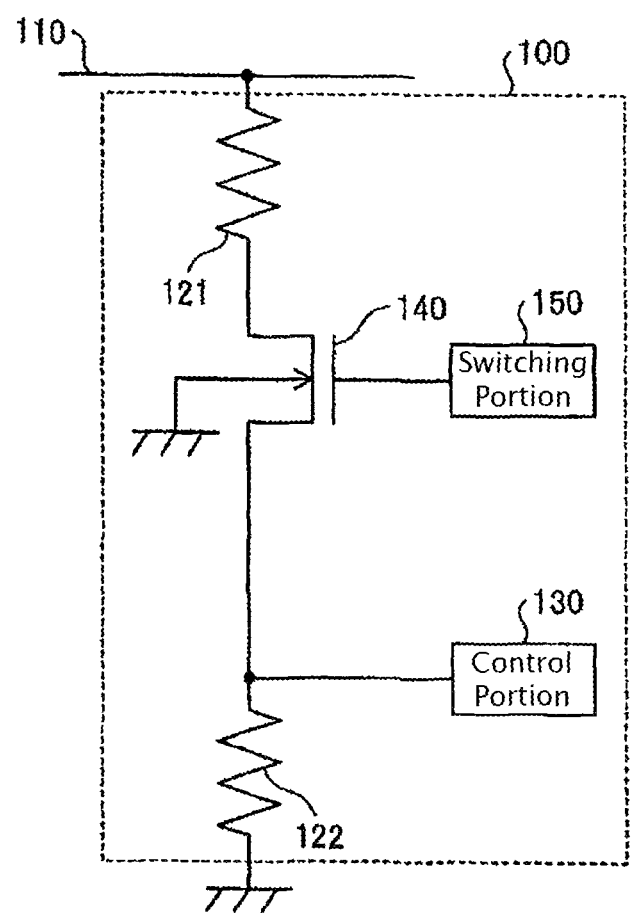
FIG. 1 is a circuit diagram showing principle portions of the integrated circuit of Embodiment 1 of the invention.

1 AC input terminal
3 Power supply capacitor
9 Rectifying diode
10, 18 Smoothing capacitor
12 DC output terminal
13 Photodiode
14 Shunt regulator
17 Rectifying diode
19, 220 MOSFET
22 Phototransistor
31 Control IC
100 Integrated circuit
110 High-voltage line
130 Control portion
140, 1809c Switch
150 Switching portion
200 Semiconductor device
210 Resistance portion
211 P-type semiconductor substrate
212 N-type drift layer
214 First oxide film
215 First insulating film
216, 1501 High-voltage high-resistance element
217 First metal wiring line
217a First drain contact portion
217b, 218a High-voltage high-resistance contact portion
218, 218A, 218B Second metal wiring line
218b Second drain contact portion
221 N-type drain drift layer
223 P base layer
225 Second oxide film
226 Gate oxide film
227, 227A, 227B Gate electrode
227a, 229a Terminal
228 Second insulating film
229, 229A, 229B Third metal wiring line
229b Source contact portion
217b Contact portion
401 First high-voltage application layer
402 Second high-voltage application layer
501 Third high-voltage application layer
1421 Third resistor
1422 Fourth resistor
1430 Control portion
1440 Second switch
1450 Second switching portion
1601 Fourth metal wiring line
1601a Third drain contact portion
1602 First wire
1800 Power factor improvement circuit
1801 First rectifier
1802 Power supply capacitor
1803 Power factor improvement control IC
1804 Switching transistor
1806 Second rectifier
1808 Second resistive voltage divider circuit
1809 First resistive voltage divider circuit

BEST MODE FOR CARRYING OUT THE INVENTION

Below, preferred embodiments of integrated circuits and semiconductor devices of this invention are explained in detail, referring to the attached drawings.

Embodiment 1

FIG. 1 is a circuit diagram showing principle portions of the integrated circuit of Embodiment 1 of the invention. As shown in FIG. 1, the integrated circuit 100 of Embodiment 1 comprises a first resistor 121, second resistor 122, control portion 130, switch 140, and switching portion 150. All of these elements are formed on the same semiconductor substrate. A voltage obtained by rectifying an alternating-current voltage, or a direct-current voltage, is input to the integrated circuit 100 from a high-voltage line 110.

One end of the first resistor 121 is connected to the high-voltage line 110, and the other end of the first resistor 121 is connected to one end of the switch 140. One end of the second resistor 122 is connected to the other end of the switch 140, and the other end of the second resistor 122 is grounded. The first resistor 121 and second resistor 122 form a resistive voltage divider element, which resistively divides a voltage obtained by rectifying an alternating-current voltage, or a direct-current voltage, input from the high-voltage line 110.

The first resistor 121 and second resistor 122 lower the voltage obtained by rectifying an alternating-current voltage, or the direct-current voltage, to a low voltage which can be input to the control portion 130, and input the voltage to the control portion 130. The control portion 130 outputs a control signal based on the input voltage. The input terminal of the control portion 130 is connected to the intermediate node of the switch 140 and second resistor 122.

The switch 140 is connected in series between the first resistor 121 and the second resistor 122. The voltage obtained by rectifying an alternating-current voltage or the direct-current voltage is supplied to the control portion 130 when the switch 140 is in the closed state, and supply of the voltage obtained by rectifying an alternating-current voltage or the direct-current voltage to the control portion 130 is cut off when the switch 140 is in the open state. The switch 140 comprises for example a MOSFET (Metal Oxide Semiconductor Field Effect Transistor).

The drain terminal of the MOSFET forming the switch 140 is connected to the first resistor 121, and the source terminal is connected to the second resistor 122. This MOSFET is configured as a semiconductor device 200 configured integrally with the first resistor 121 (see FIG. 2 and FIG. 3).

The switching portion 150 opens and closes the switch 140 according to the state of the current (control portion 130) which is the supply destination for the voltage obtained by rectifying an alternating-current voltage or the direct-current voltage. The switching portion 150 performs switching such that the switch 140 is in the closed state, that is, the MOSFET is in the on state, during driving of the control portion 130, and such that the switch 140 is in the open state, that is, the MOSFET is in the off state, during standby of the control portion 130. For example, the switching portion 150 acquires driving signals and standby signals output to the control portion 130.

A driving signal is a signal to drive the control portion 130 during standby. A standby signal is a signal to cause standby of the control portion 130 during driving. Hence when the switching portion 150 acquires a driving signal, the switch 140 switches to the closed state, and the voltage obtained by rectifying an alternating-current voltage or the direct-current voltage, which is voltage-divided by the first resistor 121 and the second resistor 122, is applied to the control portion 130. On the other hand, when the switching portion 150 acquires a standby signal, the switch 140 switches to the open state, and the supply of the voltage obtained by rectifying an alternating-current voltage or the direct-current voltage to the control portion 130 is cut off.

When the switch 140 is in the open state, the current path between the high-voltage line 110 and ground, comprising the first resistor 121, switch 140, and second resistor 122, is cut off, so that the flow of current from the high-voltage line 110 to ground can be prevented. Driving signals and standby signals are for example output from a circuit in a stage after the control portion 130.

In such an integrated circuit 100, the first resister 121 on the high-potential side of the resistive voltage divider element is provided on the drain side of the MOSFET configuring the switch 140, and moreover the resistance value of the first resistor 121 is made somewhat lower than the combined resistance value of the first resistor 121 and the second resistor 122, so that the resistance value of the source side of the MOSFET can be made small. By this means, when the MOSFET enters the on state, a high potential on the source side of the MOSFET is prevented. Further, by for example making the second resistor 122 connected to the source side of the MOSFET a resistor formed so that the resistance value can be adjusted (hereafter called a "trimming resistor") by for example cutting and separating a portion of the second resistor 122, the resistance value of the second resistor 122 can be adjusted. By this means, the overall resistance value and the voltage division ratio of the resistive voltage divider element can be adjusted, so that the output voltage of the resistive voltage divider element (voltage-divided voltage) can be adjusted with good precision.

Figure 2:
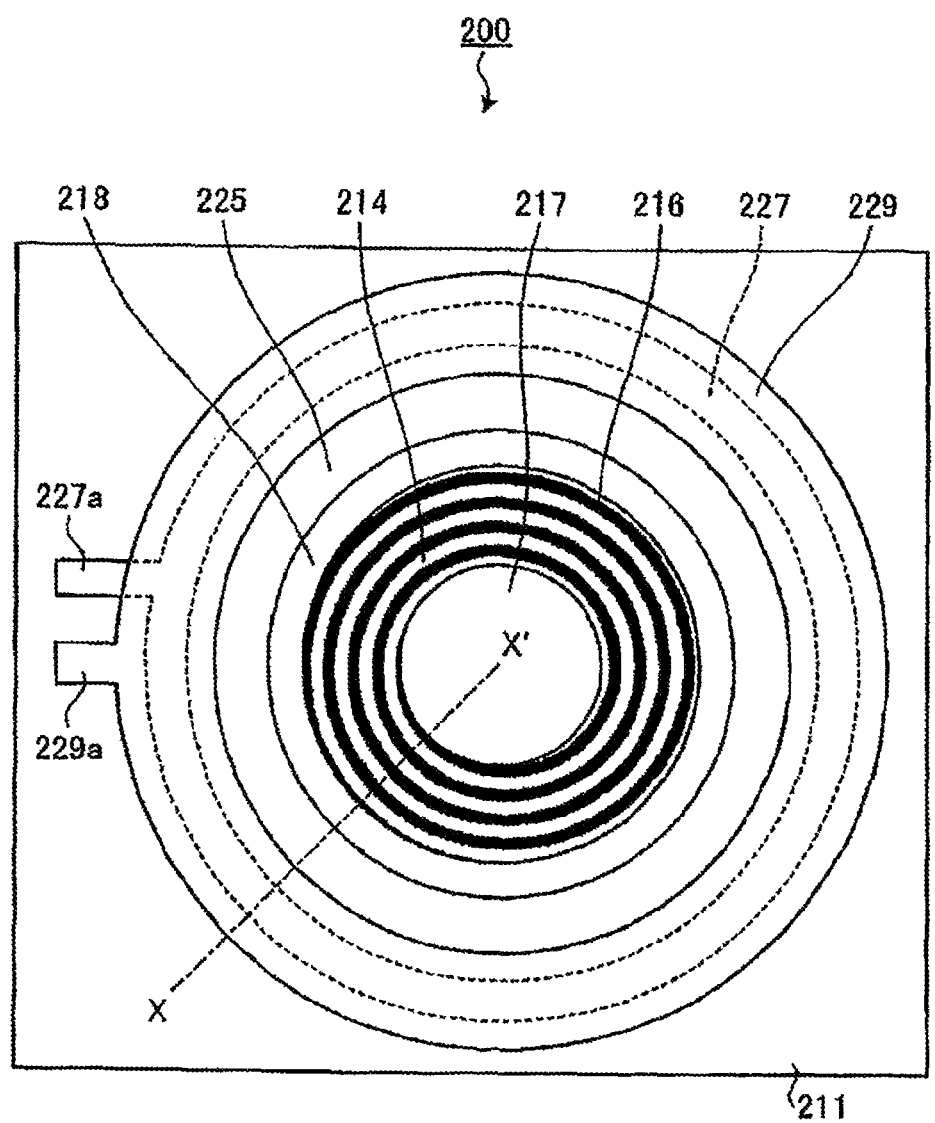
FIG. 2 is a plane view showing principle portions of the semiconductor device of Embodiment 1 of the invention.
Figure 3:
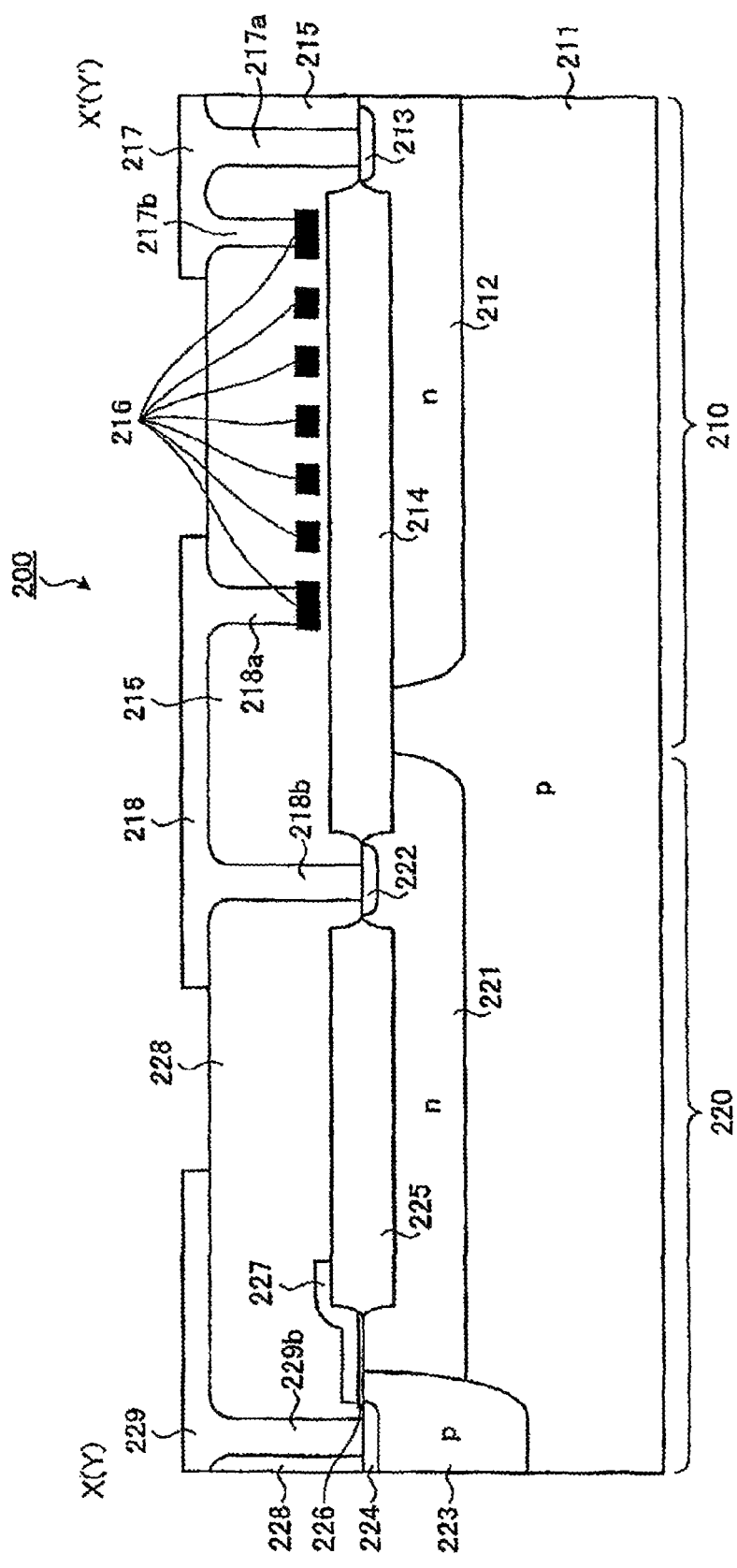
FIG. 3 is a cross-sectional view sectioning the semiconductor device shown in FIG. 2 along the section line X-X'.

FIG. 2 is a plane view showing principle portions of the semiconductor device of Embodiment 1 of the invention. FIG. 3 is a cross-sectional view sectioning the semiconductor device shown in FIG. 2 along the section line X-X'. In the plane views of FIG. 2 and subsequent drawings, in order to clearly display characteristics of the semiconductor device 200, interlayer insulating films (a first insulating film 215 and a second insulating film 228) are omitted. The semiconductor device 200 is a high-voltage, high-resistance integral-type MOSFET made an integral type with the first resistor 121 and the switch 140 (see FIG. 1). Although not shown, the switching portion 150, control portion 130, and second resistor 122 are also formed on the same semiconductor substrate.

The semiconductor device 200 comprises an integrally configured resistance portion 210 and a MOSFET 220. The resistance portion 210 is equivalent to the first resistor 121. The MOSFET 220 is equivalent to the switch 140. The resistance portion 210 comprises a P-type semiconductor substrate 211, N-type drift layer 212, first drain N$^+$ layer 213, first oxide film 214, first insulating film 215, high-voltage high-resistance element 216, first metal wiring line 217, and second metal wiring line 218.

The P-type semiconductor substrate 211 is a substrate formed by adding P-type (first conduction type) impurities into a semiconductor. The N-type drift layer 212 (first diffusion layer) is a diffusion layer formed by adding N-type (second conduction type) impurities into a semiconductor. The N-type drift layer 212 forms a portion of the surface layer of the P-type semiconductor substrate 211.

The N-type drift layer 212 is formed such that the planar shape thereof on the P-type semiconductor substrate 211 is for example a circular shape. The ion injection concentration in the N-type drift layer 212 is for example approximately $1.0 \times 10^{12}$ to $1.5 \times 10^{12}/cm^2$. The first drain N$^+$ layer 213 (fifth diffusion layer) forms a portion of the surface layer of the N-type drift layer 212.

The first oxide film 214 is formed on a region of the N-type drift layer 212 in which the first drain N$^+$ layer 213 is not formed. The first oxide film 214 is formed such that the planar shape thereof is for example a circular ring shape surrounding the first drain N$^+$ layer 213. The thickness of the first oxide film 214 is for example approximately 4000 to 8000 Å. The first insulating film 215 is formed so as to cover the N-type drift layer 212 and the first oxide film 214.

The high-voltage high-resistance element 216 is buried in a region of the first insulating film 215 on the first oxide film 214. The high-voltage high-resistance element 216 is formed such that the planar shape thereof is for example a spiral shape. Or, the high-voltage high-resistance element 216 is formed by means of two end portions forming ring shapes on the inside and on the outside, and a spiral portion forming a spiral shape and connected to the two end portions.

At the inside ring-shape end portion, a plurality of contact portions 217b with the first metal wiring line 217 are formed. The high-voltage high-resistance element 216 is formed by means of polysilicon or another thin film resistor. As the ion injection concentration of the high-voltage high-resistance element 216, for example approximately $1.0 \times 10^{14}$ to $1.0 \times 10^{16}/cm^2$ is appropriate. By using an ion injection concentration on the order of $10^{15}/cm^2$, a high-voltage high-resistance element 216 with almost no temperature dependence and with excellent temperature characteristics can be formed. The ion injection concentration of the high-voltage high-resistance element 216 may for example be approximately from $2.5\times10^{15}$ to $3.5\times10^{15}/cm^2$.

The first metal wiring line 217 (first electrode) is formed on the first insulating film 215. The first metal wiring line 217 is connected to the high-voltage line 110 (see FIG. 1). Further, the first metal wiring line 217 has a first drain contact portion 217a which penetrates the first insulating film 215, and a high-voltage high-resistance contact portion 217b.

The first drain contact portion 217a is connected to the first drain N⁺ layer 213. The voltage obtained by rectifying an alternating-current voltage or the direct-current voltage is applied to the first drain N⁺ layer 213 via the first metal wiring line 217. The high-voltage high-resistance contact portion 217b is connected to an end portion (one end) on the inside of the high-voltage high-resistance element 216.

The first metal wiring line 217 has a planar shape formed in for example a circular shape. When the inside end portion of the high-voltage high-resistance element 216 is formed in a circular ring shape, the planar shape of the high-voltage high-resistance contact portion 217b may be formed into a circular ring shape, or may be formed into a plurality of separated ring shapes.

The second metal wiring line 218 (second electrode) is formed on the first insulating film 215. Further, the second metal wiring line 218 has a high-voltage high-resistance contact portion 218a penetrating the first insulating film 215 and a second drain contact portion 218b. The high-voltage high-resistance contact portion 218a is connected to the outside end portion (other end) of the high-voltage high-resistance element 216.

The second metal wiring line 218 is formed such that the planar shape thereof is for example a circular ring shape surrounding the first metal wiring line 217. When the inside end portion of the high-voltage high-resistance element 216 is formed in a ring shape, the planar shape of the high-voltage high-resistance contact portion 217b may be formed in a ring shape, or may be formed into a plurality of separated ring shapes.

The MOSFET 220 comprises a P-type semiconductor substrate 211 which is common with the resistance portion 210, an N-type drain drift layer 221, second drain N⁺ layer 222, second metal wiring line 218 common with the resistance portion 210, P base layer 223, source N⁺ layer 224, second oxide film 225, gate oxide film 226, gate electrode 227, second insulating film 228, and third metal wiring line 229.

The N-type drain drift layer 221 (second diffusion layer) is formed on a portion of the surface layer of the P-type semiconductor substrate 211. The N-type drain drift layer 221 is formed removed from the N-type drift layer 212. The N-type drain drift layer 221 is formed such that the planar shape thereof is for example a circular ring shape surrounding the N-type drift layer 212. The ion injection concentration of the N-type drain drift layer 221 is for example approximately $1.0\times10^{12}$ to $1.5\times10^{12}/cm^2$. This ion injection can also be utilized as ion injection when forming the N-type drift layer 212, and so the N-type drain drift layer 221 and the N-type drift layer 212 can be formed simultaneously, and through simultaneous formation, the number of manufacturing processes can be reduced.

The second drain N⁺ layer 222 (sixth diffusion layer) is formed on a portion of the surface layer of the N-type drain drift layer 221. The second drain N⁺ layer 222 is formed such that the planar shape thereof is for example a circular ring shape surrounding the first oxide film 214. The second drain contact portion 218b of the second metal wiring line 218 is connected to the second drain N⁺ layer 222. The second drain contact portion 218b may be formed in a circular ring shape, or may be formed into a plurality of separated ring shapes.

The P base 223 (third diffusion layer) is formed on a portion of the surface layer of the P-type semiconductor substrate 211. The P base layer 223 is formed in contact with the N-type drain drift layer 221, and removed from the N-type drift layer 212. The P base layer 223 is formed such that the planar shape thereof is for example a circular ring shape surrounding the N-type drain drift layer 221. The P base layer 223 becomes a channel region in which a channel is formed. The ion injection concentration of the P base layer 223 is for example approximately $1.5\times10^{13}$ to $2.5\times10^{13}/cm^2$.

The source N⁺ layer 224 (fourth diffusion layer) is formed on a portion of the surface layer of the P base layer 223. The source N⁺ layer 224 is formed removed from the N-type drain drift layer 221. The source N⁺ layer 224 is formed such that the planar shape thereof is for example a circular ring shape surrounding the channel region of the P base layer 223.

The second oxide film 225 is formed on a region of the N-type drain drift layer 221 in which the second drain N⁺ layer 222 is not formed. The second oxide film 225 is formed such that the plane shape is for example a circular ring shape surrounding the second drain N⁺ layer 222. The thickness of the second oxide film 225 is for example approximately 4000 to 8000 Å. The gate oxide film 226 is formed spanning above a region in the P base layer 223 between the source N⁺ layer 224 and the N-type drain drift layer 221, and above a region in the N-type drain drift layer 221 where the second oxide film 225 is not formed.

The gate electrode 227 (third electrode) is formed on the gate oxide film 226. The gate electrode 227 has a terminal 227a connected to the switching portion 150 (see FIG. 1). Also, the gate electrode 227 is formed from the gate oxide film 226 to above a portion of the second oxide film 225. The second insulating film 228 is formed so as to cover the surfaces of the N-type drain drift layer 221, P base layer 223, second oxide film 225, and gate electrode 227.

The third metal wiring line 229 (fourth electrode) is formed on the second insulating film 228. The third metal wiring line 229 has a terminal 229a connected to the control portion 130 (see FIG. 1). Further, the third metal wiring line 229 has a source contact portion 229b penetrating the second insulating film 228. The source contact portion 229b is connected to the source N⁺ layer 224.

The third metal wiring line 229 is formed such that the planar shape thereof is for example a circular ring shape surrounding the second metal wiring line 218. The source contact portion 229b may be formed in a circular ring shape, or may be formed into a plurality of separated ring shapes.

Further, as stated above, the second resistor 122 is formed in a different place on the P-type semiconductor substrate 211 from the semiconductor device 200. Because a low voltage of approximately 5 V is applied, the second resistor 122 can be configured as a well-known polysilicon resistor formed with an oxide film intervening on a semiconductor substrate. Further, an insulating film such as the first insulating film 215 is filmed thereupon, and two holes are provided in the first insulating film 215 reaching the polysilicon resistor. Each of these holes is buried to form two wiring lines formed on the first insulating film 215.

Figure 4:
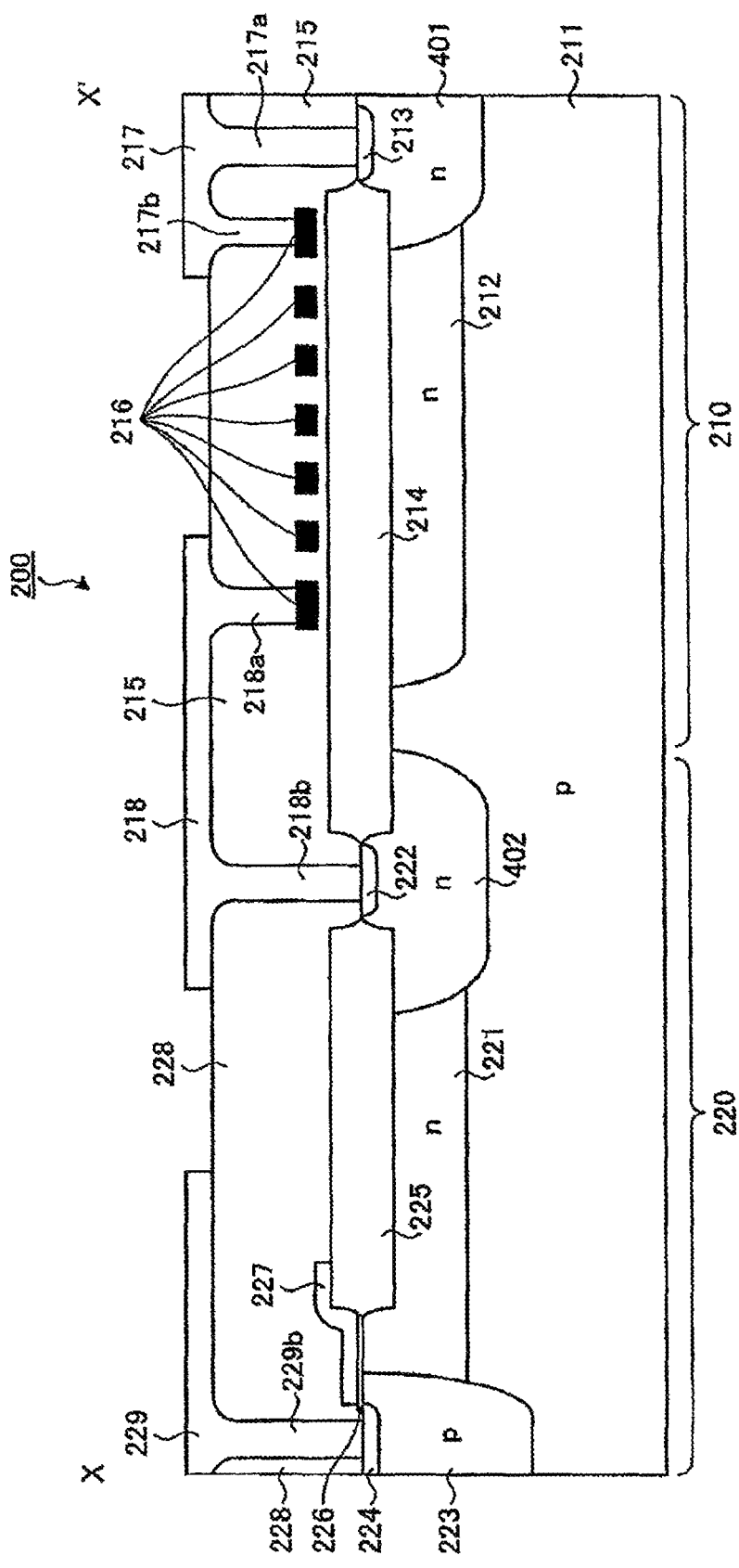
FIG. 4 is a cross-sectional view showing a modified example of the semiconductor device shown in FIG. 3.

FIG. 4 is a cross-sectional view showing a modified example of the semiconductor device shown in FIG. 3. In FIG. 4, the same symbols are assigned for the configuration similar to the configuration shown in FIG. 3, and explanations are omitted. In the semiconductor device 200 shown in FIG. 3, at least one among the first high-voltage application layer 401 and the second high-voltage application layer 402 may be provided.

The first high-voltage application layer 401 is an N-type diffusion layer formed on the surface layer of the P-type semiconductor substrate 211 in contact with the N-type drift layer 212. The first high-voltage application layer 401 is formed such that, on the surface layer of the P-type semiconductor substrate 211, the planar shape thereof is for example a circular shape. The first drain $N^+$ layer 213 is formed on the surface layer of the first high-voltage application layer 401, removed from the N-type drift layer 212. By means of the first high-voltage application layer 401, the first drain $N^+$ layer 213 is electrically connected to the N-type drift layer 212 while being separated from the N-type drift layer 212, and can enable withstanding of high voltages by the high-voltage high-resistance element 216.

The second high-voltage application layer 402 is an N-type diffusion layer formed on the surface layer of the P-type semiconductor substrate 211 in contact with the N-type drain drift layer 221. The second high-voltage application layer 402 is formed such that, on the surface layer of the P-type semiconductor substrate 211, the planar shape thereof is for example a circular ring shape surrounding the N-type drift layer 212. The second drain $N^+$ layer 222 is formed on the surface layer of the second high-voltage application layer 402, removed from the N-type drain drift layer 221.

By means of the second high-voltage application layer 402, the second drain $N^+$ layer 222 is electrically connected to the N-type drain drift layer 221 while being separated from the N-type drain drift layer 221. Further, the second high-voltage application layer 402 is formed removed from the N-type drift layer 212. By this means, the off withstand voltage of the MOSFET 220 can withstand high voltages. The ion injection concentrations of the first high-voltage application layer 401 and the second high-voltage application layer 402 are for example approximately $2.5 \times 10^{12}$ to $3.5 \times 10^{12}/cm^2$.

Figure 5:
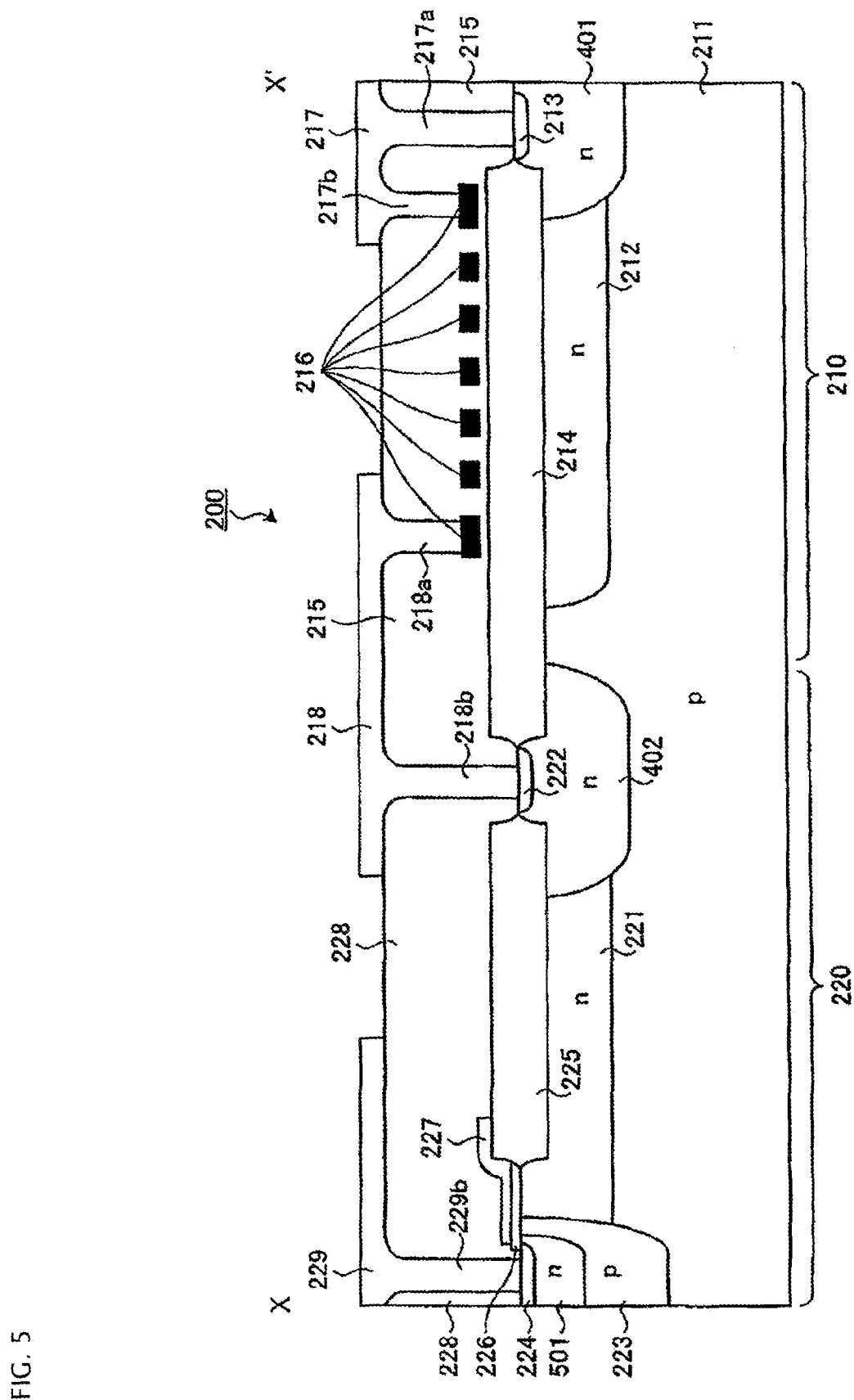
FIG. 5 is a cross-sectional view showing a modified example of the semiconductor device shown in FIG. 4.

FIG. 5 is a cross-sectional view showing a modified example of the semiconductor device shown in FIG. 4. In FIG. 5, the same symbols are assigned for the configuration similar to the configuration shown in FIG. 4, and explanations are omitted. In the semiconductor device 200 shown in FIG. 4, a third high-voltage application layer 501 may be further provided. Here, the thickness of the gate oxide film 226 is increased.

The third high-voltage application layer 501 is an N-type diffusion layer formed on the surface layer of the P base layer 223, removed from the N-type drain drift layer 221. The source $N^+$ layer 224 is formed on the surface layer of the third high-voltage application layer 501, removed from the P base layer 223. The third high-voltage application layer 501 is formed such that, on the surface layer of the P-type semiconductor substrate 211, the planar shape thereof is for example a circular ring shape surrounding the N-type drain drift layer 221.

The ion injection concentration of the third high-voltage application layer 501 is for example approximately $8.0 \times 10^{13}$ to $1.2 \times 10^{14}/cm^2$. By this means, the source $N^+$ layer 224 can be made to withstand high voltages. Further, while securing the formation of a channel in the P base layer 223, the thickness of the gate oxide film 226 can be increased. Hence the gate oxide film 226 can be made to withstand high voltages.

Figure 6:
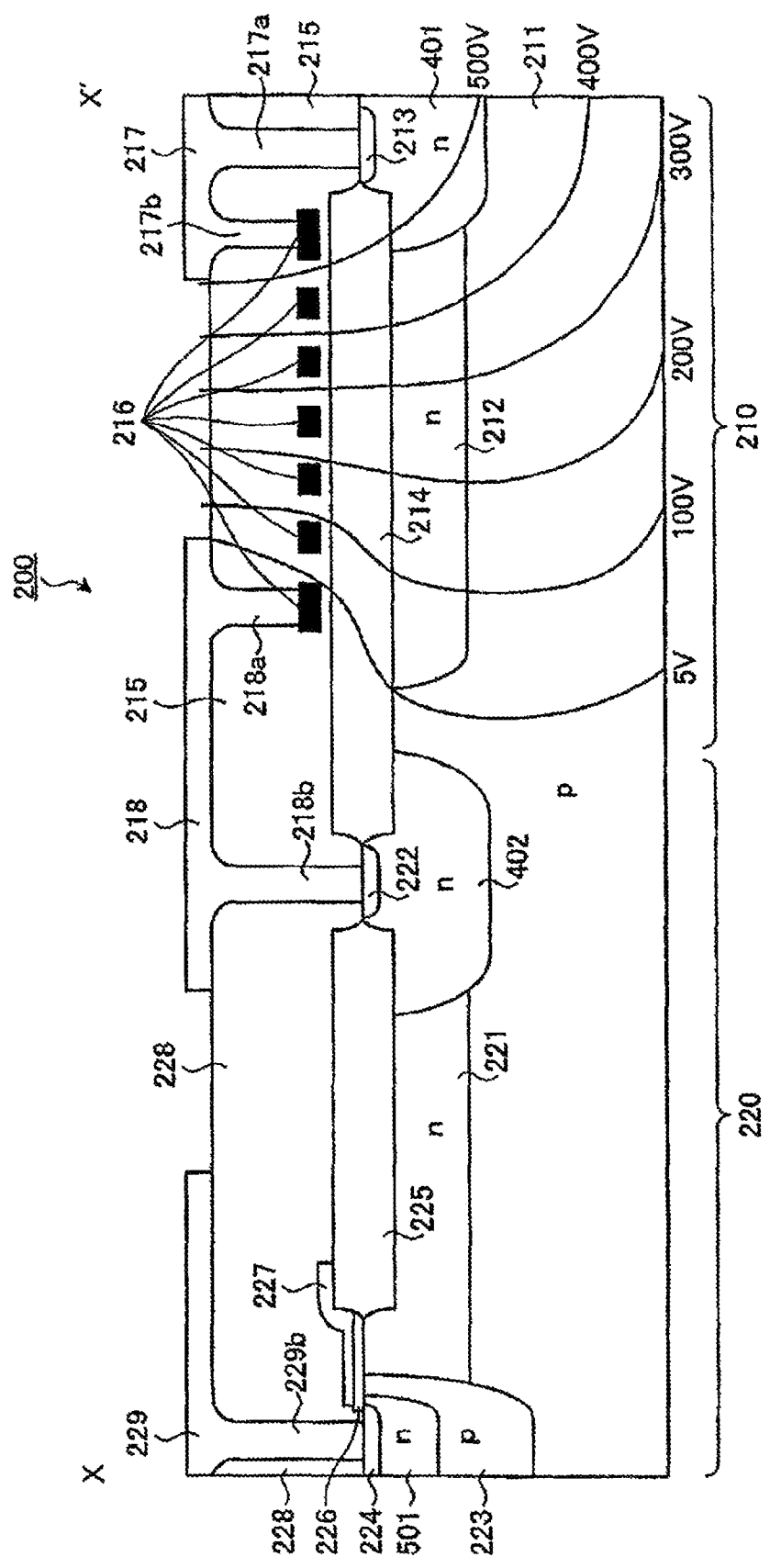
FIG. 6 is a cross-sectional view showing operation (when the MOSFET 220 is turned on) of the semiconductor device shown in FIG. 5.

FIG. 6 is a cross-sectional view showing operation (when the MOSFET 220 is turned on) of the semiconductor device shown in FIG. 5. When the switching portion 150 (see FIG. 1) applies a voltage equal to or above a threshold value voltage to the gate electrode 227 (when the MOSFET 220 is turned on), a channel is formed near the surface of the P base layer 223, and there is conduction between the N-type drain drift layer 221 and the source $N^+$ layer 224. In this case, the high-voltage high-resistance element 216, N-type drain drift layer 221, and channel of the P base layer 223 act as a resistance.

Because the resistance of the high-voltage high-resistance element 216 is higher than the resistance of the N-type drain drift layer 221, a potential distribution of for example 5 to 500 V is formed on the side of the high-voltage high-resistance element 216, as shown in FIG. 6. By this means, a high withstand voltage is realized in the side of the high-voltage high-resistance element 216.

A high voltage (500 V) is applied to the first drain $N^+$ layer 213, and a potential (approximately 5 V) lowered by the high-voltage high-resistance element 216 is applied to the second drain $N^+$ layer 222. Hence there is little widening of the depletion layer, which widens from the PN junction of the second high-voltage application layer 402 and the P-type semiconductor substrate toward the P-type semiconductor substrate.

Also, the widening of the depletion layer which widens from the PN junction of the second high-voltage application layer 402 and the P-type semiconductor substrate toward the P-type semiconductor substrate is small compared with that of the depletion layer which widens from the PN junction of the N-type drift layer 212 and the P-type semiconductor substrate toward the P-type semiconductor substrate. Hence these two depletion layers are not joined together. Consequently conduction of the N-type drift layer 212 and second high-voltage application layer 402, in parallel with the high-voltage high-resistance element 216 and second metal wiring line 218, is prevented, and a high withstand voltage can be realized.

Figure 7:
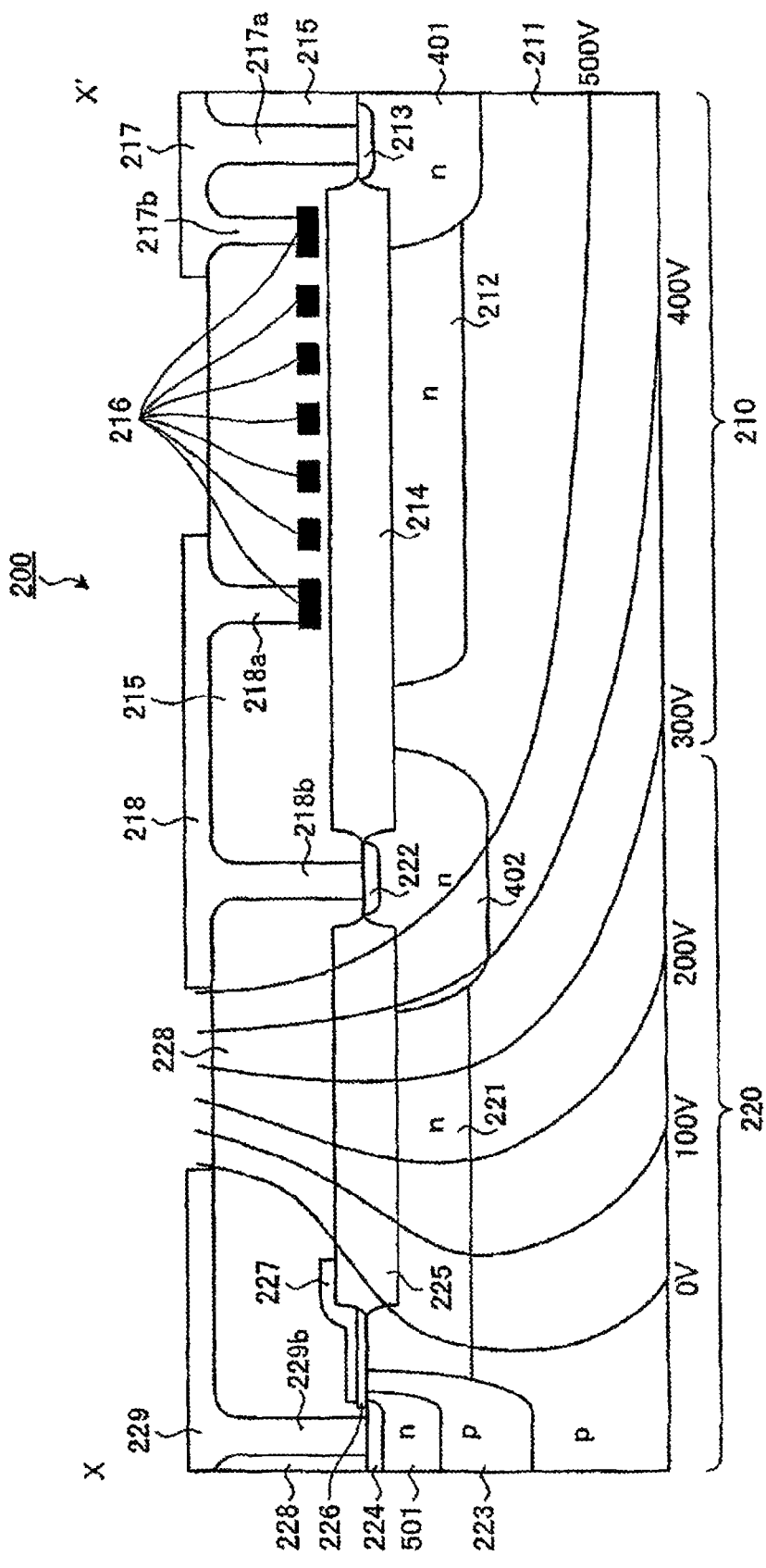
FIG. 7 is a cross-sectional view showing operation (when the MOSFET 220 is turned off) of the semiconductor device shown in FIG. 5.

FIG. 7 is a cross-sectional view showing operation (when the MOSFET 220 is turned off) of the semiconductor device shown in FIG. 5. When the switching portion 150 (see FIG. 1) does not apply a voltage at or above a threshold value voltage to the gate electrode 227, a channel is not formed in the P base 223, and there is no conduction between the N-type drain drift layer 221 and the source $N^+$ layer 224. In this case, as shown in FIG. 7, a high potential results from the high-voltage high-resistance element 216 to the second high-voltage application layer 402. Consequently, achievement of a high withstand voltage on the side of the MOSFET 220 is necessary.

This is a case in which a high voltage (500 V) at the same potential is applied to the N-type drift layer 212 and to the second high-voltage application layer 402, so that as opposed to when the MOSFET 220 is turned on, there is large widening of the depletion layer which widens from the PN junction of the second high-voltage application layer 402 and the P-type semiconductor substrate toward the P-type semiconductor substrate.

Hence the depletion layer which widens from the PN junction of the second high-voltage application layer 402 and the P-type semiconductor substrate toward the P-type semiconductor substrate, and the depletion layer which widens from the PN junction of the N-type drift layer 212 and the P-type semiconductor substrate toward the P-type semiconductor substrate, are joined together. At this time, a potential difference occurs in the first oxide film 214, and breakdown of the first insulating film 215 can be prevented.

As above, by setting the spacing between the N-type drift layer 212 and the second high-voltage application layer 402 such that, when the MOSFET 220 is turned on, the depletion layer which widens from the PN junction of the second high-voltage application layer 402 and the P-type semiconductor substrate toward the P-type semiconductor substrate, and the depletion layer which widens from the PN junction of the N-type drift layer 212 and the P-type semiconductor substrate toward the P-type semiconductor substrate, are not joined together, and when the MOSFET 220 is turned off, the depletion layer which widens from the PN junction of the second high-voltage application layer 402 and the P-type semiconductor substrate toward the P-type semiconductor substrate, and the depletion layer which widens from the PN junction of the N-type drift layer 212 and the P-type semiconductor substrate toward the P-type semiconductor substrate, are joined together, a high withstand voltage can be achieved in both states, when the MOSFET 220 is turned on and is turned off.

In this way, by means of the integrated circuit 100 of Embodiment 1, a switch 140 is provided in series with a resistive voltage divider element configured by a first resistor 121 and a second resistor 122, and by putting this switch 140 into the open state during standby of the control portion 130, current passing through the resistive voltage divider element can be cut off. Hence the continuing flow of current through the resistive voltage divider element during standby of the control portion 130 can be prevented, and circuit power consumption can be reduced. Further, by cutting off the current passing through the resistive voltage divider element, the withstand voltage applied to the resistive voltage divider element can be reduced. Hence the size of the resistive voltage divider element can be decreased, and the element area necessary for the resistive voltage divider element can be decreased.

Further, by configuration as a semiconductor device 200 configured integrally with a first resistor 121 and switch 140 configuring a resistive voltage divider element, the first resistor 121 and switch 140 can be integrated with the integrated circuit 100, without providing new constituent components such as mechanical switches and similar.

Further, in the semiconductor device 200, by integrally configuring the resistance portion 210 and MOSFET 220 in common with the second metal wiring line 218, there is no need to provide drain metal wiring line or similar spanning the N-type drain drift layer 221 for connection of the resistance portion 210 and MOSFET 220. Hence the circuit withstand voltage can be maintained without providing a field plate or other new constituent components.

Further, by forming the film thickness of the first oxide film 214 to be thick as described above, due to the potential difference occurring between the metal wiring line and high-voltage high-resistance element 216 formed on the first oxide film 214, and the semiconductor portion, breakdown of the first oxide film 214 can be prevented. Advantageous results obtained by forming the film thickness of the second oxide film 225 to be thick as described above are also similar to those for the first oxide film 214.

Embodiment 2

Figure 8:
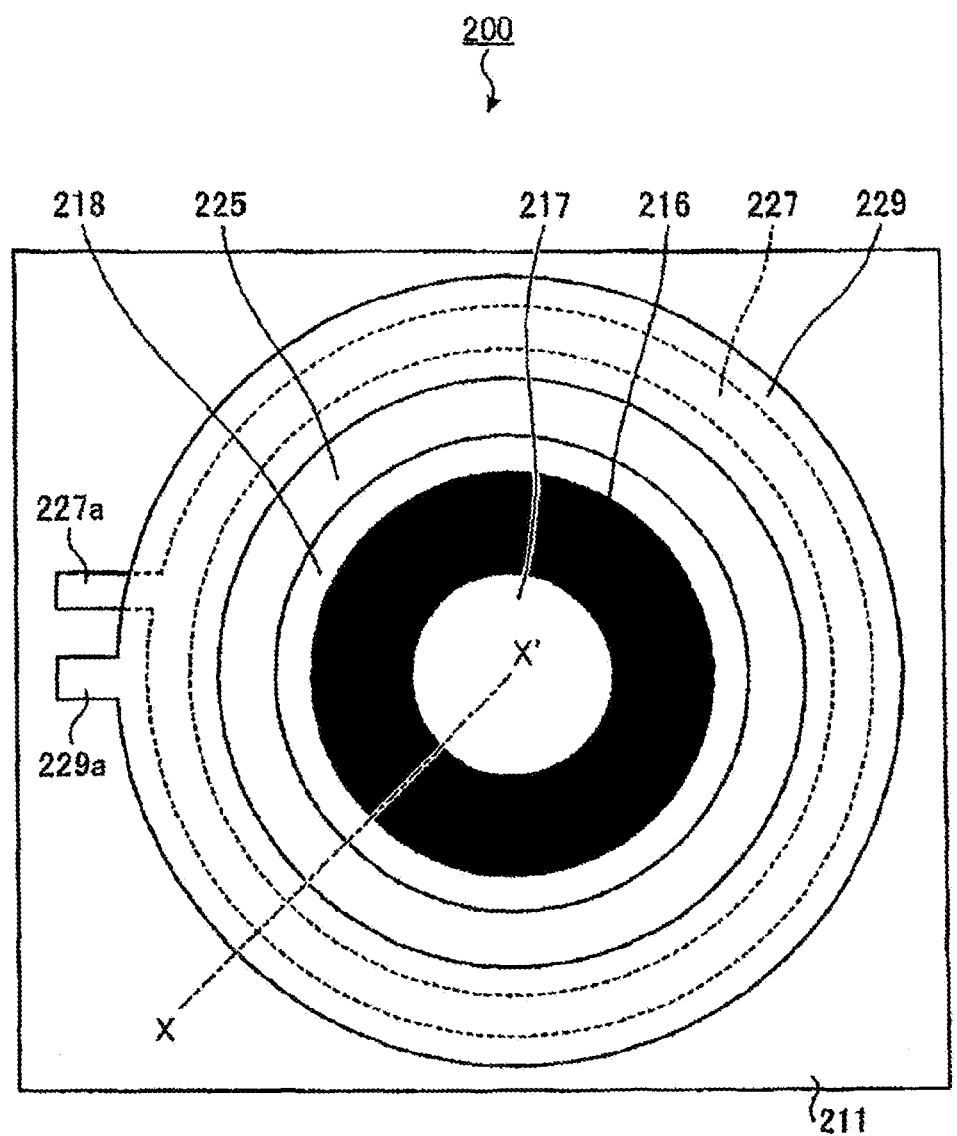
FIG. 8 is a plane view showing principle portions of the semiconductor device of Embodiment 2 of the invention.
Figure 9:
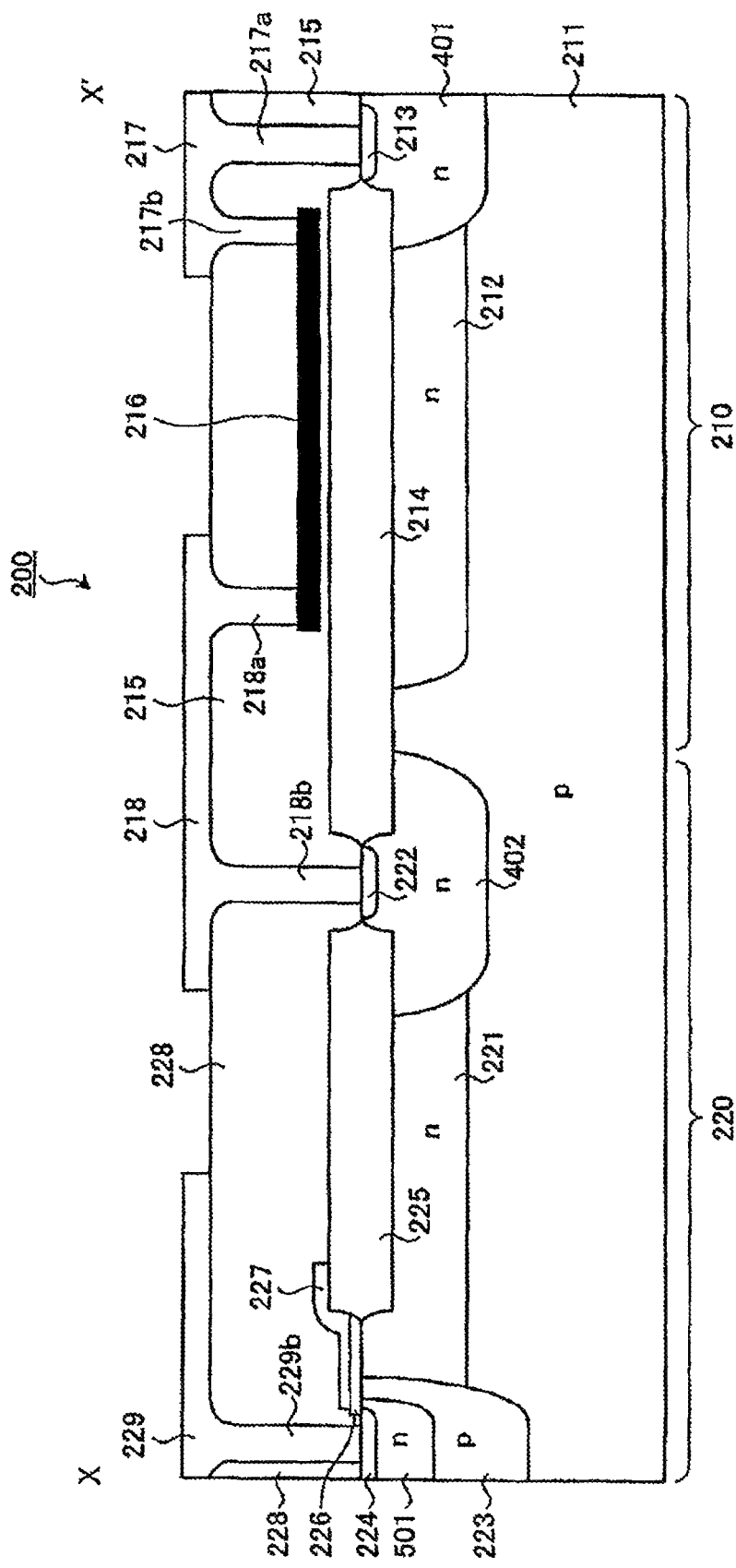
FIG. 9 is a cross-sectional view sectioning the semiconductor device shown in FIG. 8 along the section line X-X'.

FIG. 8 is a plane view showing principle portions of the semiconductor device of Embodiment 2 of the invention. Further, FIG. 9 is a cross-sectional view sectioning the semiconductor device shown in FIG. 8 along the section line X-X'. In FIG. 8 and FIG. 9, the same symbols are assigned for the configuration similar to the configuration shown in FIG. 2 and FIG. 3, and explanations are omitted. As shown in FIG. 8 and FIG. 9, in the semiconductor device 200 of Embodiment 2, the high-voltage high-resistance element 216 is formed such that the planar shape thereof is for example a circular ring shape.

Figure 10:
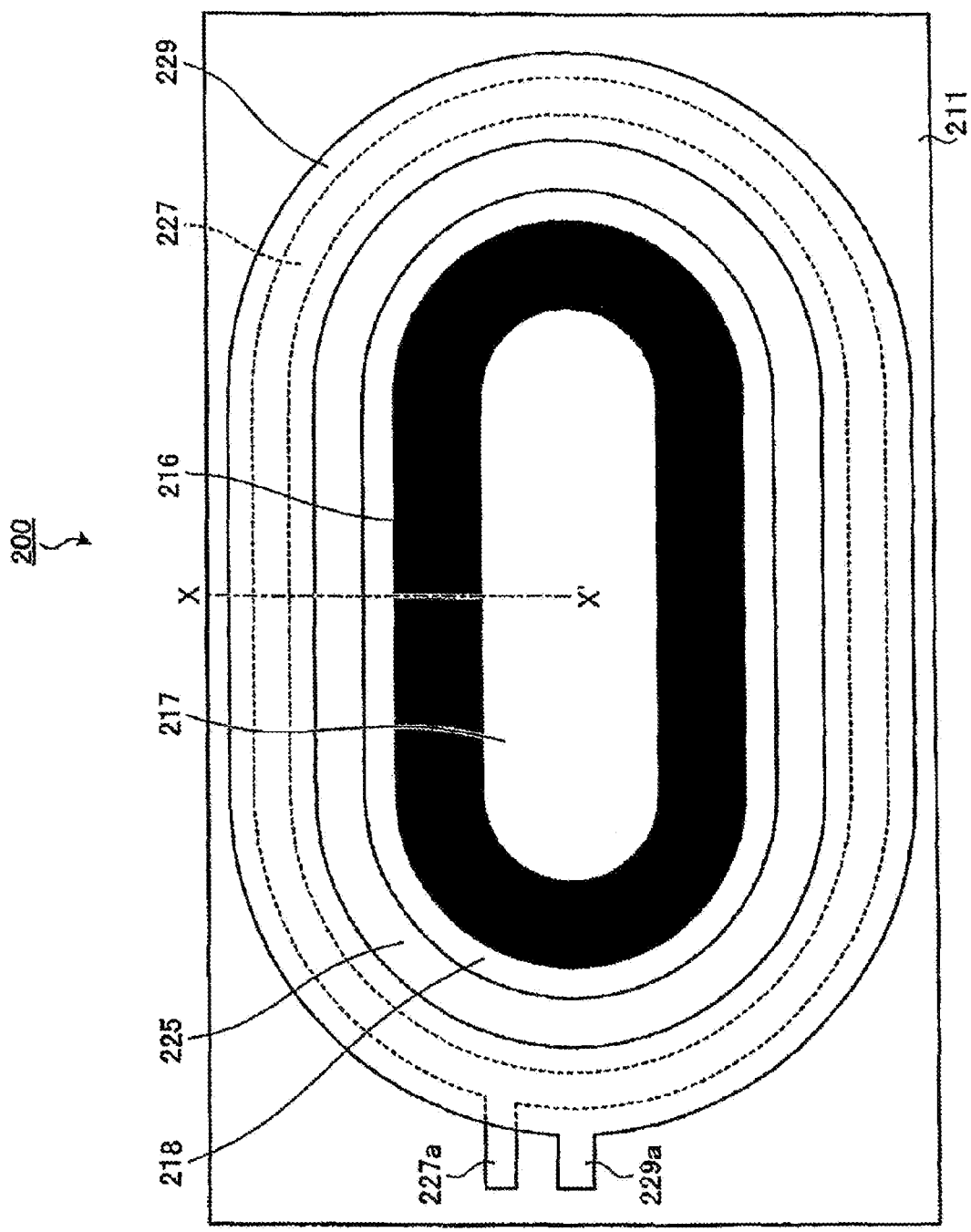
FIG. 10 is a plane view showing a modified example of the semiconductor device shown in FIG. 8.

FIG. 10 is a plane view showing a modified example of the semiconductor device shown in FIG. 8. In FIG. 10, the same symbols are assigned for the configuration similar to the configuration shown in FIG. 8, and explanations are omitted. In FIG. 8, all configurations, excepting the P-type semiconductor substrate 211 of the semiconductor device 200, are formed in a planar shape which is either circular or a circular ring shape; but as shown in FIG. 10, the planar shapes of all configurations of the semiconductor device 200 may be formed in a track (ellipse) shape. The cross-sectional view shown in FIG. 10 which sections the semiconductor device 200 along the section line X-X' is similar to the cross-sectional view shown in FIG. 9.

Figure 11:
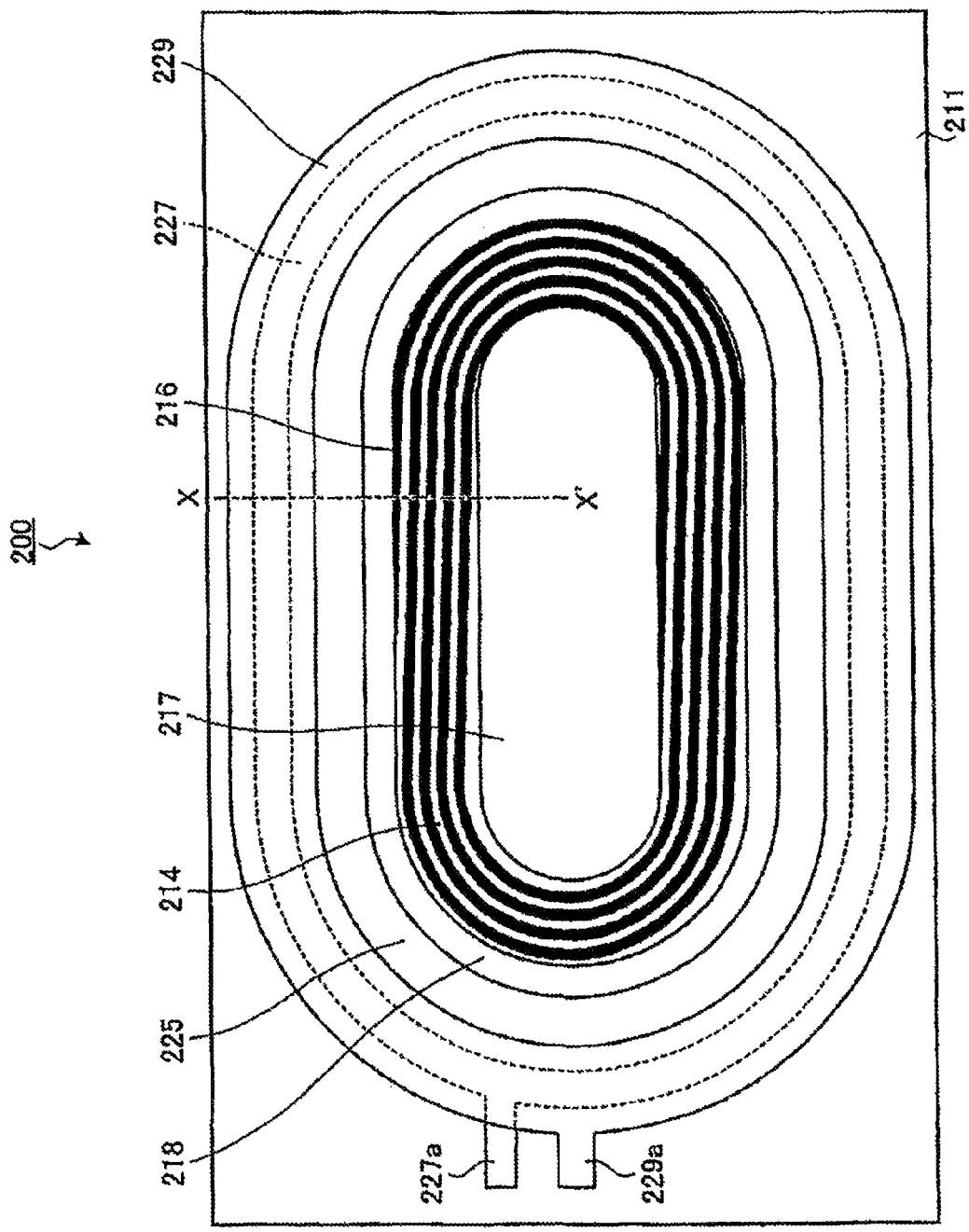
FIG. 11 is a plane view showing a modified example of the semiconductor device shown in FIG. 10.

FIG. 11 is a plane view showing a modified example of the semiconductor device shown in FIG. 10. In FIG. 11, the same symbols are assigned for the configuration similar to the configuration shown in FIG. 10, and explanations are omitted. In FIG. 10, the high-voltage high-resistance element 216 is formed such that the planar shape thereof is a track shape, but as shown in FIG. 11, the high-voltage high-resistance element 216 may be formed such that the planar shape thereof is a track shape, and is moreover a spiral shape. A cross-sectional view of the semiconductor device 200 shown in FIG. 11 sectioned along the section line X-X' is similar to the cross-sectional view shown in FIG. 3.

Figure 12:
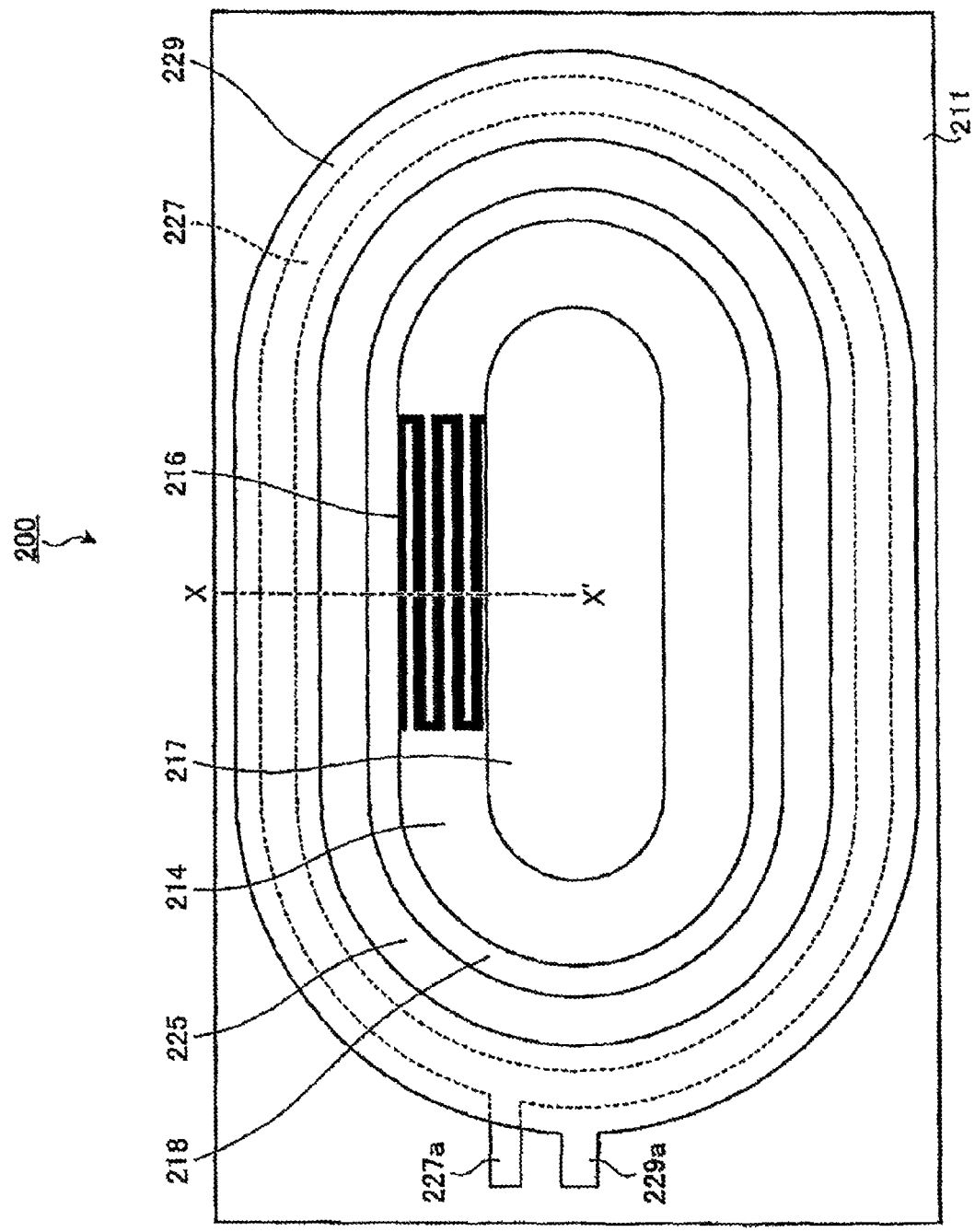
FIG. 12 is a plane view showing a modified example of the semiconductor device shown in FIG. 10.

FIG. 12 is a plane view showing a modified example of the semiconductor device shown in FIG. 10. In FIG. 12, the same symbols are assigned for the configuration similar to the configuration shown in FIG. 10, and explanations are omitted. In FIG. 10, the high-voltage high-resistance element 216 is formed such that the planar shape thereof is a track shape, but as shown in FIG. 12, the high-voltage high-resistance element 216 may be formed such that the planar shape thereof is a zigzag shape. In this case, the high-voltage high-resistance element 216 is formed in a zigzag shape from near the center of the P-type semiconductor substrate 211 toward the outside. A cross-sectional view of the semiconductor device 200 shown in FIG. 12 sectioned along the section line X-X' is similar to the cross-sectional view shown in FIG. 3.

In this way, by means of the semiconductor device 200 of Embodiment 2, similarly to the semiconductor device 200 of Embodiment 1, by cutting off the current passing through the resistive voltage divider element during standby of the control portion 130 by means of the switch 140 provided in series with the resistive voltage divider element, the continuing flow of current through the resistive voltage divider element during standby of the control portion 130 can be prevented, and circuit power consumption can be reduced. Further, by configuration as a semiconductor device 200 configured integrally with a first resistor 121 and switch 140 configuring a resistive voltage divider element, the first resistor 121 and switch 140 can be integrated with the integrated circuit 100.

Embodiment 3

Figure 13:
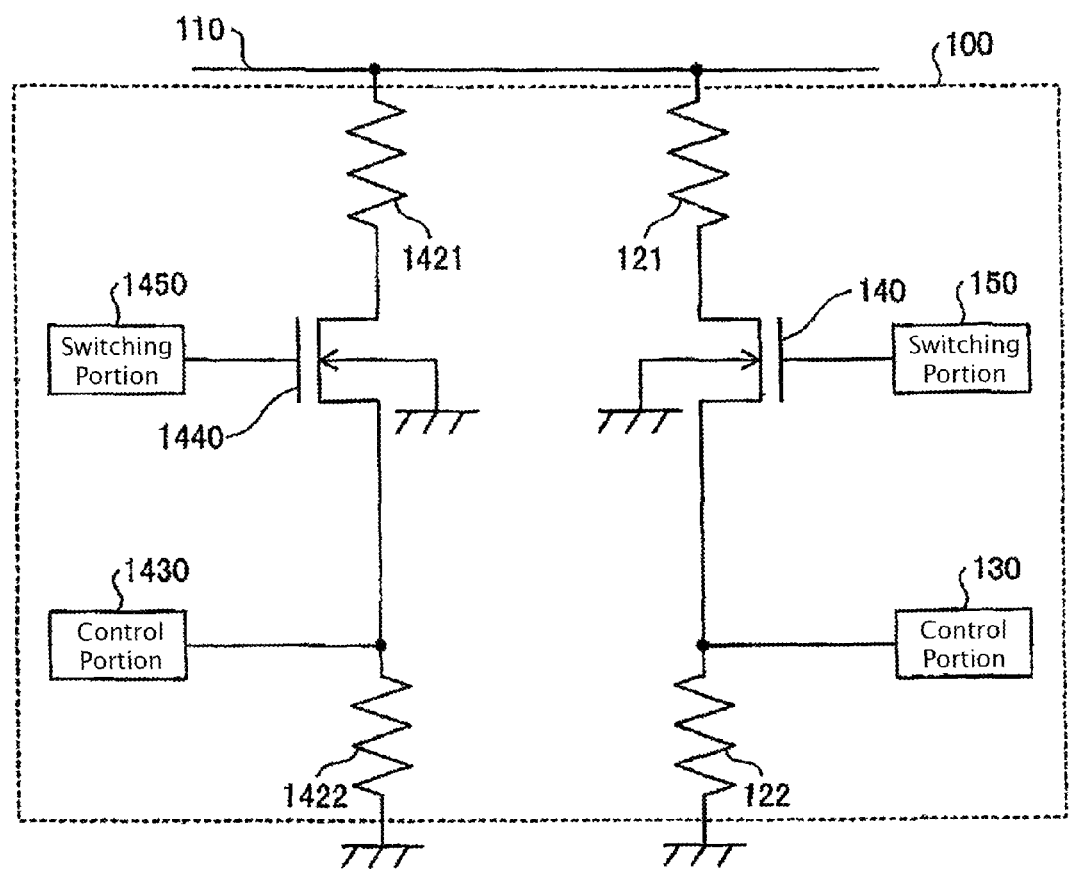
FIG. 13 is a circuit diagram showing principle portions of the integrated circuit of Embodiment 3 of the invention.

FIG. 13 is a circuit diagram showing principle portions of the integrated circuit of Embodiment 3 of the invention. In FIG. 13, the same symbols are assigned for the configuration similar to the configuration shown in FIG. 1, and explanations are omitted. As shown in FIG. 13, the integrated circuit 100 of Embodiment 3 comprises, in addition to the configuration of the integrated circuit 100 shown in FIG. 1, a third resistor 1421 and fourth resistor 1422, a control portion 1430, second switch 1440, and second switching portion 1450.

The configurations of the third resistor 1421, fourth resistor 1422, control portion 1430, second switch 1440, and second switching portion 1450 are similar to those of the first resistor 121, second resistor 122, control portion 130, switch 140, and switching portion 150, respectively. The first resistor 121, switch 140, third resistor 1421, and second switch 1440 are configured as an integrally configured semiconductor device 200 (see FIG. 14).

Here, two sets of resistors and switches (the set of the first resistor 121, second resistor 122 and switch 140, and the set of the third resistor 1421, fourth resistor 1422 and second switch 1440) are provided in parallel, in a configuration in which the control portion 130 and switching portion 150 and the control portion 1430 and second switching portion 1450 are respectively provided; but the two sets of resistors and switches are connected to different input terminals of a common control portion 130, in a configuration in which the control portion 1430 is omitted. In this case, the switch 140 and the second switch 1440 may be simultaneously controlled by the switching portion 150, in a configuration in which the second switching portion 1450 is omitted.

Figure 14:
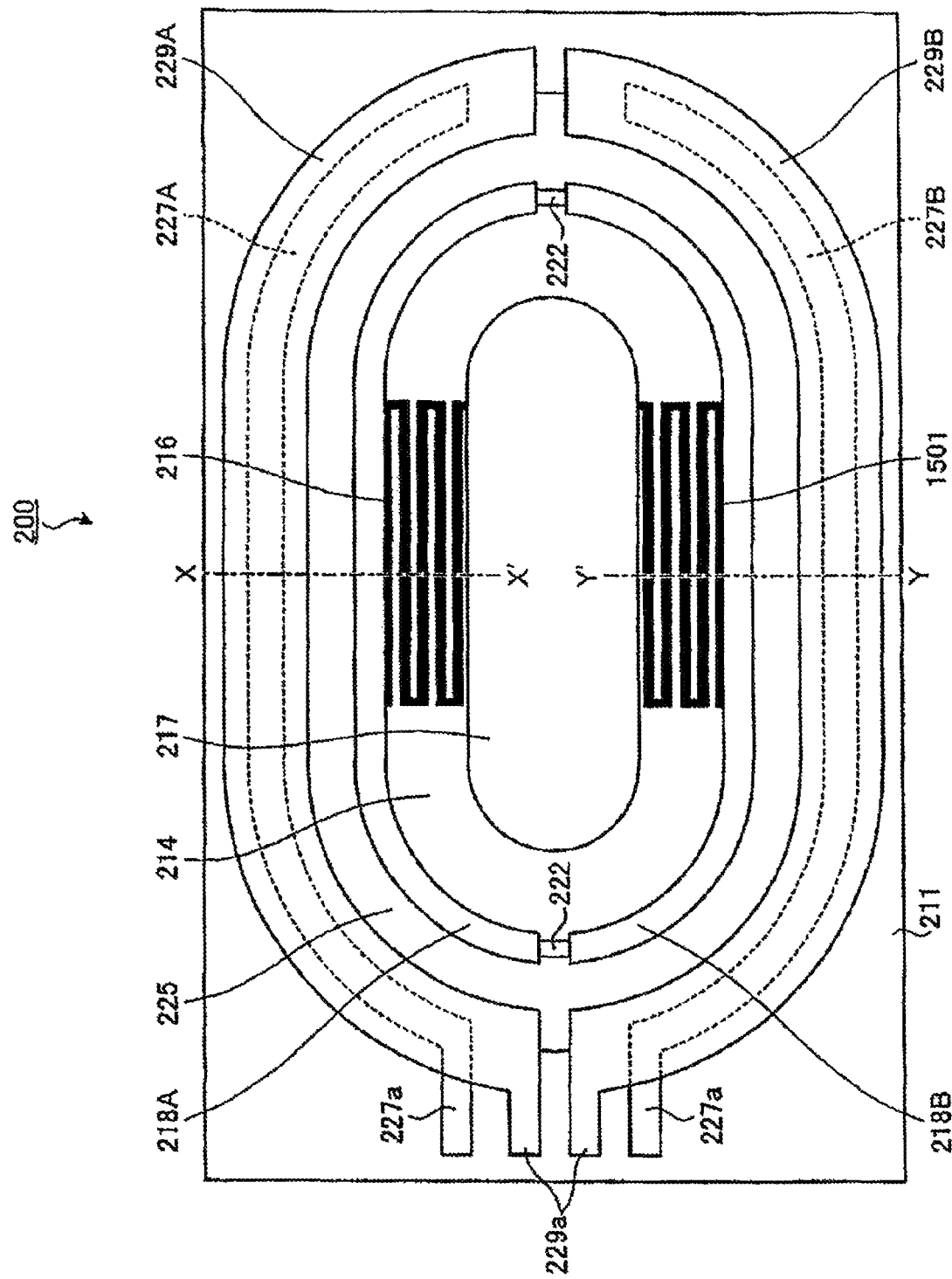
FIG. 14 is a plane view showing principle portions of the semiconductor device of Embodiment 3 of the invention.

FIG. 14 is a plane view showing principle portions of the semiconductor device of Embodiment 3 of the invention. In FIG. 14, the same symbols are assigned for the configuration similar to the configuration shown in FIG. 12, and explanations are omitted. Here, the second metal wiring line 218, gate electrode 227, and third metal wiring line 229 have planar shapes which are divided into two, respectively forming second metal wiring lines 218A, 218B, gate electrodes 227A, 227B, and third metal wiring lines 229A, 229B, each with the shape of one-half of a track shape.

The terminal 229a of the third metal wiring line 229A is connected to the control portion 130 (see FIG. 13). The terminal 229a of the third metal wiring line 229B is connected to the control portion 1430. The terminal 227a of the gate electrode 227A is connected to the switching portion 150. The terminal 227a of the gate terminal 227B is connected to the second switching portion 1450. The inside end portion of the high-voltage high-resistance element 216 is connected to the first metal wiring line 217, and the outside end portion is connected to the second metal wiring line 218A.

Further, here the semiconductor device 200 further comprises a high-voltage high-resistance element 1501. The high-voltage high-resistance element 1501 is formed such that the planar shape thereof is a zigzag shape. The inside end portion of the high-voltage high-resistance element 1501 is connected to the first metal wiring line 217, and the outside end portion is connected to the second metal wiring line 218B.

The cross-sectional view of the semiconductor device 200 sectioned along section line X-X' shown in FIG. 14 is a drawing in which, in the cross-sectional view shown in FIG. 14, the symbols 218, 227 and 229 are respectively replaced with the symbols 218A, 227A and 229A. The cross-sectional view of the semiconductor device 200 sectioned along section line Y-Y' is a drawing in which, in the cross-sectional view shown in FIG. 3, the symbols 216, 218, 227 and 229 are respectively replaced with the symbols 1501, 218B, 227B, and 229B.

In this way, by dividing into two the second metal wiring line 218, gate electrode 227 and third metal wiring line 229, and by further comprising a high-voltage high-resistance element 1501, integral configuration of two sets of resistors and switches connected in parallel is possible. By increasing the number of divisions of each of the electrodes, and further providing high-voltage high-resistance elements, three or more sets of resistors and switches can be integrally configured.

Here, a configuration is explained in which the gate electrode 227 is divided into a gate electrode 227A and a gate electrode 227B, but when the control portion 130 has a plurality of input terminals, and two sets of resistors and switches are each connected to different input terminals of the control portion 130, a configuration may be employed in which the gate electrode 227 is not divided, and the gate electrode 227 is connected to the switching portion 150. In this case, each of the terminals 229a of the third metal wiring line 229A and the third metal wiring line 229B is connected to a different input terminal of the control portion 130.

In this way, by means of a semiconductor device 200 of Embodiment 3, the advantageous results of the semiconductor device 200 of Embodiment 2 are obtained, and by further providing a high-voltage high-resistance element in parallel with the high-voltage high-resistance element 216, a plurality of sets of resistors and switches can be integrally configured and integrated in an integrated circuit 100.

Embodiment 4

Figure 15:
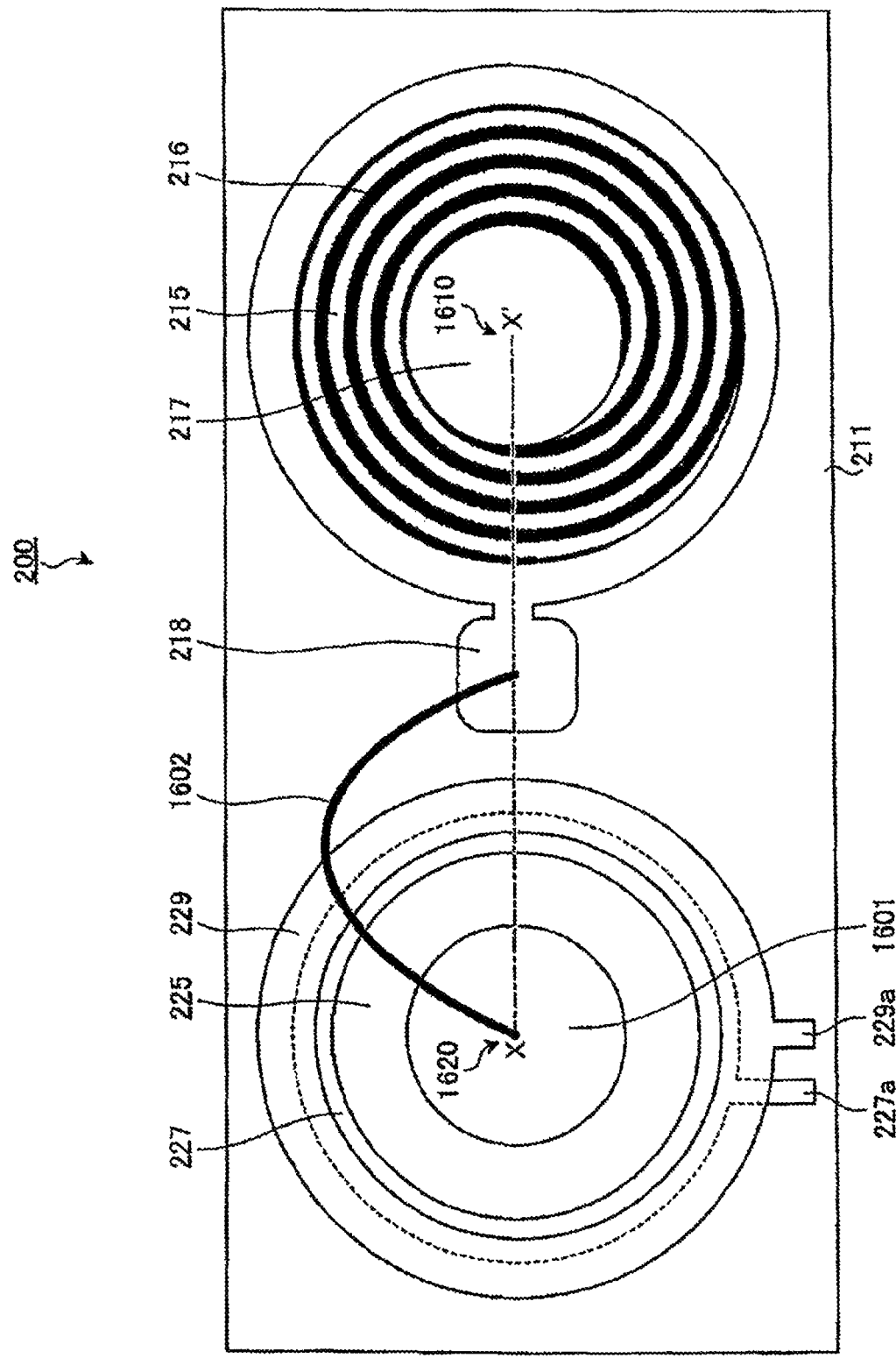
FIG. 15 is a plane view showing principle portions of the semiconductor device of Embodiment 4 of the invention.
Figure 16:
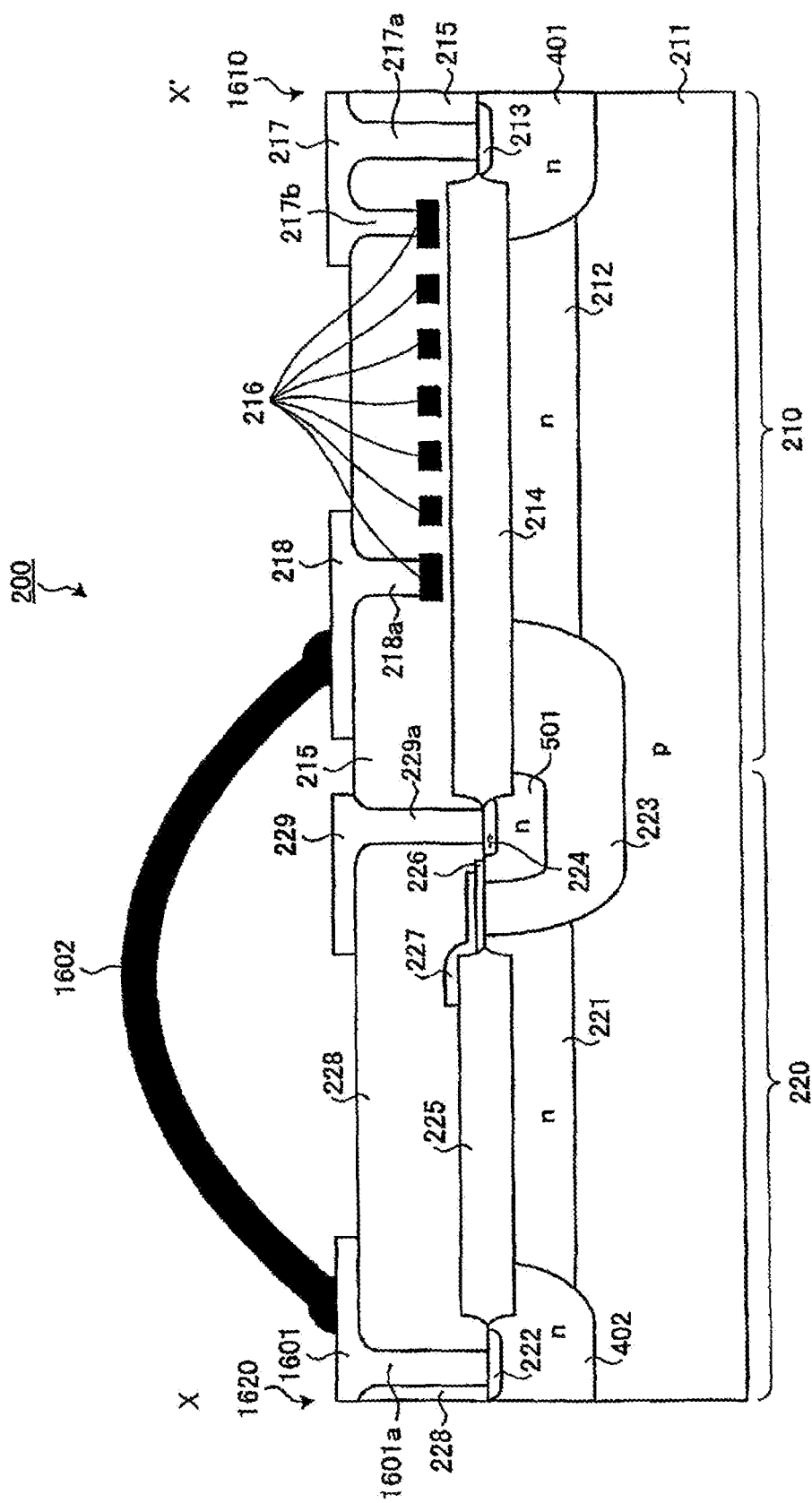
FIG. 16 is a cross-sectional view sectioning the semiconductor device shown in FIG. 15 along the section line X-X'.

FIG. 15 is a plane view showing principle portions of the semiconductor device of Embodiment 4 of the invention. FIG. 16 is a cross-sectional view sectioning the semiconductor device shown in FIG. 15 along the section line X-X'. In FIG. 15 and FIG. 16, the same symbols are assigned for the configuration similar to the configuration shown in FIG. 2 and FIG. 3, and explanations are omitted. In Embodiments 1 to 3, cases were explained in which, by integrally configuring the resistance portion 210 and MOSFET 220, the semiconductor device 200 could be made smaller; but the resistance portion 210 and MOSFET 220 may be configured separately.

Here, a case is explained in which the resistance portion 210 and MOSFET 220 are formed at a first position 1610 and second position 1620 respectively, which are different, on the P-type semiconductor substrate 211, such that the planar shapes thereof are for example separate circular shapes. The second metal wiring line 218 does not have a second drain contact portion 218b, and is electrically connected to the second drain N$^+$ layer 222, second high-voltage application layer 402 and N-type drain drift layer 221, via a fourth metal wiring line 1601 and first wire 1602.

In addition to the configurations shown in FIG. 2 and FIG. 3, the MOSFET 220 further comprises a fourth metal wiring line 1601 and first wire 1602. The N-type drain drift layer 221 is formed such that the planar shape thereof is a circular ring shape surrounding the second position 1620. The second high-voltage application layer 402 is formed such that the planar shape thereof is for example a circular shape surrounding the second position 1620.

The fourth metal wiring line 1601 is formed on the second insulating film 228. The fourth metal wiring line 1601 is formed in for example a circular shape centered on the second position 1620. The fourth metal wiring line 1601 has a third drain contact portion 1601a penetrating the second insulating film 228. The third drain contact portion 1601a is connected to the second drain N$^+$ layer 222.

The third metal wiring line 229 is formed such that the planar shape thereof is for example a circular ring shape surrounding the fourth metal wiring line 1601. The two end portions of the first wire 1602 are connected to the second metal wiring line 218 and to the fourth metal wiring line 1601.

In this way, by means of the semiconductor device 200 of Embodiment 4, a switch 140 is provided in series with the resistive voltage divider element configured by the first resistor 121 and second resistor 122, and by putting this switch 140 into the open state during standby of the control portion 130, the current passing through the resistive voltage divider element can be cut off. Hence the continuing flow of current through the resistive voltage divider element during standby of the control portion 130 can be prevented, and circuit power consumption can be reduced.

Embodiment 5

Figure 17:
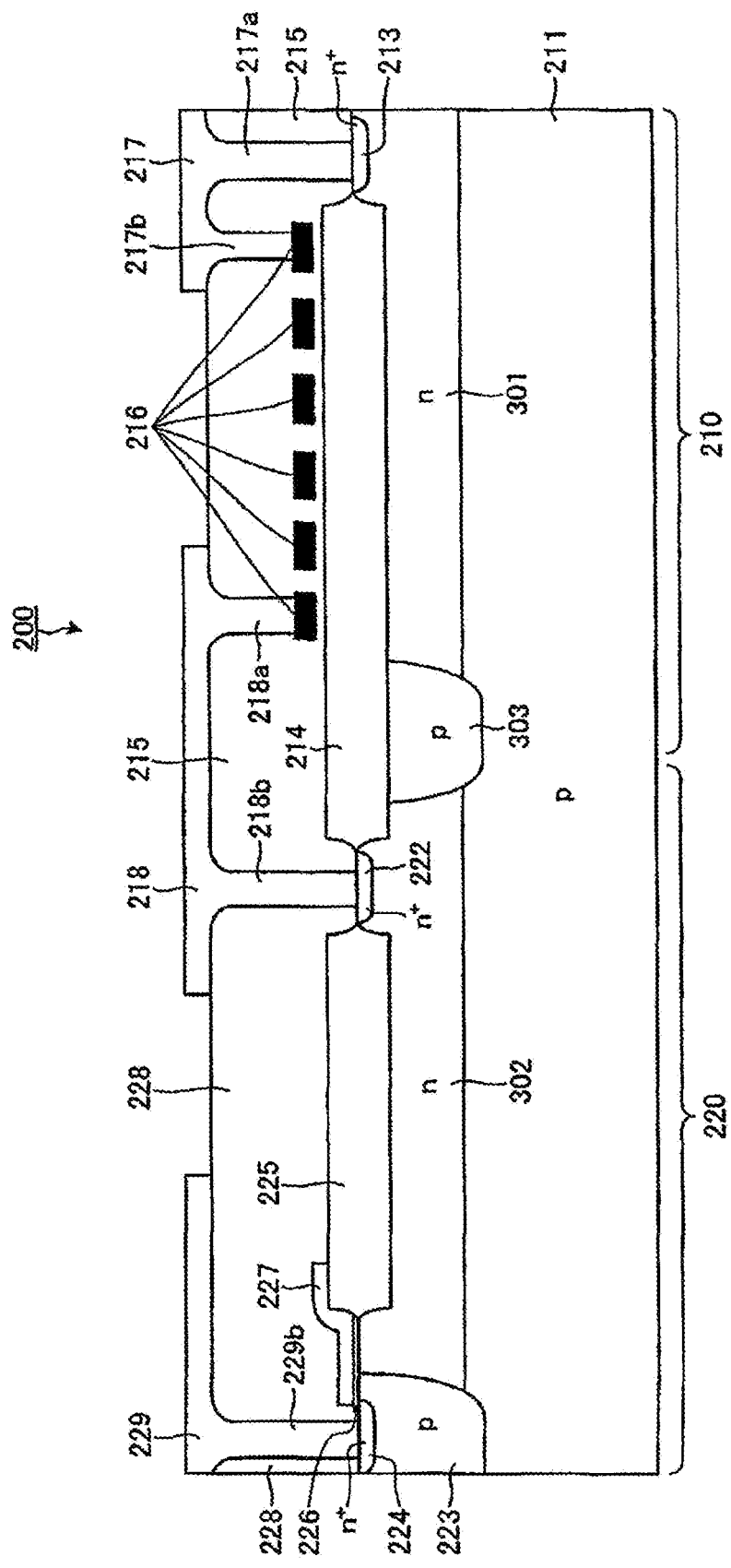
FIG. 17 is a cross-sectional view showing a modified example of the semiconductor device shown in FIG. 3.

FIG. 17 is a cross-sectional view showing a modified example of the semiconductor device shown in FIG. 3. In FIG. 17, the same symbols are assigned for the configuration similar to the configuration shown in FIG. 3, and explanations are omitted. In the semiconductor device 200 shown in FIG. 3, the N-type drift layer and the N-type drain drift layer (first diffusion layer and second diffusion layer) may be formed as epitaxial layers, as an N-type drift epitaxial layer 301 and N-type drain drift epitaxial layer 302.

Such a semiconductor device 200 can be manufactured by forming, on a portion of the surface layer of an N-type epitaxial layer grown on the surface of the P-type semiconductor substrate 211, a P-type layer 303 (seventh diffusion layer) reaching the P-type semiconductor substrate 211. By means of the P-type layer 303, the epitaxial layer formed on the surface of the P-type semiconductor substrate 211 is separated from the N-type drift epitaxial layer 301 and the N-type drain drift epitaxial layer 302.

In this way, by means of the semiconductor device 200 of Embodiment 5, advantageous results similar to those of the semiconductor device 200 of Embodiment 1 can be obtained.

Embodiment 6

Figure 18:
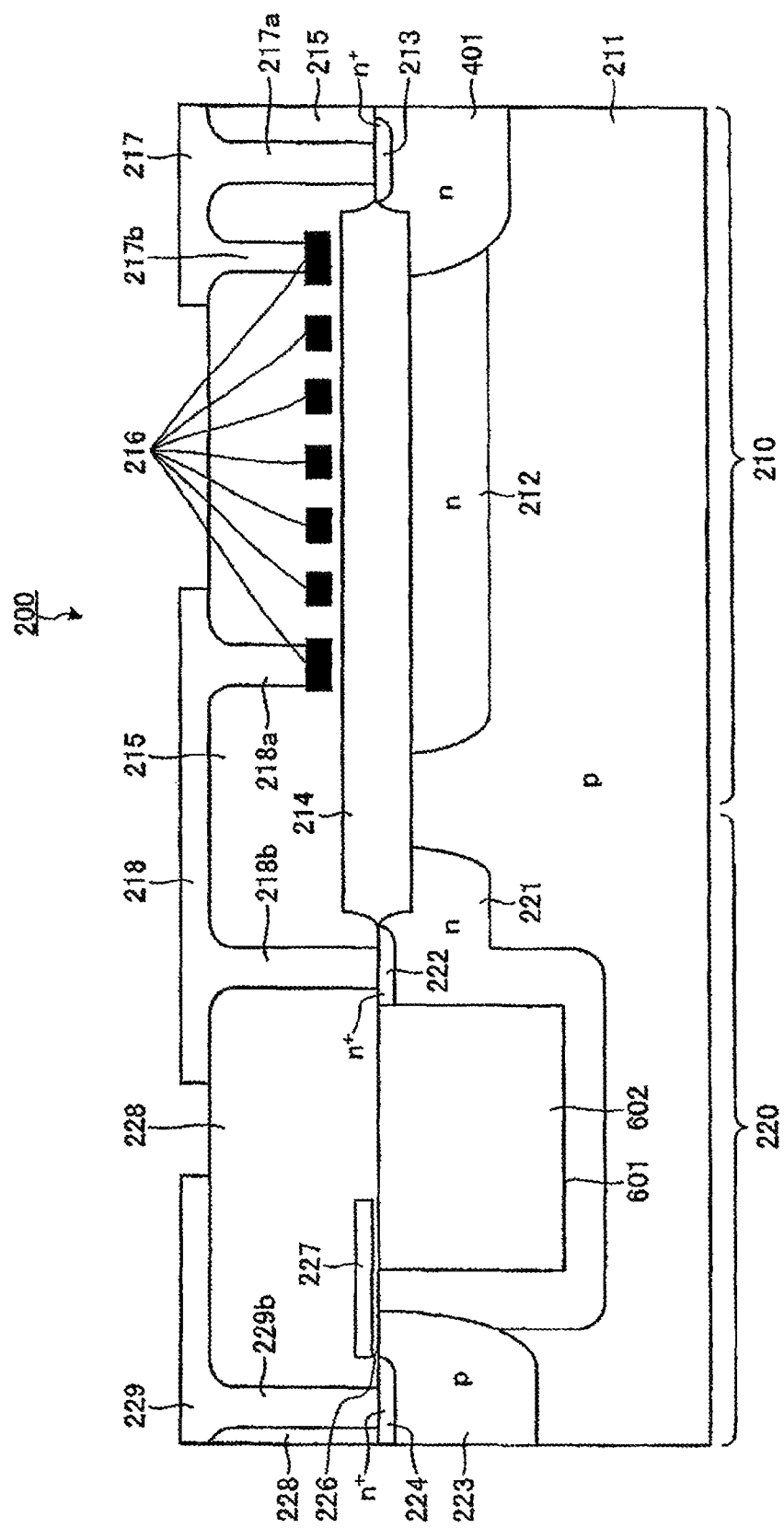
FIG. 18 is a cross-sectional view showing a modified example of the semiconductor device shown in FIG. 3.

FIG. 18 is a cross-sectional view showing a modified example of the semiconductor device shown in FIG. 3. In FIG. 18, the same symbols are assigned for the configuration similar to the configuration shown in FIG. 3, and explanations are omitted. In the semiconductor device 200 shown in FIG. 3, an N-type drain drift layer 221 may be formed along the side walls and bottom portion of a trench 601 formed in the P-type semiconductor substrate 211. The interior of the trench 601 is filled with a dielectric material 602.

In this way, by means of the semiconductor device 200 of Embodiment 6, advantageous results similar to those of the semiconductor device 200 of Embodiment 1 can be obtained. Further, compared with Embodiment 1, the width of the semiconductor device 200 (for example, the distance between X-X' in FIG. 2) can be made small.

Embodiment 7

Figure 19:
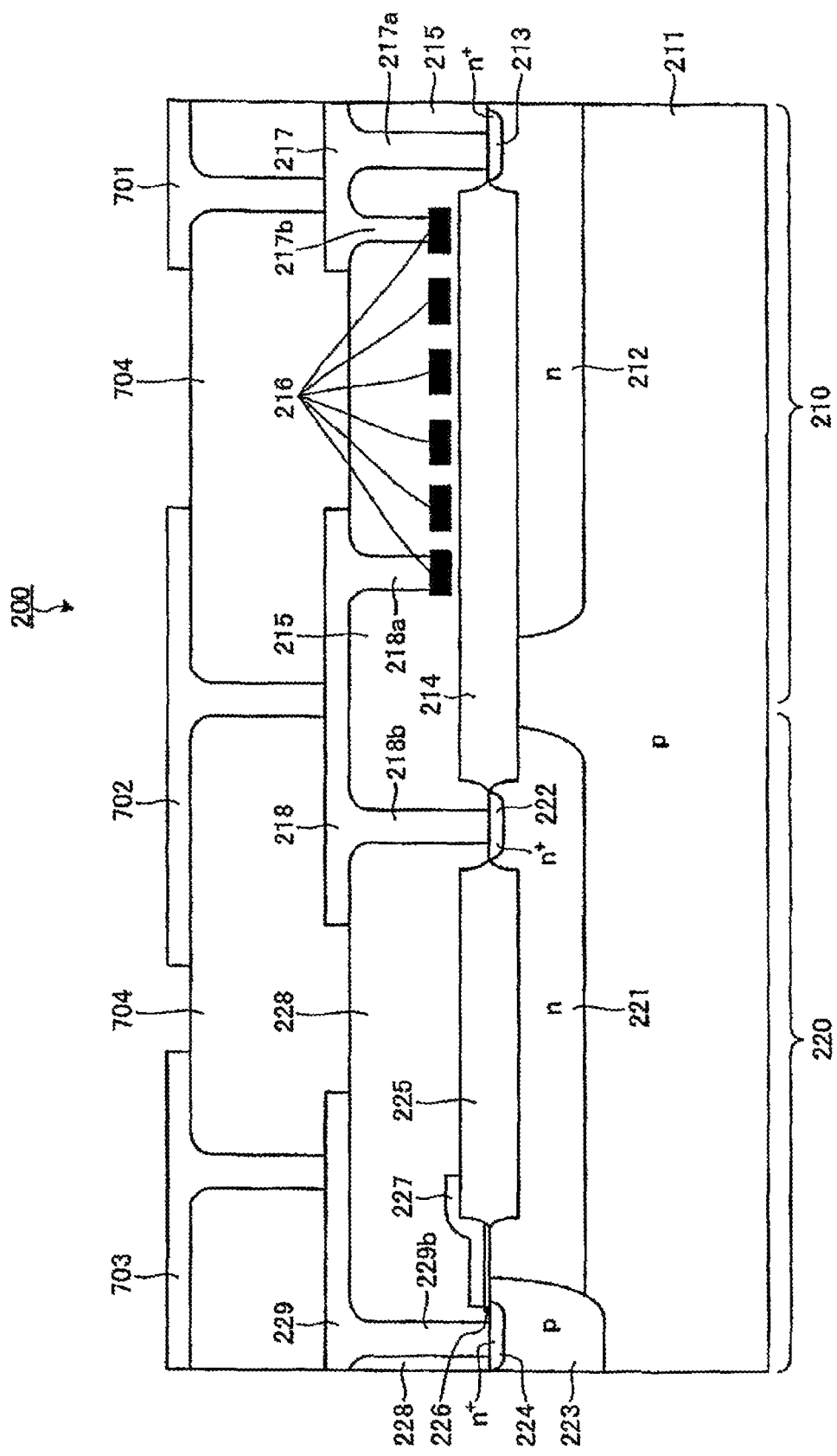
FIG. 19 is a cross-sectional view showing a modified example of the semiconductor device shown in FIG. 3.

FIG. 19 is a cross-sectional view showing a modified example of the semiconductor device shown in FIG. 3. In FIG. 19, the same symbols are assigned for the configuration similar to the configuration shown in FIG. 3, and explanations are omitted. In the semiconductor device 200 shown in FIG. 3, a fifth metal wiring line 701, sixth metal wiring line 702, and seventh metal wiring line 703 may be provided.

A third insulating film 704 is formed on the surfaces of the first metal wiring line 217, second metal wiring line 218, and third metal wiring line 229. The fifth metal wiring line 701 is formed above the first metal wiring line 217, and by means of a contact portion penetrating the third insulating film 704, is electrically connected to the first metal wiring line 217. The sixth metal wiring line 702 is formed above the second metal wiring line 218, and is electrically connected to the second metal wiring line 218 by a contact portion penetrating the third insulating film 704. The seventh metal wiring line 703 is formed above the third metal wiring line 229, and is electrically connected to the third metal wiring line 229 by a contact portion penetrating the third insulating film 704.

The sixth metal wiring line 702 and seventh metal wiring line 703 are formed so as to be mutually removed. And, formation is such that the distance between the sixth metal wiring line 702 and the seventh metal wiring line 703 is narrower than the distance between the second metal wiring line 218 and the third metal wiring line 229. The reason for this is as follows. In the MOSFET 220, at the surface of a passivation film (not shown) formed on a metal wiring line, due to the accumulation of mobile ions, distortions occur in the source-drain equipotential distribution. By providing a sixth metal wiring line 702 and seventh metal wiring line 703, and decreasing the aperture portion in the metal wiring lines between source and drain, to suppress distortions in the source-drain equipotential distribution, it is possible to render the occurrence of electric field concentration less likely. Further, it is preferable that the sixth metal wiring line 702 and seventh metal wiring line 703 be separated to an extent that electric field concentration does not readily occur.

The fifth metal wiring line 701 and sixth metal wiring line 702 are formed so as to be mutually removed. Further, it is preferable that the fifth metal wiring line 701 and sixth metal wiring line 702 be removed to such an extent that electric field concentration arising from distortions in the equipotential distribution does not occur. The distance between the fifth metal wiring line 701 and the sixth metal wiring line 702 may be equal to or greater than the distance between the first metal wiring line 217 and the second metal wiring line 218. The reason for this is that in the resistance portion 210, a high-voltage high-resistance element 216 is formed, so that the effect of mobile ions accumulated on the surface of the passivation film is small.

In this way, by means of the semiconductor device 200 of Embodiment 7, advantageous results similar to those of the semiconductor device 200 of Embodiment 1 can be obtained. Further, distortions in the equipotential distribution between source and drain of the MOSFET 220 can be suppressed, and the occurrence of electric field concentration can be reduced.

Embodiment 8

Figure 20:
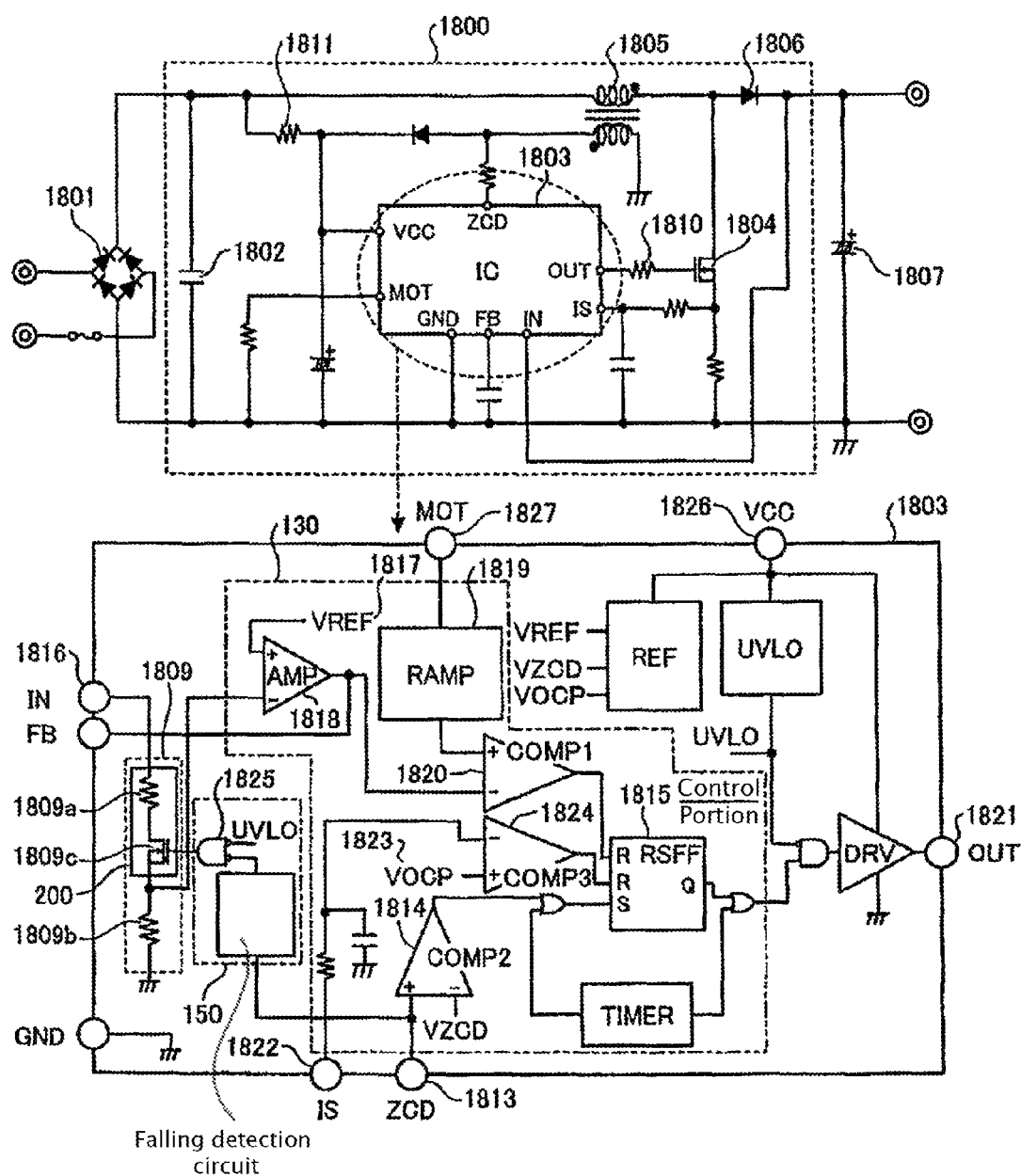
FIG. 20 is a circuit diagram showing the switching power supply of Embodiment 8 of the invention.
Figure 35:
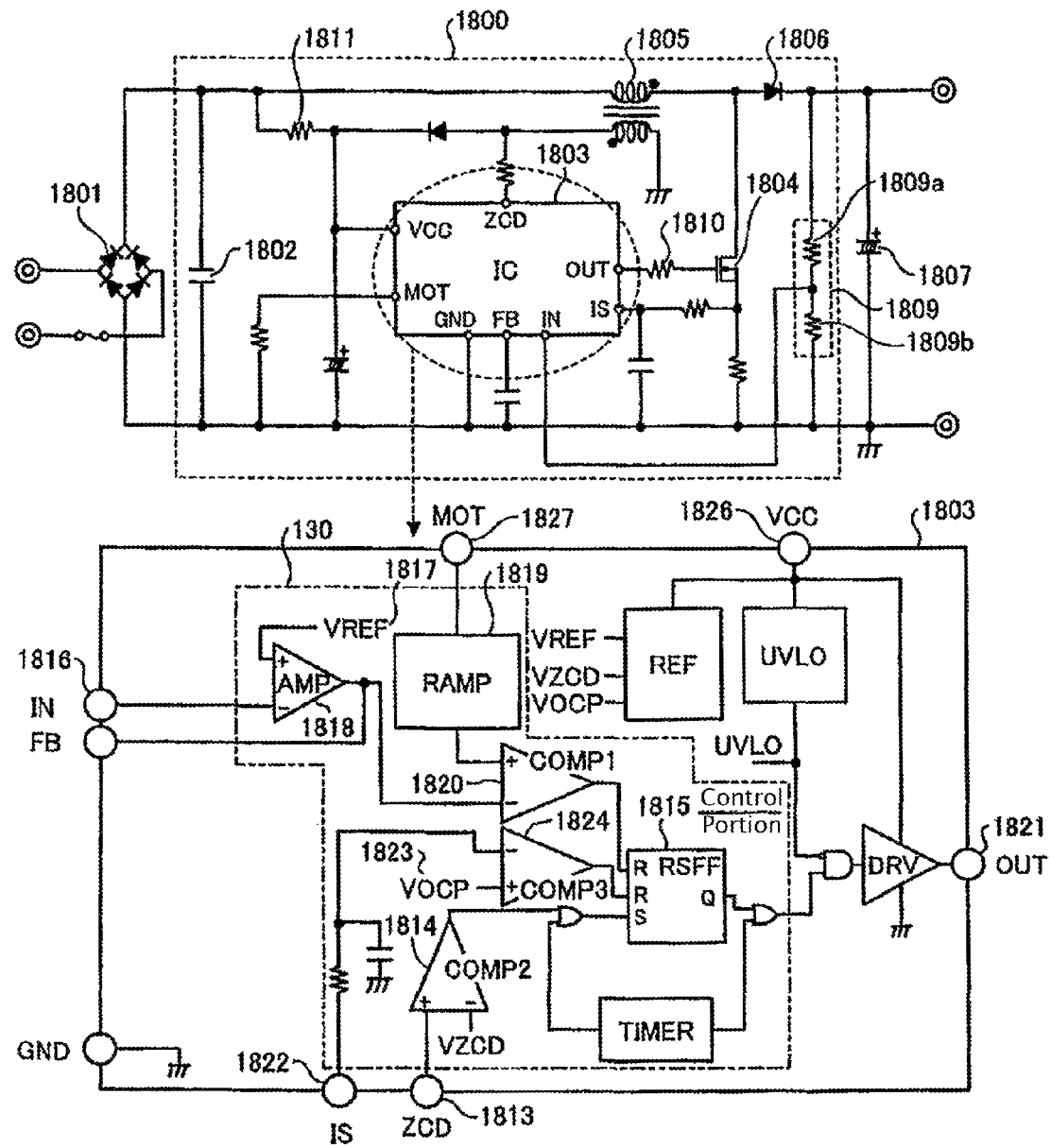
FIG. 35 is a circuit diagram showing a switching power supply of the prior art.
Figure 36:
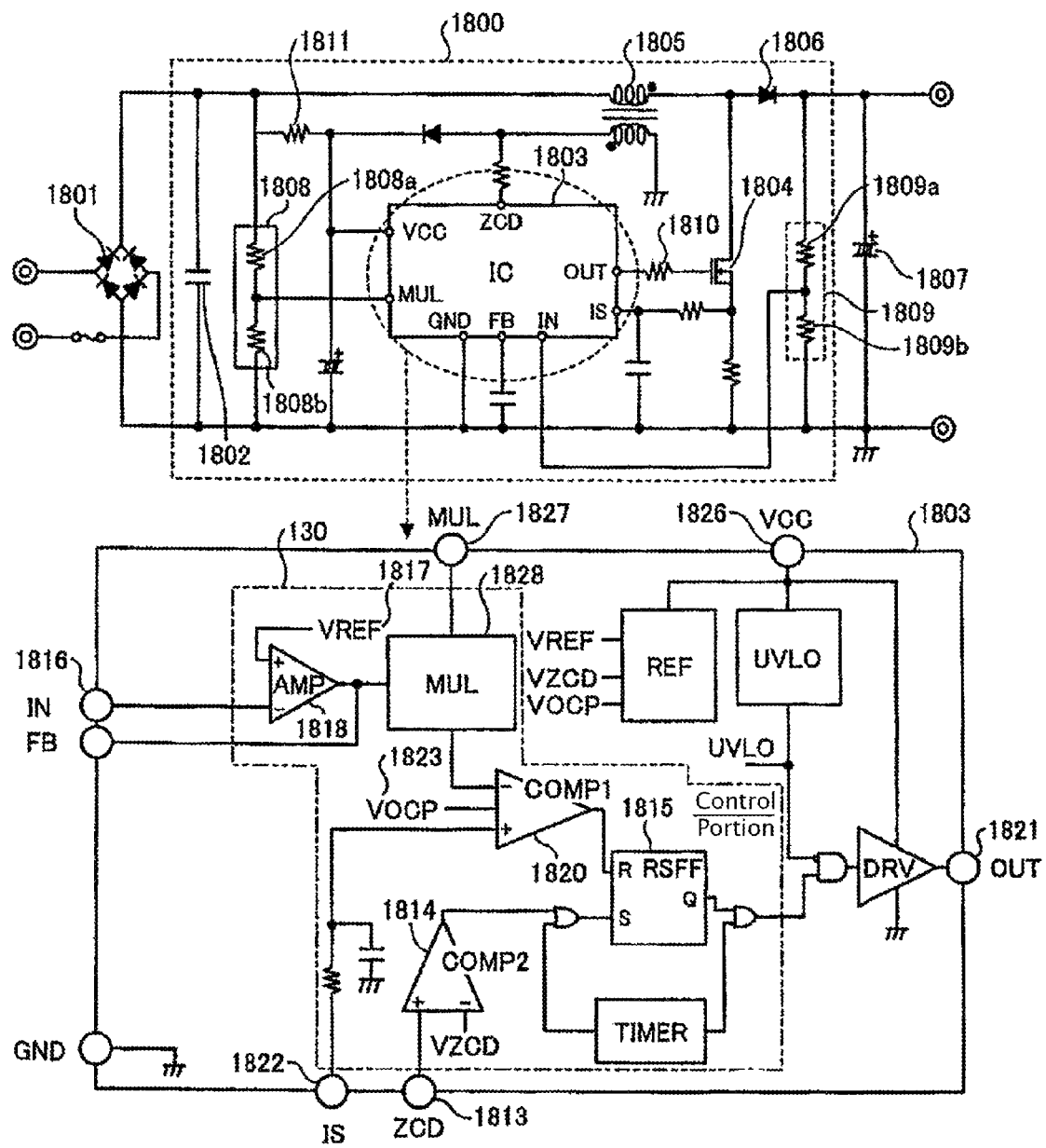
FIG. 36 is a circuit diagram showing a modified example of a switching power supply of the prior art.
Figure 37:
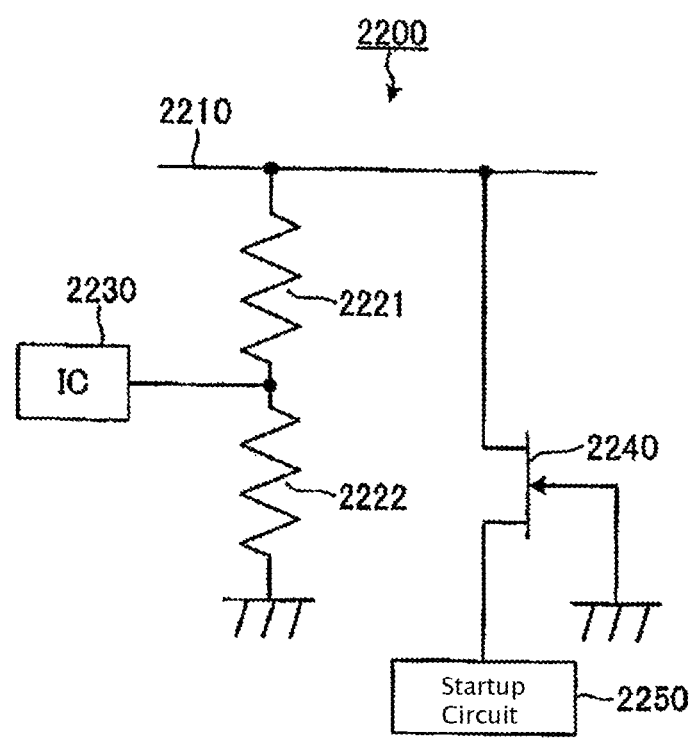
FIG. 37 is a circuit diagram showing a modified example of principle portions of the voltage divider circuit of the prior art shown in FIG. 34.

FIG. 20 is a circuit diagram showing the switching power supply of Embodiment 8 of the invention. The switching power supply of Embodiment 8 is a power factor improvement circuit 1800. In the power factor improvement circuit 1800, the same symbols are assigned for the configuration similar to the configuration of the power factor improvement circuit 1800 shown in FIG. 35, and explanations are omitted. Here, the first resistive voltage divider circuit 1809 connected to the output high-voltage line which is a high-voltage line is provided within the power factor improvement control IC 1803. Further, the first resistive voltage divider circuit 1809 comprises a switch 1809c. Further, the switching portion 150 is also provided within the power factor improvement control IC 1803.

The resistor 1809a and switch 1809c in the first resistive voltage divider circuit 1809 are configured integrally by means of the semiconductor device 200. The first metal wiring line 217 of the semiconductor device 200 of the first resistive voltage divider circuit 1809 is connected to the output terminal of the second rectifier 1806 via the IN terminal 1816. The third metal wiring line 229 of the semiconductor device 200 of the first resistive voltage divider circuit 1809 is connected to the AMP 1818 of the control portion 130.

A NAND circuit 1825 of the switching portion 150 (see FIG. 1) is connected to the terminal 227a (see FIG. 2) of the gate electrode 227 of the semiconductor device 200 in the first resistive voltage divider circuit 1809. The switching portion 150 applies (on) a voltage equal to or greater than a threshold value voltage to the terminal 227a of the gate electrode 227 during driving of the power factor improvement control IC 1803, and does not apply (off) a voltage equal to or greater than the threshold value voltage to the terminal 227a of the gate electrode 227 during standby of the power factor improvement control IC 1803.

Here, the specific operation of the control portion 130 is explained. When the voltage of the ZCD terminal 1813 falls, a set signal is input to RSFF 1815 from COMP 1814, and the switching transistor 1804 is turned on. COMP 1820 compares the signal resulting from comparison by AMP 1818 of the voltage-divided voltage of the IN terminal 1816 and VREF 1817 with the triangle wave signal generated by RAMP 1819, and if the output signal of AMP 1818 is below the signal of RAMP 1819, a reset signal is input from COMP 1820 to RSFF 1815, a low signal is output from OUT 1821, and the switching transistor 1804 is turned off. If the voltage of the IS terminal 1822 is above VOCP 1823, a reset signal is input from COMP 1824 to RSFF 1815, a low signal is output from OUT 1821, and the switching transistor 1804 is turned off.

Next, the specific operation of the switching portion 150 is explained. When VCC 1826 falls to be equal to or less than a fixed voltage, or when the ZCD terminal 1813 falls to be equal to or less than a fixed voltage, and a fixed time has elapsed, the power factor improvement control IC 1803 enters standby mode, the 500 V switch 1809c is turned OFF, the path of current flowing from the output voltage line (IN terminal 1816) which is the high-voltage line to ground is cut off, and standby power is reduced. Conversely, when VCC 1826 rises to be equal to or above a fixed voltage, or when the ZCD terminal 1813 rises to be equal to or greater than a fixed voltage, the power factor improvement control IC 1803 enters operation mode, and the switch 1809c is turned ON.

Figure 21:
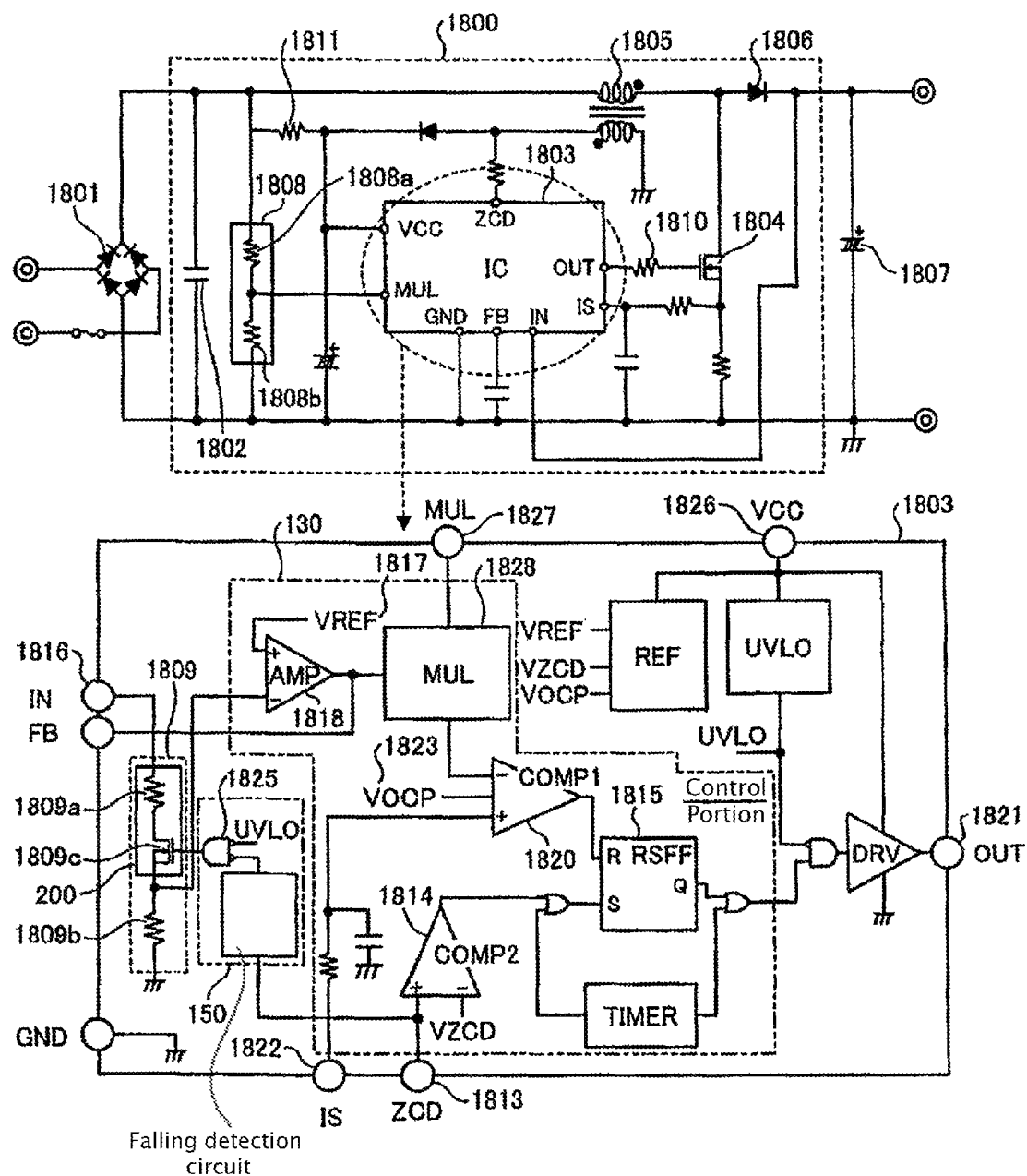
FIG. 21 is a circuit diagram showing Modified Example 1 of the switching power supply of Embodiment 8 of the invention.

FIG. 21 is a circuit diagram showing Modified Example 1 of the switching power supply of Embodiment 8 of the invention. In the power factor improvement circuit 1800 shown in FIG. 21, the same symbols are assigned for the configuration similar to the configuration of the power factor improvement circuit 1800 shown in FIG. 20, and explanations are omitted. Here, in addition to the first resistive voltage divider circuit 1809, a second resistive voltage divider circuit 1808 is provided outside the power factor improvement control IC 1803.

Specifically, the MUL terminal 1827 of the power factor improvement control IC 1803 is connected to the intermediate node of the second resistive voltage divider circuit 1808 comprising the resistor 1808a and the resistor 1808b. This is in order to use the second resistive voltage divider circuit 1808 to perform resistive voltage division of the voltage obtained by rectifying the alternating-current voltage of the power supply capacitor 1802, lowering the high voltage to a low voltage which can be input to the power factor improvement control IC 1803, and to input the voltage to the MUL terminal 1827.

Here, the specific operation of the control portion 130 is explained. When the voltage of the ZCD terminal 1813 falls, a set signal is input from COMP 1814 to RSFF 1815, and the switching transistor 1804 is turned on. The signal resulting from comparison by AMP 1818 of the voltage-divided voltage of the IN terminal 1816 and VREF 1817 is multiplied by the resistive voltage-divided voltage of the MUL terminal 1827 by MUL 1828. This signal and the voltage VOCP 1823 of the IS terminal 1822 are compared by COMP 1820, and when the voltage of the IS terminal 1822 becomes high, a reset signal is input from COMP 1820 to RSFF 1815, a low signal is output from OUT 1821, and the switching transistor 1804 is turned off.

Next, the specific operation of the switching portion 150 is explained. When VCC 1826 falls to be equal to or less than a fixed voltage, or when the ZCD terminal 1813 falls to be equal to or less than a fixed voltage, and a fixed time has elapsed, the power factor improvement control IC 1803 enters standby mode, the 500 V switch 1809c is turned OFF, the path of current flowing from the output voltage line (IN terminal 1816) to ground via the first resistive voltage divider circuit 1809 is cut off, and standby power is reduced. Conversely, when VCC 1826 rises to be equal to or above a fixed voltage, or when the ZCD terminal 1813 rises to be equal to or greater than a fixed voltage, the power factor improvement control IC 1803 enters operation mode, and the switch 1809c is turned ON.

Figure 22:
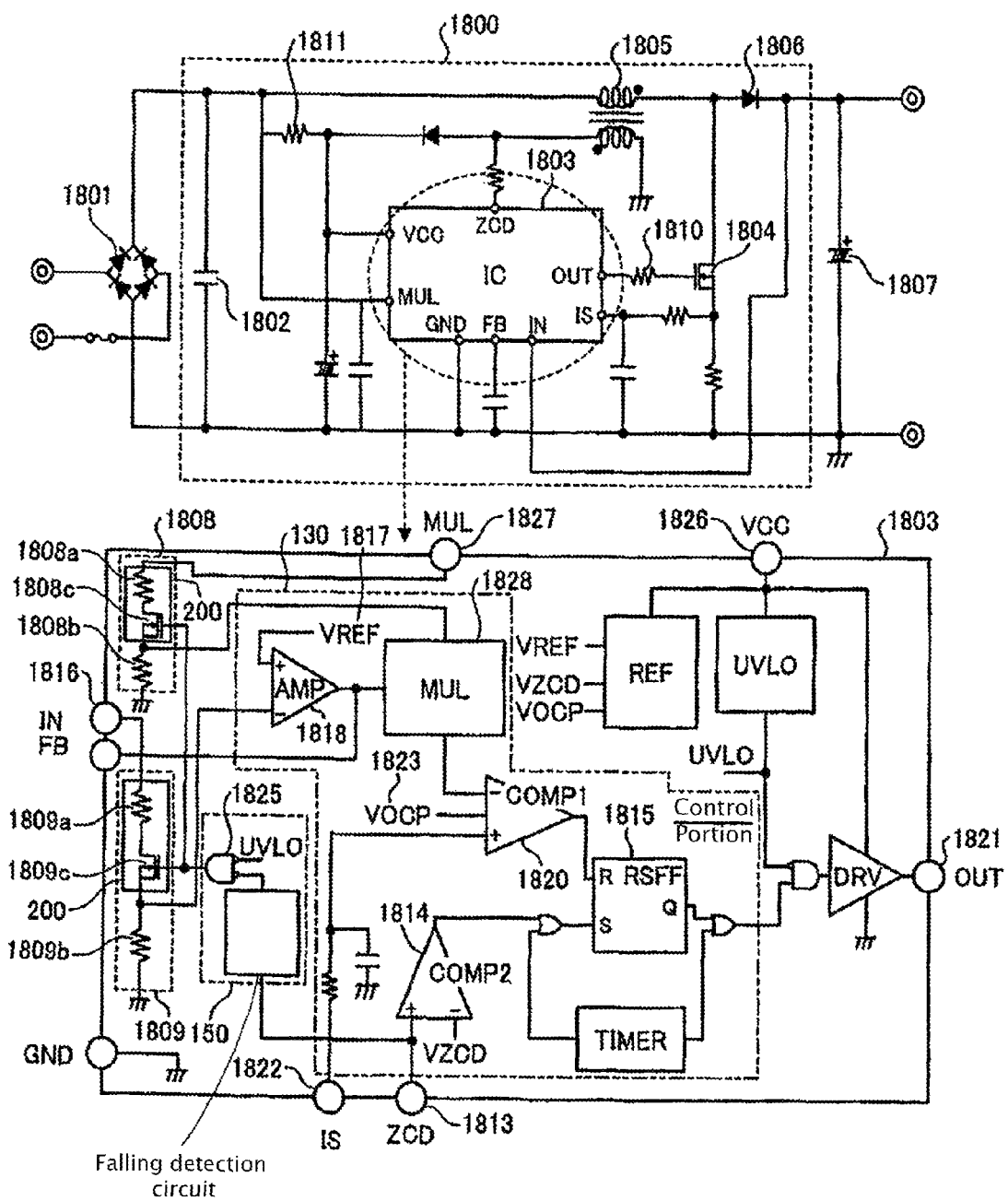
FIG. 22 is a circuit diagram showing Modified Example 2 of the switching power supply of Embodiment 8 of the invention.

FIG. 22 is a circuit diagram showing Modified Example 2 of the switching power supply of Embodiment 8 of the invention. In the power factor improvement circuit 1800 shown in FIG. 22, the same symbols are assigned for the configuration similar to the configuration of the power factor improvement circuit 1800 shown in FIG. 21, and explanations are omitted. Here, a second resistive voltage divider circuit 1808 is provided within the power factor improvement control IC 1803.

Specifically, the MUL 1828 of the power factor improvement control IC 1803 is connected to the intermediate node of the second resistive voltage divider circuit 1808 comprising the semiconductor device 200 as a resistance and the resistor 1808b. This is in order to use the second resistive voltage divider circuit 1808 to perform resistive voltage division of the line voltage of the high-voltage line (input high-voltage line) obtained by rectifying the alternating-current voltage using the first rectifier 1801 and power supply capacitor 1802, lowering the high voltage to a low voltage which can be input to MUL 1828 of the power factor improvement control IC 1803, and to input the voltage to MUL 1828.

The first metal wiring line 217 of the semiconductor device 200 in the second resistive voltage divider circuit 1808 is connected to the output terminal of the first rectifier 1801 via the MUL terminal 1827. The third metal wiring line 229 of the semiconductor device 200 in the second resistive voltage divider circuit 1808 is connected to MUL 1828 of the power factor improvement control IC 1803.

Here, a case was explained in which a semiconductor device 200 was provided in both the second resistive voltage divider circuit 1808 and in the first resistive voltage divider circuit 1809, but these semiconductor devices 200 may be integrally configured using the semiconductor device 200 shown in FIG. 14. By this means, the size of the power factor improvement circuit 1800 can be reduced.

Here, the specific operation of the control portion 130 is explained. When the voltage of the ZCD terminal 1813 falls, a set signal is input from COMP 1814 to RSFF 1815, and the switching transistor 1804 is turned on. The signal resulting from comparison by AMP 1818 of the voltage-divided voltage of the IN terminal 1816 and VREF 1817 is multiplied by the resistive voltage-divided voltage of the MUL terminal 1827 by MUL 1828. This signal and the voltage VOCP 1823 of the IS terminal 1822 are compared by COMP 1820, and when the voltage of the IS terminal 1822 becomes high, a reset signal is input from COMP 1820 to RSFF 1815, a low signal is output from OUT 1821, and the switching transistor 1804 is turned off.

Next, the specific operation of the switching portion 150 is explained. When VCC 1826 falls to be equal to or less than a fixed voltage, or when the ZCD terminal 1813 falls to be equal to or less than a fixed voltage and a fixed time has elapsed, the power factor improvement control IC 1803 enters standby mode, the 500 V switches 1808c and 1809c are turned OFF, the path of current flowing from the input voltage line (MUL terminal 1827) to ground via the second resistive voltage divider circuit 1808 and the path of current flowing from the output voltage line (IN terminal 1816) to ground via the first resistive voltage divider circuit 1809 are cut off, and standby power is reduced. Conversely, when VCC 1826 rises to be equal to or above a fixed voltage, or when the ZCD terminal 1813 rises to be equal to or greater than a fixed voltage, the power factor improvement control IC 1803 enters operation mode, and the switch 1809c is turned ON.

Embodiment 9

Figure 23:
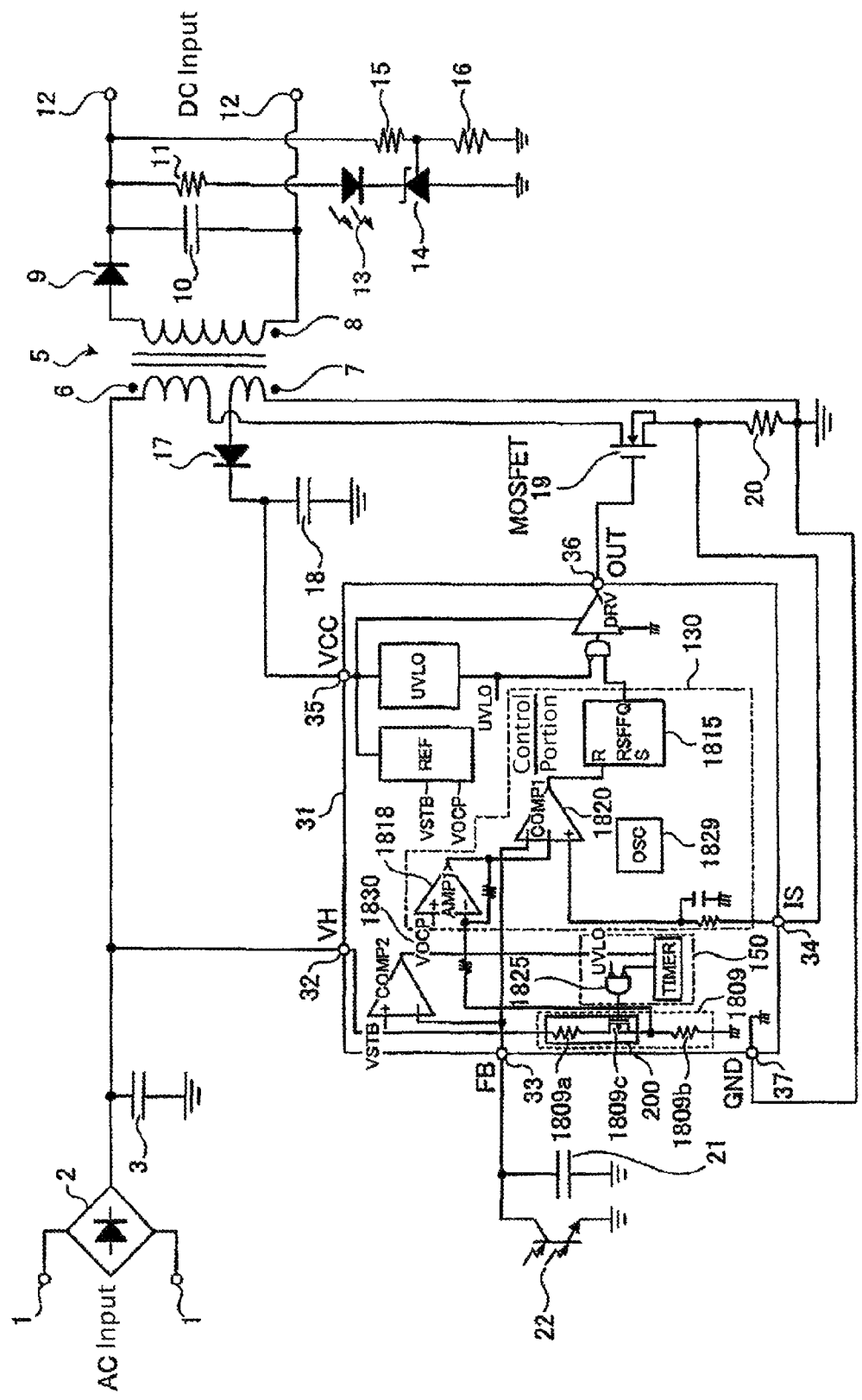
FIG. 23 is a circuit diagram showing the configuration of the switching power supply device of Embodiment 9 of the invention.

FIG. 23 is a circuit diagram showing the configuration of the switching power supply device of Embodiment 9 of the invention. A semiconductor device 200 of this invention can also be applied to a switching power supply device such as that shown in FIG. 23. In the switching power supply device, the control IC 31 incorporates a resistor (here called a brownout resistor), not shown, to detect a fall in the AC input voltage.

The control IC 31 has a VH terminal at approximately 500 V for example (high-voltage input terminal) 32; a feedback input terminal (hereafter called the "FB terminal") 33; a current sensing input terminal (hereafter called the "IS terminal") 34; power supply voltage terminal (hereafter called the "VCC terminal") 35 of the control IC 31; gate driving terminal (hereafter called the "OUT terminal") 36 of the MOSFET 19; and ground terminal (hereafter called the "GND terminal") 37. The VH terminal 32 is a terminal which supplies current to the VCC terminal 35 during power supply startup. Here, a voltage obtained by rectifying and smoothing the AC input voltage is applied to the VH terminal 32. The GND terminal 37 is grounded.

AC input is supplied to the rectifier 2 via the AC input terminal 1. The rectifier 2 is connected to the AC input terminal 1, and performs full-wave rectification of the AC input. The power supply capacitor 3 is connected in parallel to the output terminal of the rectifier 2, and is charged by the voltage obtained by rectifying the alternating-current voltage, output from the rectifier 2. The charged power supply capacitor 3 becomes a power supply to supply a voltage to the primary coil 6 of a transformer 5. The power supply capacitor 3 is connected to the VH terminal 32 of the control IC 31.

The primary coil 6 is connected between the power supply capacitor 3 and the drain terminal of the MOSFET 19, which functions as a switching element. The source terminal of the MOSFET 19 is connected to the IS terminal 34 of the control IC 31 and to one end of a resistor 20. The other end of the resistor 20 is grounded. By means of this resistor 20, the current flowing in the MOSFET 19 is converted into a voltage, and this voltage is applied to the IS terminal 34. The gate terminal of the MOSFET 19 is connected to the OUT terminal 36 of the control IC 31.

One end of an auxiliary coil 7 of the transformer 5 is connected in parallel with the anode terminal of the rectifying diode 17. The other end of the auxiliary coil 7 is grounded. Current induced by switching operation of the MOSFET 19 flows in the auxiliary coil 7. The rectifying diode 17 rectifies the current flowing in the auxiliary coil 7, and charges the smoothing capacitor 18 connected to the cathode terminal thereof. The smoothing capacitor 18 is connected to the VCC terminal 35 of the control IC 31, and is a direct-current power supply to cause continuation of switching operation of the MOSFET 19.

Through switching operation of the MOSFET 19, a voltage based on the voltage of the power supply capacitor 3 is induced across the secondary coil 8 of the transformer 5. One end of the secondary coil 8 is connected to the anode terminal of the rectifying diode 9. The cathode terminal of the rectifying diode 9 and the other end of the secondary coil 8 are connected to the DC output terminal 12. Further, a smoothing capacitor 10 is connected between the cathode terminal of the rectifying diode 9 and the other end of the secondary coil 8. The rectifying diode 9 rectifies the current flowing in the secondary coil 8, and charges the smoothing capacitor 10. The charged smoothing capacitor 10 supplies a direct-current output (DC output), controlled so as to assume a desired direct-current voltage value, to a load, not shown, connected to the DC output terminal 12.

Further, a series resistance circuit comprising two resistors 15, 16 and one end of a resistor 11 are connected to a connection node of the anode terminal of the rectifying diode 9 and the DC output terminal 12. The other end of the resistor 11 is connected to the anode terminal of a photodiode 13 which configures a photocoupler. The cathode terminal of the photodiode 13 is connected to the cathode terminal of a shunt regulator 14. The anode terminal of the shunt regulator 14 is grounded. These resistors 11, 15, 16, the photodiode 13, and the shunt regulator 14, form a voltage detection/feedback circuit which detects the direct-current output voltage across the smoothing capacitor 10, and adjusts this direct-current output voltage.

An optical signal is output from the photodiode 13, so as to adjust the direct-current output voltage across the smoothing capacitor 10 to a prescribed direct-current voltage value based on a setting value of the shunt regulator 14. This optical signal is received by a phototransistor 22 which together with the photodiode 13 configures a photocoupler, and becomes a feedback signal for the control IC 31. The phototransistor 22 is connected to the FB terminal 33 of the control IC 31, and the feedback signal is input to this FB terminal 33. The phototransistor 22 is connected to a capacitor 21. This capacitor 21 is a noise filter for the feedback signal.

Within the control IC 31, a first resistive voltage divider circuit 1809 is provided between the VH terminal 32 and AMP 1818. The first resistive voltage divider circuit 1809 comprises the semiconductor device 200 as a resistance and a resistor 1809b. This is in order to use the first resistive voltage divider circuit 1809 to perform resistive voltage division of the voltage of the power supply capacitor 3, comprising a voltage obtained by rectifying an alternating-current voltage or a direct-current voltage, lowering the high voltage to a low voltage which can be input to AMP 1818, and to input the voltage to AMP 1818.

The first metal wiring line 217 of the semiconductor device 200 in the first resistive voltage divider circuit 1809 is connected to the output terminal of the rectifier 2. The third metal wiring line 229 of the semiconductor device 200 in the first resistive voltage divider circuit 1809 is connected to AMP 1818.

A switching portion 150 (see FIG. 1) is connected to the terminal 227a (see FIG. 2) of the gate electrode 227 of the semiconductor device 200 in the first resistive voltage divider circuit 1809. The switching portion 150 applies a voltage (on) at or above a threshold value voltage to the terminal 227a of the gate electrode 227 during driving of the control IC 31, and does not apply a voltage (off) at or above a threshold value voltage to the terminal 227a of the gate electrode 227 during standby of the control IC 31.

Here, the specific operation of the control portion 130 is explained. When a set signal from OSC 1829 is input to RSFF 1815, a high signal is output from the OUT terminal 36, and the MOSFET 19 is turned on. COMP 1820 compares the voltage of the IS terminal 34 and the voltage of the FB terminal 33, and when the voltage of the IS terminal 34 is higher than the voltage of the FB terminal 33, a reset signal from COMP 1820 is input to RSFF 1815, a low signal is output from the OUT terminal 36, and the MOSFET 19 is turned off.

Further, the resistively voltage-divided voltage of the VH terminal 32 is input to AMP 1818, VOCP 1830 is subtracted (see for example Japanese Patent Application Laid-open No. 2005-94835), and when VOCP 1830 after subtraction is higher than the voltage of the IS terminal 34 also, a reset signal from COMP 1820 is input to RSFF 1815, a low signal is output from the OUT terminal 36, and the MOSFET 19 is turned off.

Next, the specific operation of the switching portion 150 is explained. When the VCC terminal 35 falls to be equal to or less than a fixed voltage, or when the FB terminal 33 falls to be equal to or less than a fixed voltage, and a fixed time has elapsed, the control IC 31 enters standby mode, the switch 1809c is turned off, and standby power is reduced. Conversely, when the VCC terminal 35 rises to be equal to or above a fixed voltage, or the FB terminal 33 rises to be equal to or above a fixed voltage, the control IC 31 enters the operation mode, and the switch 1809c is turned ON.

Embodiment 10

Figure 24:
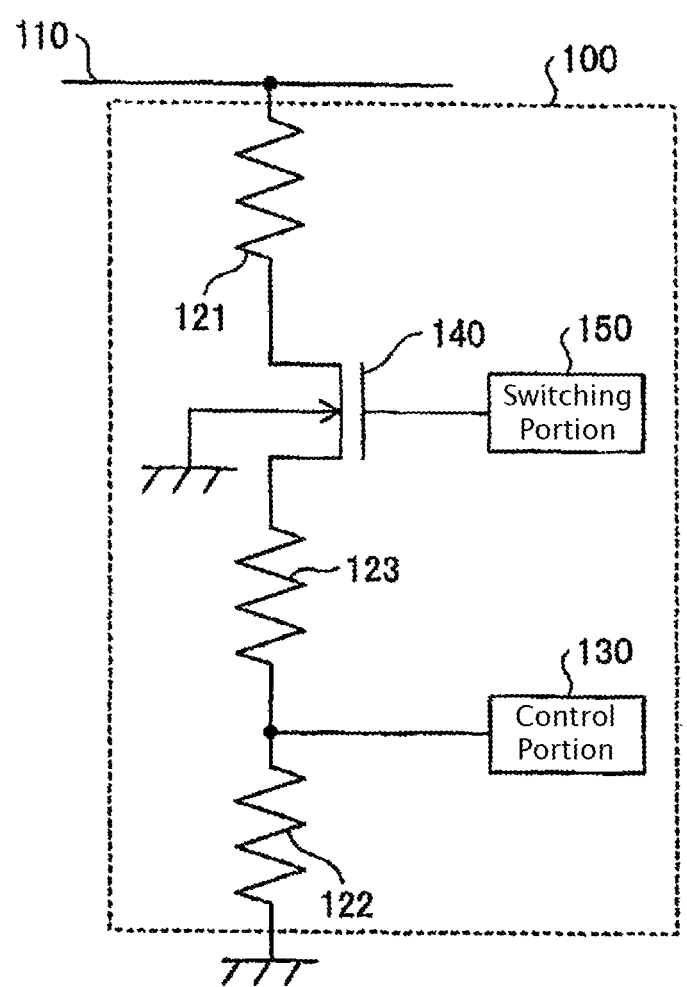
FIG. 24 is a cross-sectional view showing a modified example of the semiconductor device shown in FIG. 1.

FIG. 24 is a cross-sectional view showing a modified example of the semiconductor device shown in FIG. 1. In FIG. 24, the same symbols are assigned for the configuration shown in FIG. 1, and explanations are omitted. In the integrated circuit 100 shown in FIG. 1, a fifth resistor 123 may be provided. Further, the fifth resistor 123 and second resistor 122 may be trimming resistors.

One end of the fifth resistor 123 is connected to one end of the switch 140, and the other end of the fifth resistor 123 is connected to one end of the second resistor 122. The input terminal of the control portion 130 is connected to the intermediate node of the fifth resistor 123 and the second resistor 122. The first resistor 121, second resistor 122, and fifth resistor 123 form a resistive voltage divider element which performs resistive voltage division of a voltage obtained by rectifying an alternating-current voltage input from the high-voltage line 110, or a direct-current voltage.

Figure 25:
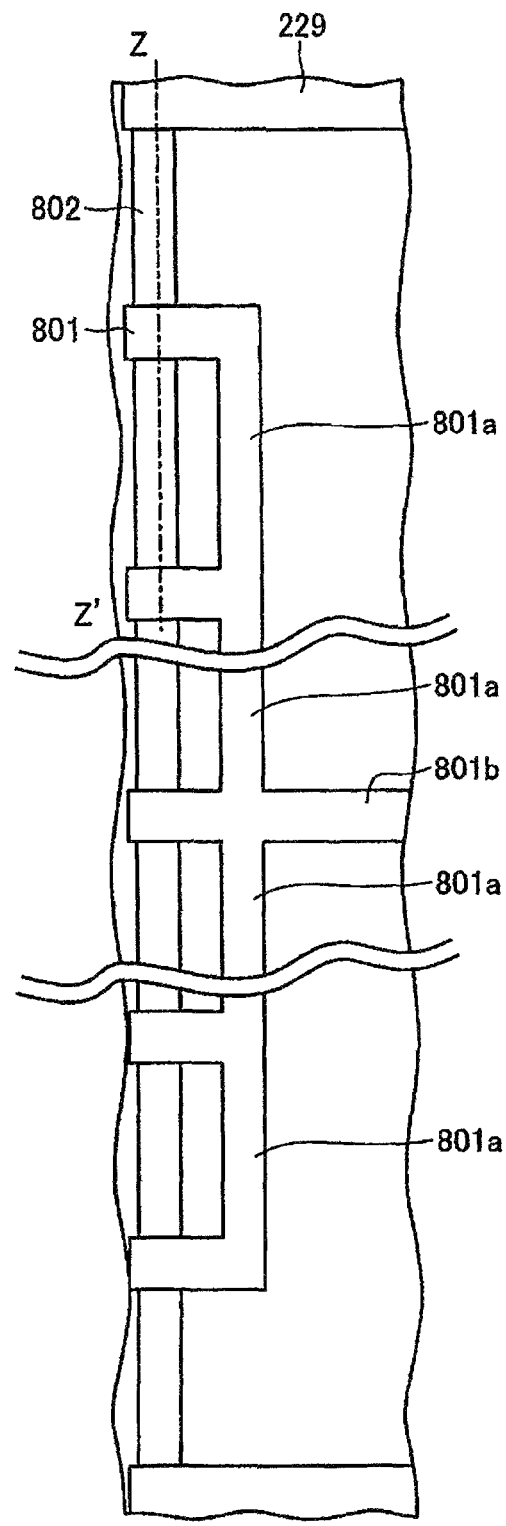
FIG. 25 is a plane view showing principle portions of a trimming resistor formed on a semiconductor substrate.
Figure 26:
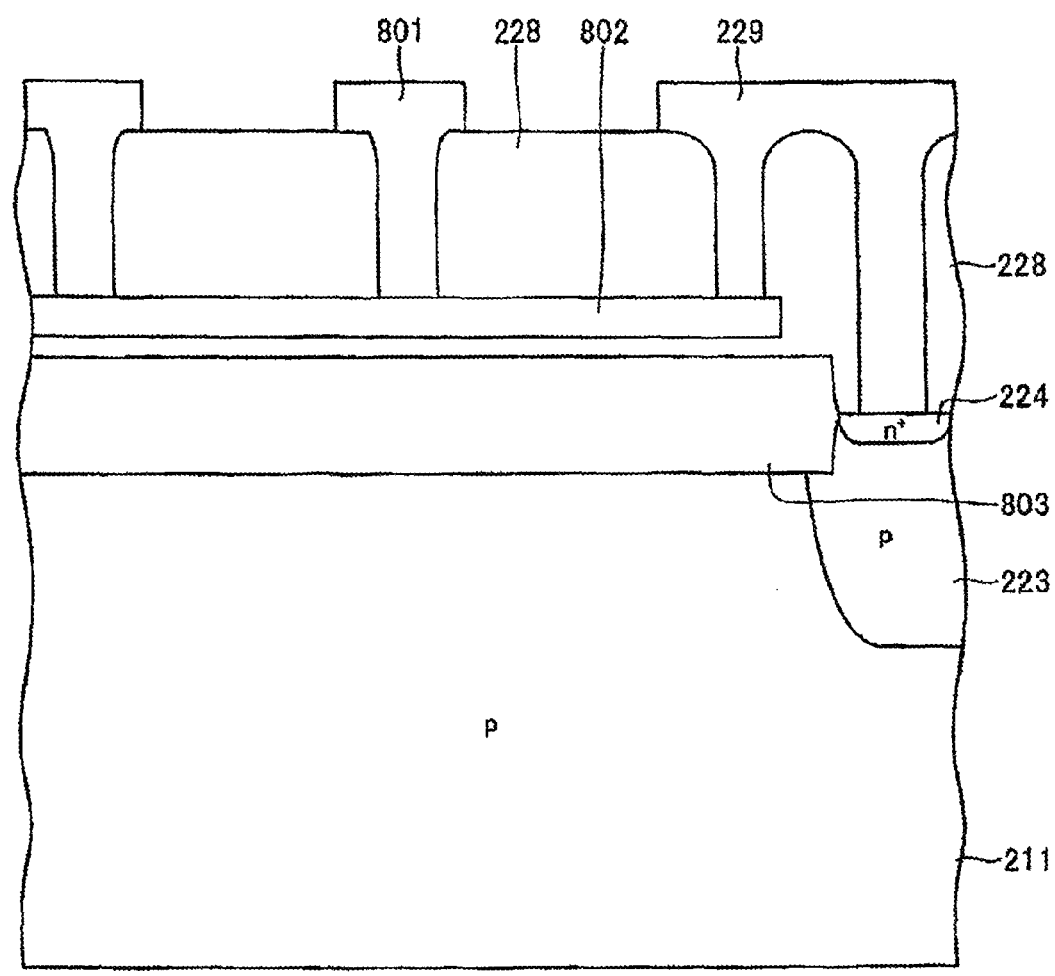
FIG. 26 is a cross-sectional view sectioning the trimming resistor shown in FIG. 25 along the section line Z-Z'.
Figure 27:
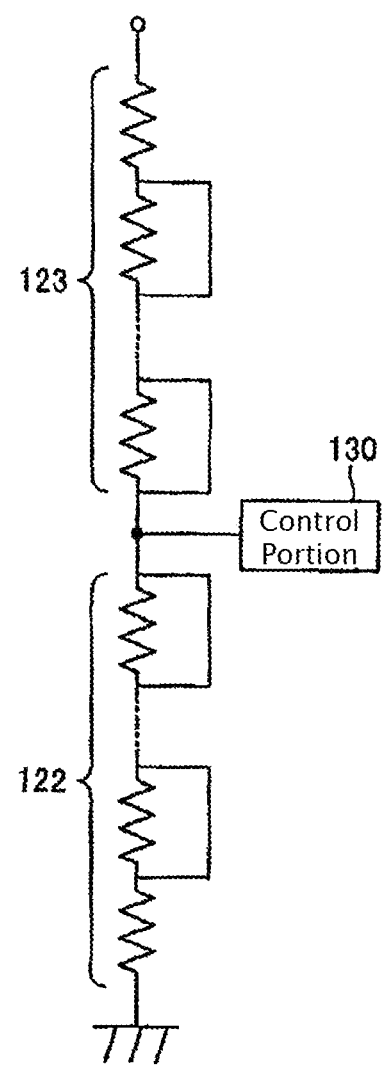
FIG. 27 is a circuit diagram showing the trimming resistor shown in FIG. 25.

FIG. 25 is a plane view showing principle portions of a trimming resistor formed on a semiconductor substrate. FIG. 26 is a cross-sectional view sectioning the trimming resistor shown in FIG. 25 along the section line Z-Z'. FIG. 27 is a circuit diagram showing the trimming resistor shown in FIG. 25. A third oxide film 803 is formed on the surface layer of the P-type semiconductor substrate 211 on the source side of the MOSFET 220. A trimming resistor 802 is buried in a region above the third oxide film 803 in the second insulating film 228, on the source side of the MOSFET 220. A metal wiring line for trimming 801 is formed above the trimming resistor 802, and is electrically connected to the trimming resistor 802 by a contact portion penetrating the second insulating film 228. Further, the metal wiring line for trimming 801 is electrically connected to the third metal wiring line 229 via the trimming resistor 802.

The metal wiring line for trimming 801 is formed in a plurality of places on the trimming resistor 802. One among a plurality of metal wiring lines for trimming 801 is a voltage-dividing wiring line 801b. Each metal wiring line for trimming 801 is electrically connected by a disconnection portion for trimming 801a (resistance adjustment portion) formed removed from the trimming resistor 802. By disconnecting a disconnection portion for trimming 801a, and separating a portion of the metal wiring line for trimming 801, adjustment to a desired resistance value is possible.

In this way, by means of the semiconductor device of Embodiment 10, advantageous results similar to those of the semiconductor device of Embodiment 1 can be obtained. Further, by forming the fifth resistor 123 as a trimming resistor, a portion of which can be separated, the resistance value of the fifth resistor 123 can be adjusted, and the overall resistance value and voltage division ratio of the resistive voltage divider element can be adjusted. By this means, because a voltage obtained by rectifying an alternating-current voltage or a direct-current voltage is input from the high-voltage line 110 to the adjusted resistive voltage divider element, the voltage-divided voltage can be adjusted with still better precision than in Embodiment 1.

Embodiment 11

Figure 28:
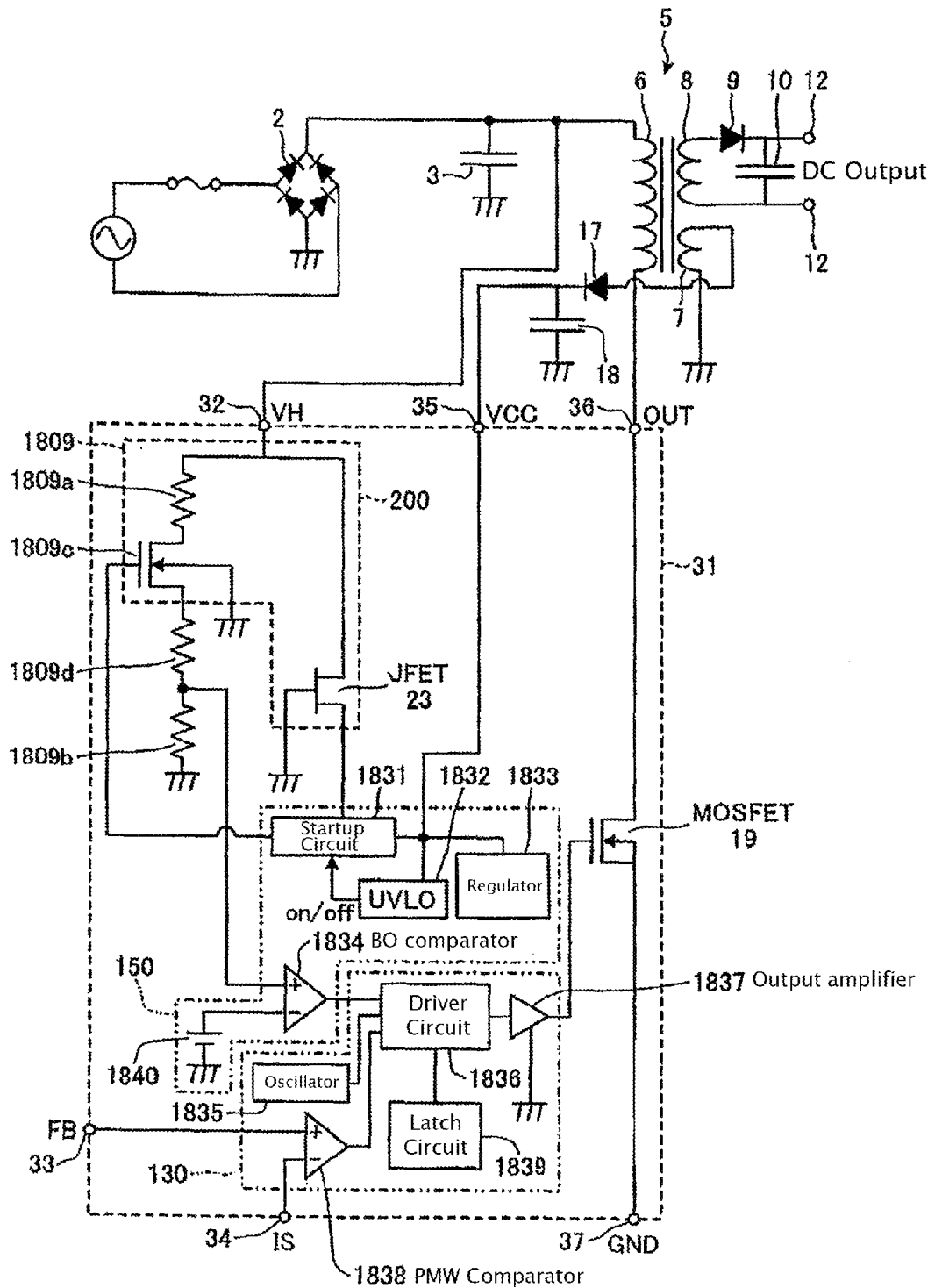
FIG. 28 is a circuit diagram showing a switching power supply device, comprising a startup element separate from the switching power supply device shown in FIG. 23.

FIG. 28 is a circuit diagram showing a switching power supply device, comprising a startup element separate from the switching power supply device shown in FIG. 23. In FIG. 28, the same symbols are assigned for the configuration shown in FIG. 23, and explanations are omitted. As the startup element, for example a normally-on type JFET 23 is provided.

In the control IC 31 are provided a first resistive voltage divider circuit 1809, MOSFET 19, JFET 23, control portion 130, and switching portion 150. The first resistive voltage divider circuit 1809 comprises the resistor 1809a within the semiconductor device 200 and the switch 1809c, resistor 1809b, and resistor 1809d. In the switching portion 150 are provided, for example, a startup circuit 1831, UVLO 1832, regulator 1833, brownout comparator (hereafter called a "BO comparator") 1834, and reference power supply 1840. In the control portion 130 are provided, for example, an oscillator 1835, driver circuit 1836, output amplifier 1837, pulse width modulation comparator (hereafter called a "PWM comparator") 1838, and latch circuit 1839. The JFET 23 and startup circuit 1831 supply a current to the VCC terminal 35 at the time of startup of the power supply.

The first resistive voltage divider circuit 1809 is configured similarly to FIG. 24. The third metal wiring line 229 of the semiconductor device 200 in the first resistive voltage divider circuit 1809 is connected to the BO comparator 1834 via the resistor 1809d. The drain terminal of the JFET 23 is connected to the VH terminal 32, in parallel with the first resistive voltage divider circuit 1809. The source terminal of the JFET 23 is connected to the startup circuit 1831. The gate terminal of the JFET 23 is grounded. The JFET 23 supplies a current to the VCC terminal 35 via the startup circuit 1831.

UVLO 1832 is connected to the VCC terminal 35 and the startup circuit 1831. UVLO 1832 halts supply of current from the startup circuit 1831 to the VCC terminal 35 when, due to current supplied from the startup circuit 1831, the voltage of the VCC terminal 35 rises to the voltage necessary for operation of the control IC 31. Thereafter the supply of current to the VCC terminal 35 is performed from the auxiliary coil 7. The regulator 1833 is connected to the VCC terminal 35, and based on the voltage of the VCC terminal 35 generates the reference voltage necessary for operation of each of the portions of the control IC 31. After the power supply has started up, the control IC 31 is driven by the reference voltage output from the regulator 1833.

An inverting input terminal and non-inverting input terminal of the PWM comparator 1838 are respectively connected to the IS terminal 34 and to the FB terminal 33. The output of the PWM comparator 1838 is inverted according to the magnitude relation of the voltage of the inverting input terminal and the voltage of the non-inverting input terminal. The output of the PWM comparator 1838 is input to the driver circuit 1836.

The driver circuit 1836 is connected to the oscillator 1835, and oscillation signals from the oscillator 1835 are input thereto. When a turn-on signal from the oscillator 1835 is input to the driver circuit 1836, and moreover the voltage of the non-inverting input terminal of the PWM comparator 1838 (that is, the voltage of the FB terminal 33) is higher than the voltage of the inverting input terminal (that is, the voltage of the IS terminal 34), the output signal of the driver circuit 1836 enters the high state. The output amplifier 1837 amplifies the high-state signal output from the driver circuit 1836, and drives the gate of the MOSFET 19. The drain terminal of the MOSFET 19 is connected to the OUT terminal 36, and the output of the MOSFET 19 is output to the OUT terminal 36.

On the other hand, if the voltage of the inverting input terminal of the PWM comparator 1838 is higher than the voltage of the non-inverting input terminal, the PWM comparator 1838 is inverted, and the output signal of the driver circuit 1836 enters the low state. The output amplifier 1837 amplifies the low-state signal output from the driver circuit 1836, which is supplied to the gate of the MOSFET 19 via the OUT terminal 36. Hence the MOSFET 19 enters the off state, and current in the MOSFET 19 no longer flows. In this way, by changing the threshold level of the PWM comparator 1838 according to the secondary-side output voltage, and by executing control to vary the on interval of the MOSFET 19, the secondary-side output voltage is stabilized.

Further, the inverting input terminal of the BO comparator 1834 is connected to the reference power supply 1840. The output of the BO comparator 1834 is inverted according to the magnitude relation of the voltage of the inverting input terminal and the voltage of the non-inverting input terminal. A high voltage is resistively voltage-divided by the first resistive voltage divider circuit 1809, and a low-voltage signal which can be input to the BO comparator 1834 is input to the BO comparator 1834. The output of the BO comparator 1834 is input to the driver circuit 1836.

In a state in which a high-state signal is being output from the driver circuit 1836, when the voltage of the non-inverting input terminal of the BO comparator 1834 is lower than the voltage of the inverting input terminal, the output signal of the driver circuit 1836 remains in the high state. When the voltage supplied from the AC input disappears, and the primary-side input voltage falls, the voltage of the non-inverting input terminal of the BO comparator 1834 becomes lower than the voltage of the inverting input terminal. Then, the output signal of the driver circuit 1836 is inverted to enter the low state, and switching operation of the MOSFET 19 is halted.

The latch circuit 1839 is connected to the driver circuit 1836. When a rise in the secondary-side output voltage, heat generation by the control IC 31, a drop in the secondary-side output voltage, or another anomalous state is detected, the latch circuit 1839 puts the output of the driver circuit 1836 to a forced low state for overvoltage protection, overheating protection, or overcurrent protection, and halts the supply of power to the secondary-side output. This state is held until the VCC power supply voltage falls and the control IC 31 is reset.

While no limitations in particular are imposed, elements constituting each of the circuits and similar of the control IC 31 are for example formed on the same semiconductor substrate.

Figure 29:
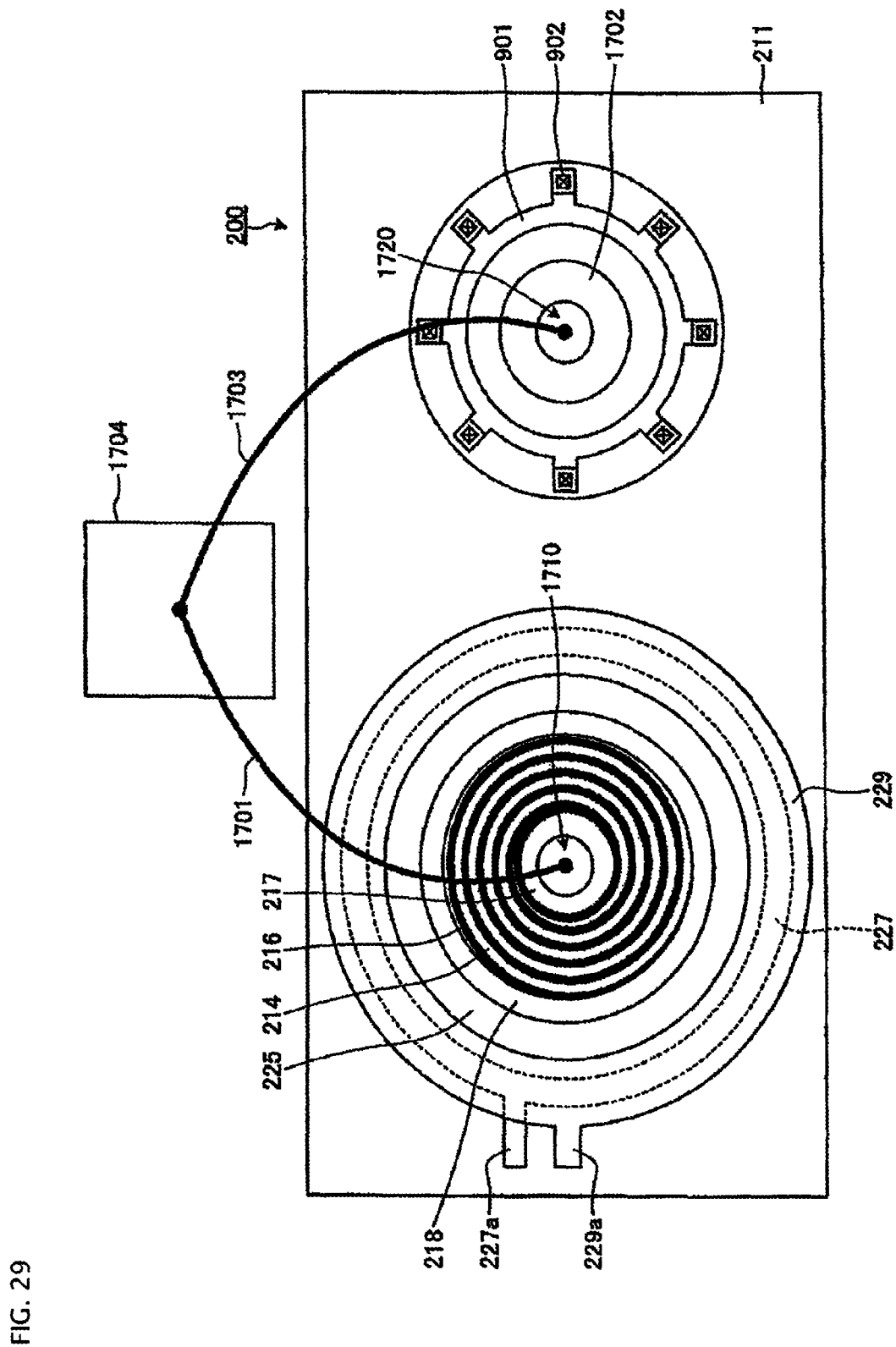
FIG. 29 is a plane view showing principle portions of the semiconductor device of Embodiment 11 of the invention.

FIG. 29 is a plane view showing principle portions of the semiconductor device of Embodiment 11 of the invention. In FIG. 29, the same symbols are assigned for the configuration similar to the configuration shown in FIG. 2 and FIG. 3, and explanations are omitted. The semiconductor device 200 comprises a high-voltage high-resistance integral type MOSFET made integral with a resistor 1809*a* (first resistor) and switch 1809*c*, and a JFET 23 (startup element). Although not shown, a switching portion 150, control portion 130, and resistor 1809*b* (second resistor) are also formed on the same semiconductor substrate. The resistor 1809*a* constituting this high-voltage high-resistance integral type MOSFET is used as a high-potential side resistor of a brownout resistor (input voltage detection).

The semiconductor device 200 is formed such that the integrally formed resistance portion and MOSFET and the JFET are each formed with planar shapes which are separate circular shapes, for example, at a third position 1710 and a fourth position 1720 which are different on the P-type semiconductor substrate 211. The resistance portion is equivalent to the resistor 1809*a* (high-voltage high-resistance element 216). The MOSFET is equivalent to the switch 1809*c* (MOSFET 220). The JFET is equivalent to the JFET 23.

The integrally formed resistance portion and MOSFET comprise a second wire 1701 in addition to the configurations shown in FIG. 2. The first metal wiring line 217 of the resistance portion is electrically connected to the terminal 1704, which is an external connection terminal, via the second wire 1701. The terminal 1704 is equivalent to the VH terminal 32.

The JFET 23 comprises an eighth metal wiring line 901 (fifth electrode), ninth metal wiring line 1702, and third wire 1703. The ninth metal wiring line 1702 of the JFET 23 is electrically connected to the terminal 1704 via the third wire 1703.

The eighth metal wiring line 901 is formed such that the planar shape thereof is for example a circular ring shape surrounding the ninth metal wiring line 1702. Further, the eighth metal wiring line 901 has a terminal, not shown, connected for example to the startup circuit (see FIG. 28). Further, the eighth metal wiring line 901 is connected to for example a source $N^+$ layer formed on the surface layer of the semiconductor substrate 211 via a source contact portion 902.

The ninth metal wiring line 1702 is formed in for example a circular shape centered on the fourth position 1720. The ninth metal wiring line 1702 is connected for example to a drain $N^+$ layer formed on the surface layer of the semiconductor substrate 211 via a contact portion.

In this way, by means of the semiconductor device 200 of Embodiment 11, advantageous results similar to those of the semiconductor device of Embodiment 1 can be obtained. Further, in a circuit using the JFET 23 as a startup element also, a first resistive voltage divider circuit 1809 can be provided, and advantageous results similar to those of the semiconductor device of Embodiment 9 can be obtained. Further, by forming the JFET 23 within the control IC 31, the area of for example a printed circuit board or similar on which the control IC 31 is mounted can be made small. Further, by forming the startup element on the same semiconductor substrate as the resistor 1809*a* and switch 1809*c*, functions can be added without increasing the number of connection terminals. Further, by making a portion of a high-voltage high-resistance integral-type MOSFET integral with the resistor 1809*a* and switch 1809*c* a high-potential side resistor of a brownout resistor, the current flowing in the resistive voltage divider circuit when the startup element is off can be cut off, and power consumption can be further reduced compared with Embodiment 1.

Embodiment 12

Figure 30:
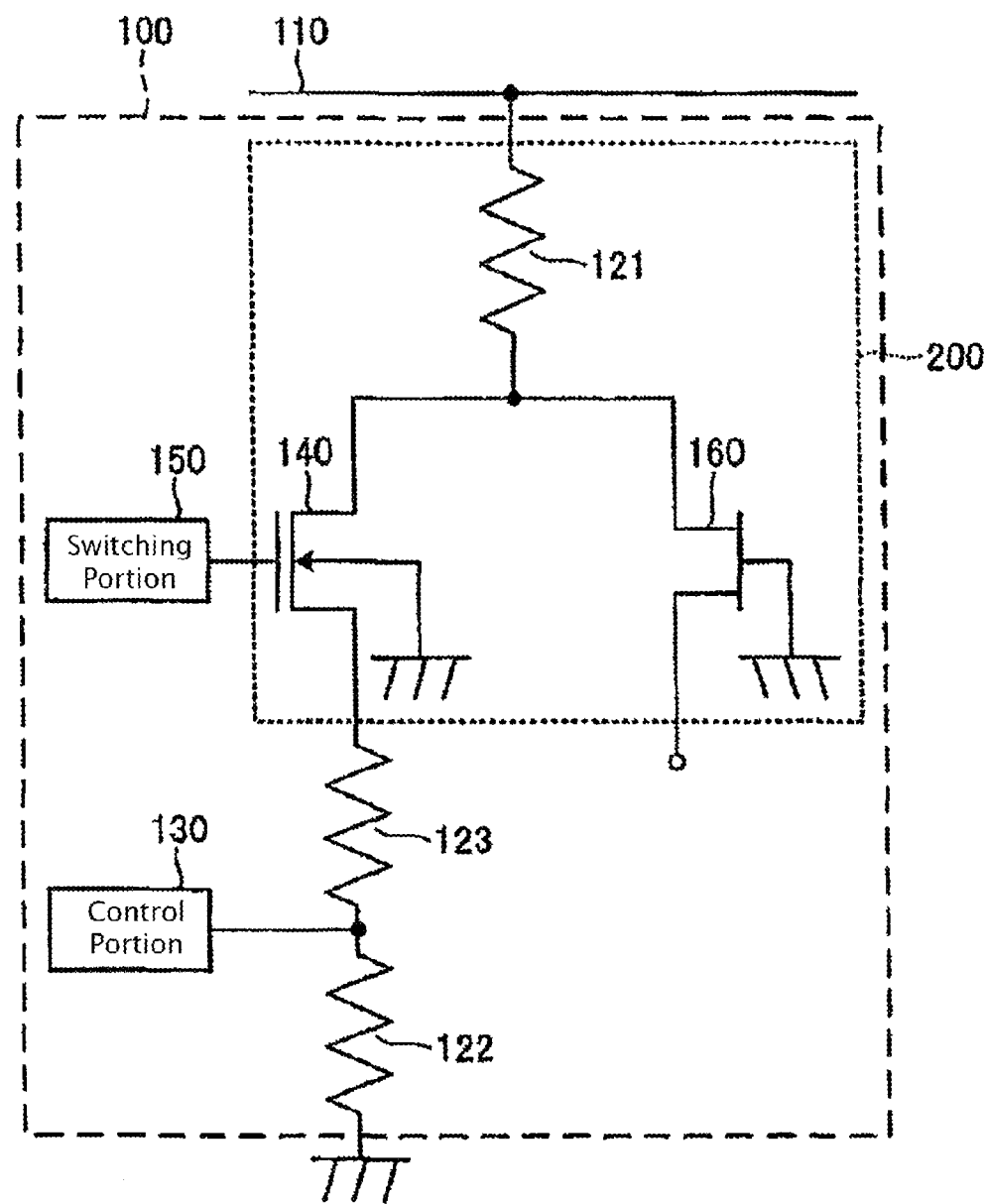
FIG. 30 is a circuit diagram showing a modified example of the semiconductor device shown in FIG. 1.

FIG. 30 is a circuit diagram showing a modified example of the semiconductor device shown in FIG. 1. In FIG. 30, the same symbols are assigned for the configuration shown in FIG. 1, and explanations are omitted. A startup element 160 is formed integrally with the semiconductor device 200 shown in FIG. 1. Further, in the integrated circuit 100 shown in FIG. 1, a fifth resistor 123 is formed. There are also cases in which this fifth resistor is not formed.

The fifth resistor 123 is connected similarly to FIG. 24. The startup element 160 is connected in series between the first resistor 121 and for example a connection terminal connecting the startup circuit. The startup element 160 supplies current to for example the VCC terminal via a connection terminal. The startup element 160 comprises for example a normally-on type JFET.

In the JFET constituting the startup element 160, the drain terminal is connected to the first resistor 121, and the source terminal comprises a connection terminal which for example connects the startup circuit. The gate terminal of the JFET is grounded. Further, a switch 140 constituting a MOSFET is connected in parallel. This JFET is configured as a semiconductor device 200 (see FIG. 31 to FIG. 33) configured integrally with the MOSFET and first resistor 121.

Figure 31:
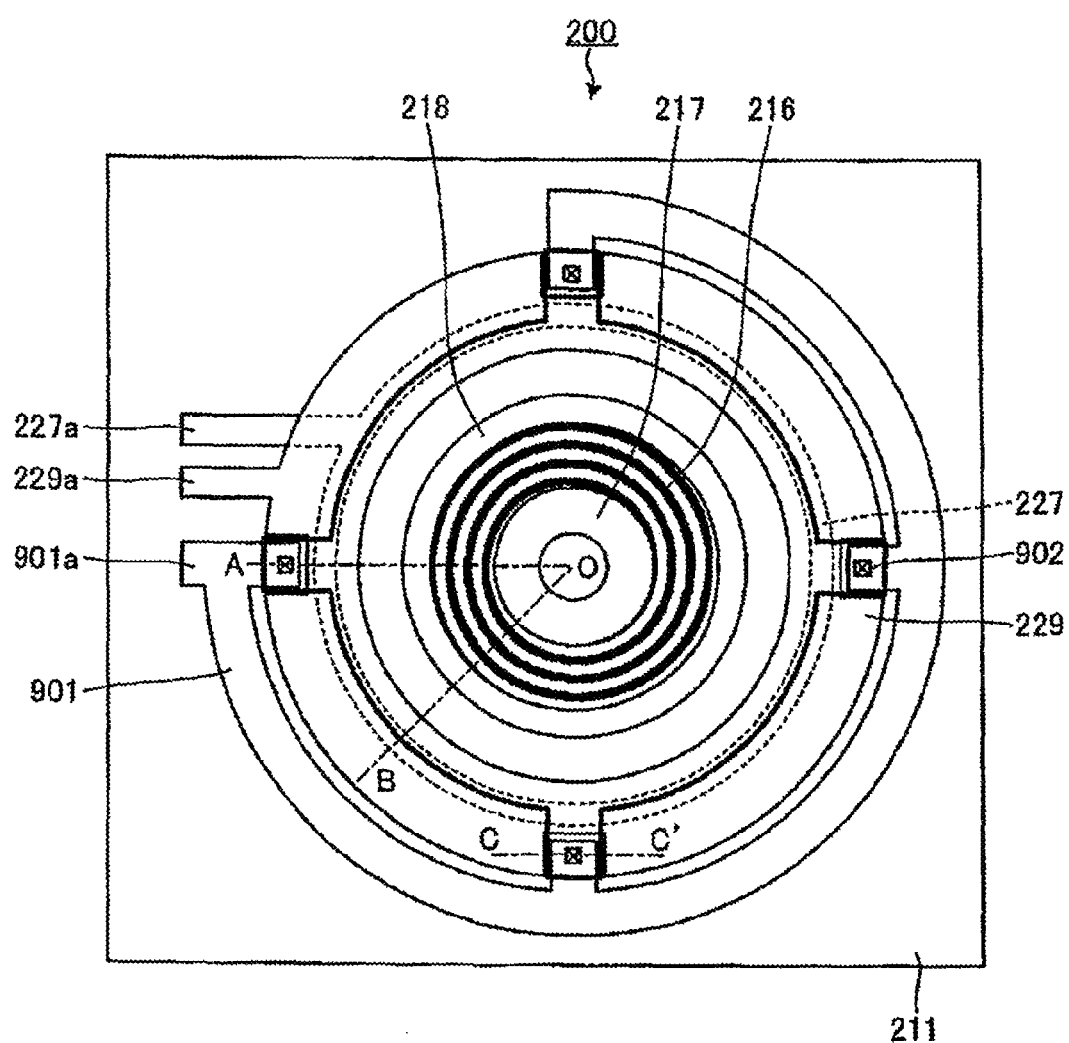
FIG. 31 is a plane view showing principle portions of the semiconductor device of Embodiment 12 of the invention.
Figure 32:
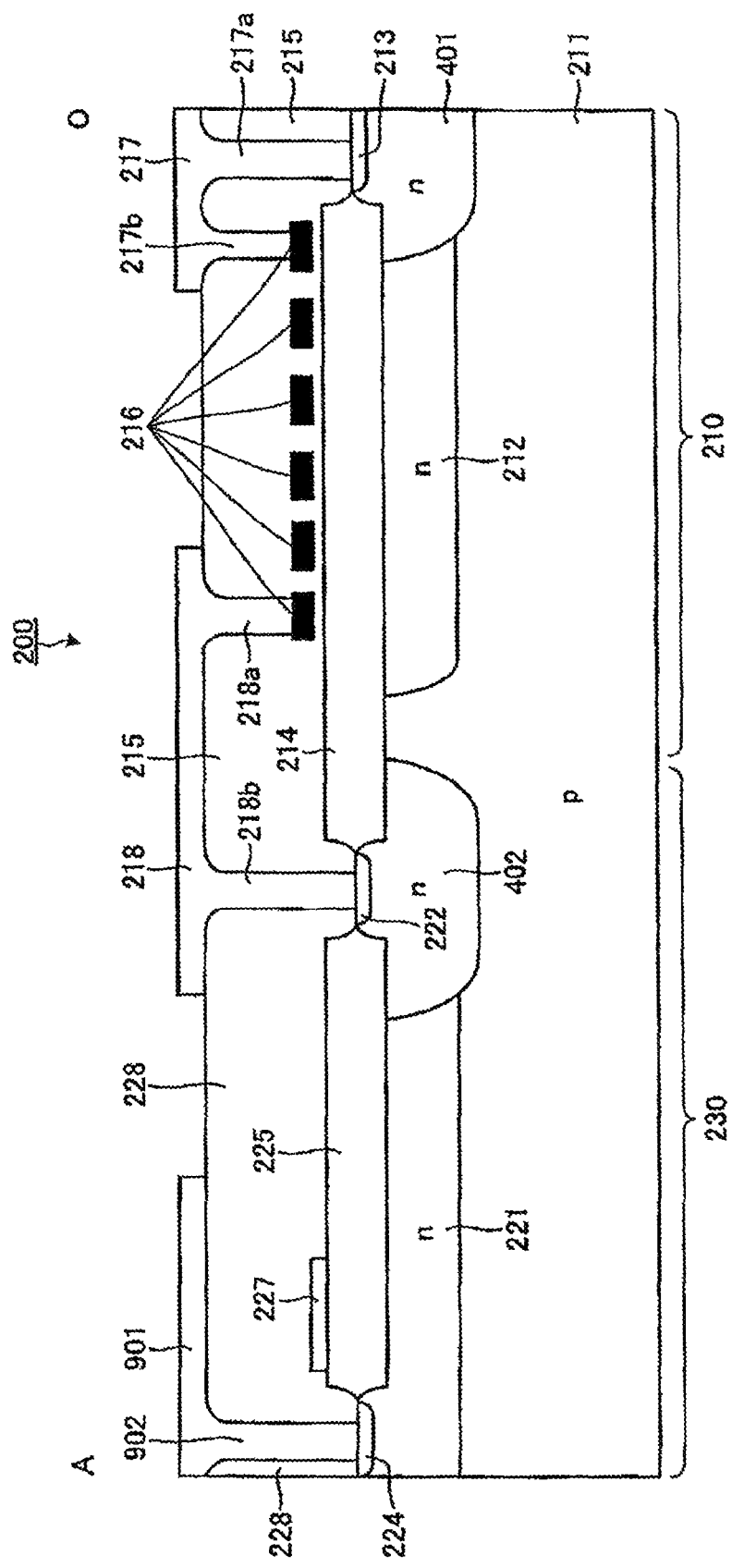
FIG. 32 is a cross-sectional view sectioning the semiconductor device shown in FIG. 31 along the section line A-O.
Figure 33:
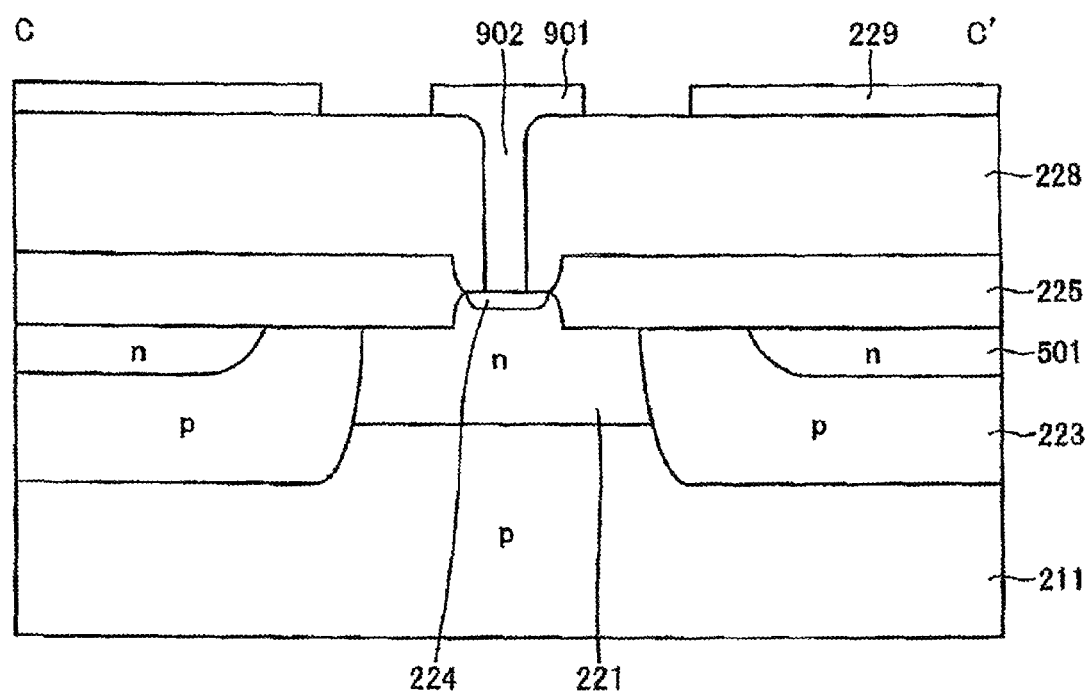
FIG. 33 is a cross-sectional view sectioning the semiconductor device shown in FIG. 31 along the section line C-C'.
Figure 34:
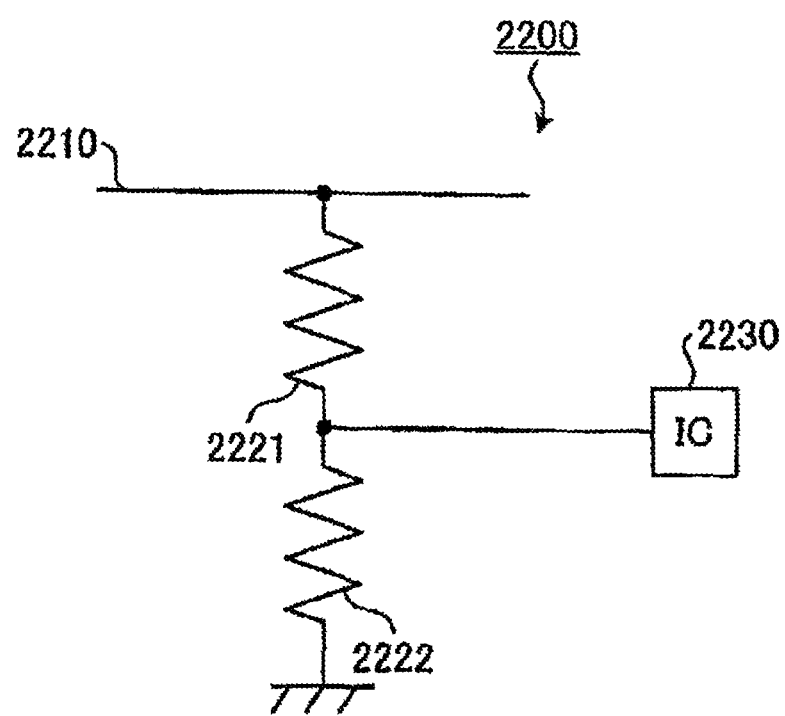
FIG. 34 is a circuit diagram showing principle portions of a voltage divider circuit of the prior art.

FIG. 31 is a plane view showing principle portions of the semiconductor device of Embodiment 12 of the invention. FIG. 32 is a cross-sectional view sectioning the semiconductor device shown in FIG. 31 along the section line A-O. FIG. 33 is a cross-sectional view sectioning the semiconductor device shown in FIG. 31 along the section line C-C'. The cross-sectional view of the semiconductor device shown in FIG. 31 sectioned along the section line B-O is similar to FIG. 5. In Embodiment 12, the same symbols are assigned for the configuration shown in FIG. 5, and explanations are omitted. In Embodiment 11, a semiconductor device 200 was explained with a configuration in which a startup element 160 was formed separately from the integrally formed first resistor 121 and switch 140; but the semiconductor device 200 may also be a high-voltage high-resistance integral type MOSFET in which the first resistor 121, switch 140, and startup element 160 (see FIG. 30) are formed integrally. A JFET is formed in a portion of this MOSFET. Although not shown, the switching portion 150, control portion 130, and second resistor 122 are also formed on the same semiconductor substrate.

The semiconductor device 200 comprises an integrally configured resistance portion 210, MOSFET 220 (see FIG. 5) and JFET 230. The resistance portion 210 is equivalent to the first resistor 121. The MOSFET 220 is equivalent to the switch 140. The JFET 230 is equivalent to the startup element 160. The portion of the semiconductor device 200 configured by the MOSFET 220 is configured similarly to FIG. 5. The third high-voltage application layer 501 is formed only in the MOSFET 220. The resistance portion 210 of the semiconductor device 200 in the section line A-O in which the JFET 230 is configured has a configuration similar to FIG. 5.

The JFET 230 comprises the P-type semiconductor substrate 211 common with the resistance portion 210, an N-type drain drift layer 221, second drain N$^+$ layer 222, second metal wiring line 218 common with the resistance portion 210, source N$^+$ layer 224, second oxide film 225, gate electrode 227, second insulating film 228, and eighth metal wiring line 901. Each of the portions of the JFET 230 is common to the MOSFET 220 (excepting the eighth metal wiring line 901).

The source N$^+$ layer 224 (fourth diffusion layer) is formed on a portion of the surface layer of the N-type drain drift layer 221. The second oxide film 225 is formed above a region of the N-type drain drift layer 221 in which the second drain N$^+$ layer 222 and source N$^+$ layer 224 are not formed. The gate electrode 227 (third electrode) is formed above the second oxide film 225.

The eighth metal wiring line 901 (fifth electrode) is formed above the second insulating film 228. Further, the eighth metal wiring line 901 has a terminal 901a connected for example to the startup circuit (see FIG. 30). The eighth metal wiring line 901 has a source contact portion 902 which penetrates the second insulating film 228. The source contact portion 902 is connected to the source N$^+$ layer 224.

In Embodiment 12, the high-voltage high-resistance element 216 is for example formed in a spiral shape, similarly to Embodiment 1. In the high-voltage high-resistance element 216, a resistor is formed which is necessary, when a high voltage is applied to the high-voltage high-resistance element 216, to lower the voltage to a voltage that can be detected in the control portion 130. For example, of an overall resistance value of 4 MΩ, 3.96 MΩ can be formed as the high-voltage high-resistance element 216, so that when a high voltage of 500 V is applied to the high-voltage high-resistance element 216 a detectable voltage of 1/100 results.

In this way, by means of the semiconductor device 200 of Embodiment 12, advantageous results similar to those of Embodiment 1 and Embodiment 11 can be obtained. Further, by means of a configuration as a semiconductor substrate 200 in which a first resistor 121, switch 140, and startup element 160 are integrally configured, the element area of the control IC can be made smaller than in Embodiment 11.

Each of the embodiments was described as a modified example of Embodiment 1, but mutual application is also possible among the semiconductor devices of Embodiments 2 to 12. For example, the configuration of the semiconductor device of Embodiment 12 can for example be applied to Embodiment 2. Further, the JFET provided within a control IC is not limited to the function of supplying current to the VCC terminal, and can be used for various functions.

As explained above, by means of each of the embodiments, a switch is provided in series with a resistive voltage divider element, and by putting the switch into the open state during standby of the integrated circuit and cutting off the current passing through the resistive voltage divider element, the continuing flow of current through the resistive voltage divider element during standby of the integrated circuit can be prevented. Hence circuit power consumption can be reduced. Further, a voltage divider circuit can be integrated into a semiconductor device into which the output of the voltage divider circuit is input.

In Embodiments 1 to 12 (excepting Embodiment 4), configurations were explained in which the semiconductor device 200 is equivalent to the first resistor 121 and switch 140 of the integrated circuit 100; but the semiconductor device 200 can be used in general configurations in which a resistor and switch are connected in series in an integrated circuit. Further, in each embodiment, explanations assumed that the first conduction type was the P type and the second conduction type was the N type, but the first conduction type may be the N type and the second conduction type may be the P type.

INDUSTRIAL APPLICABILITY

As described above, an integrated circuit and semiconductor device of this invention are useful as an integrated circuit and semiconductor device in which resistors are integrated, and in particular are suitable as an integrated circuit and semiconductor device in which a voltage divider element is integrated.

The invention claimed is:

1. An integrated circuit, comprising a voltage divider circuit, having:
   a resistive voltage divider element for dividing a voltage between ground and a high-voltage line which supplies a voltage obtained by rectifying an alternating-current voltage or a direct-current voltage;
   a switch which is connected in series to the resistive voltage divider element and which cuts off a current path formed between the high-voltage line and ground via the resistive voltage divider element; and
   switching means for opening and closing the switch according to the state of a semiconductor device which is a supply destination of the voltage obtained by division by the resistive voltage divider element,
   the voltage divider circuit being formed on the same semiconductor substrate as the semiconductor device
   wherein the switch is a MOSFET, and at least one resistor constituting the resistive voltage divider element is formed so as to be completely surrounded by the MOSFET, and one end of the resistor is connected to a drain terminal of the MOSFET.

2. The integrated circuit according to claim 1, characterized in that the resistive voltage divider element has a resistance adjustment portion which adjusts a voltage division ratio of the resistive voltage divider element.

3. The integrated circuit according to claim 1, characterized in that the switch is a MOSFET, and the resistive voltage divider element of the portion in which the resistance adjustment portion is formed is connected to a source terminal of the MOSFET.

4. The integrated circuit according to claim 1, characterized in that it is a control IC of a switching power supply.

5. The integrated circuit according to claim 1, wherein the voltage obtained by rectifying the alternating-current voltage or the direct-current voltage is 100 V or higher.

6. The integrated circuit according to claim 1, wherein the MOSFET surrounds the at least one resistor constituting the resistive voltage divider element in a circular fashion.

7. A semiconductor device, comprising:
   a first semiconductor layer of a second conduction type, formed on a surface layer of a semiconductor substrate of a first conduction type;
   a first insulating film, covering the first semiconductor layer;
   a high-voltage high-resistance element, buried in the first insulating film;
   a first electrode, electrically connected to the first semiconductor layer and one end of the high-voltage high-resistance element;
   a second semiconductor layer of the second conduction type, formed on the surface layer of the semiconductor substrate, removed from the first semiconductor layer;
   a second electrode, electrically connected to the second semiconductor layer and the other end of the high-voltage high-resistance element;
   a third diffusion layer of the first conduction type, formed on the surface layer of the semiconductor substrate in contact with the second semiconductor layer;
   a fourth diffusion layer of the second conduction type, formed on the surface layer of the third diffusion layer, removed from the second semiconductor layer;
   an oxide film, formed on a region of the third diffusion layer between the second semiconductor layer and the fourth diffusion layer;
   a third electrode, formed on the oxide film; and
   a fourth electrode, electrically connected to the fourth diffusion layer.

8. The semiconductor device according to claim 7, further comprising a first oxide film formed on the first semiconductor layer, and characterized in that the first insulating film covers the first semiconductor layer and the first oxide film, and in that the high-voltage high-resistance element is buried in the first insulating film in the region of the first oxide film of the first insulating film.

9. The semiconductor device according to claim 7, further comprising a second oxide film formed on the second semiconductor layer, and a second insulating film covering the second semiconductor layer and the second oxide film, and characterized in that the third electrode is formed from above the oxide film to above the second oxide film.

10. The semiconductor device according to claim 7, further comprising a first high-voltage application layer of the second conduction type formed on the surface layer of the semiconductor substrate in contact with the first semiconductor layer, and a fifth diffusion layer of the second conduction type formed on a surface layer of the first high-voltage application layer, removed from the first semiconductor layer, and connected to the first electrode.

11. The semiconductor device according to claim 7, further comprising a second high-voltage application layer of the second conduction type formed on the surface layer of the semiconductor substrate in contact with the second semiconductor layer, and a sixth diffusion layer of the second conduction type formed on a surface layer of the second high-voltage application layer, removed from the second semiconductor layer, and connected to the second electrode.

12. The semiconductor device according to claim 7, further comprising a JFET, having:
   a portion of the second semiconductor layer;
   a portion of the oxide film;
   a portion of the second high-voltage application layer;
   a fifth electrode electrically connected to the second semiconductor layer; and
   the second electrode electrically connected to the second high-voltage application layer.

13. The semiconductor device according to claim 12, characterized in that the second electrode forming the portion of the JFET and the first electrode are connected to the same terminal by a wire.

14. The semiconductor device according to claim 7, further comprising a third high-voltage application layer of the second conduction type formed on a surface layer of the third diffusion layer, removed from the second semiconductor layer, and characterized in that the fourth diffusion layer is formed on a surface layer of the third high-voltage application layer, removed from the second semiconductor layer.

15. The semiconductor device according to claim 7, characterized in that the high-voltage high-resistance element is formed such that the planar shape thereof is a spiral shape.

16. The semiconductor device according to claim 7, characterized in that the high-voltage high-resistance element is provided in plurality and in parallel.

17. The semiconductor device according to claim 7, characterized in that the first semiconductor layer is a first diffusion layer formed with impurities added, and the second semiconductor layer is a second diffusion layer formed with impurities added.

18. The semiconductor device according to claim 7, characterized in that the first semiconductor layer is a first epitaxial layer formed by epitaxial growth, and that the second semiconductor layer is a second epitaxial layer formed by epitaxial growth.

19. The semiconductor device according to claim 18, characterized in that the first epitaxial layer and the second epitaxial layer are separated by a seventh diffusion layer of the first conduction type formed on the surface layer of the semiconductor substrate.

* * * * *